US009639298B2

(12) United States Patent
Kazi et al.

(10) Patent No.: US 9,639,298 B2
(45) Date of Patent: May 2, 2017

(54) TIME-BASED STORAGE WITHIN A DISPERSED STORAGE NETWORK

(71) Applicant: CLEVERSAFE, INC., Chicago, IL (US)

(72) Inventors: Asimuddin Kazi, Naperville, IL (US); Thomas Darrel Cocagne, Elk Grove Village, IL (US); Wesley Leggette, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 263 days.

(21) Appl. No.: 14/307,672

(22) Filed: Jun. 18, 2014

(65) Prior Publication Data

US 2015/0039828 A1    Feb. 5, 2015

Related U.S. Application Data

(60) Provisional application No. 61/860,498, filed on Jul. 31, 2013.

(51) Int. Cl.
*G06F 3/06* (2006.01)
*G06F 11/10* (2006.01)
*H04L 29/08* (2006.01)

(52) U.S. Cl.
CPC ............ *G06F 3/067* (2013.01); *G06F 3/0619* (2013.01); *G06F 3/0638* (2013.01);
(Continued)

(58) Field of Classification Search
CPC ............ G06F 3/067–3/0689; G06F 2003/0697
See application file for complete search history.

(56) References Cited

U.S. PATENT DOCUMENTS

| 4,092,732 A | 5/1978 | Ouchi |
| 5,454,101 A | 9/1995 | Mackay et al. |

(Continued)

OTHER PUBLICATIONS

Shamir; How to Share a Secret; Communications of the ACM; vol. 22, No. 11; Nov. 1979; pp. 612-613.

(Continued)

*Primary Examiner* — Nicholas Simonetti
(74) *Attorney, Agent, or Firm* — Garlick & Markison; Timothy W. Markison; Harry S. Tyson, Jr.

(57) ABSTRACT

A method begins by a dispersed storage (DS) processing obtaining estimated future availability information for storage units and organizing a plurality of sets of encoded data slices into a plurality of group-sets of encoded data slices. For each of the plurality of group-sets of encoded data slices, the method continues with the DS processing module estimating an approximate storage completion time to produce a plurality of approximate storage completion times. The method continues with the DS processing module establishing a time-availability pattern for writing the plurality of group-sets of encoded data slices to the storage units based on the estimated future availability information and the plurality of approximate storage completion times. The method continues with the DS processing module sending the plurality of group-sets of encoded data slices to at least some of the storage units for storage therein in accordance with the time-availability pattern.

12 Claims, 62 Drawing Sheets

(52) U.S. Cl.
CPC ...... *G06F 11/1076* (2013.01); *H04L 67/1097* (2013.01); *H04L 67/306* (2013.01)

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 9,032,165 | B1* | 5/2015 | Brooker ............ G06F 12/0806 711/154 |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma et al. |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula, Jr. |
| 2005/0132070 | A1 | 6/2005 | Redlich et al. |
| 2005/0144382 | A1 | 6/2005 | Schmisseur |
| 2005/0229069 | A1 | 10/2005 | Hassner |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll, Jr. |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters, III et al. |
| 2008/0147971 | A1* | 6/2008 | Hawkins ............ A63F 13/00 711/113 |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2011/0107180 | A1* | 5/2011 | Markison ............ G11C 29/52 714/763 |
| 2012/0030736 | A1* | 2/2012 | Resch ............ H04L 1/0045 726/5 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner

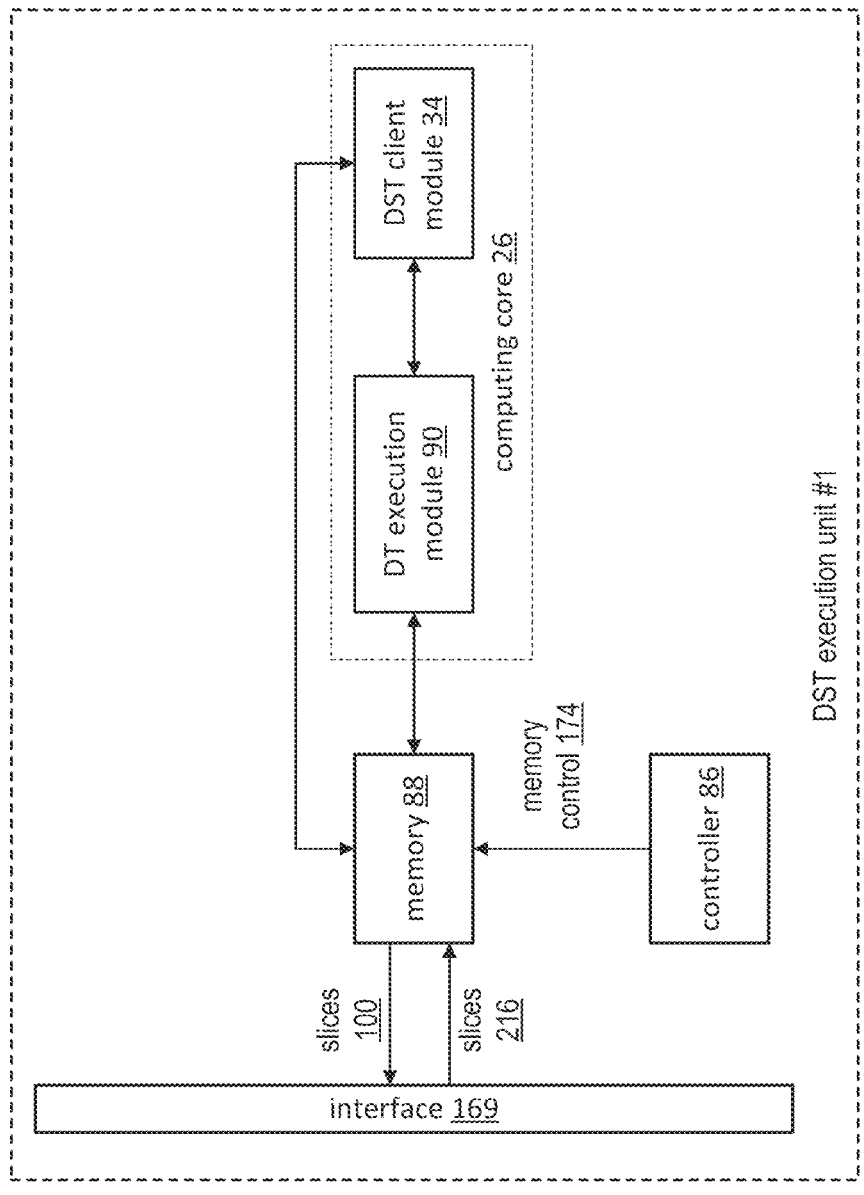
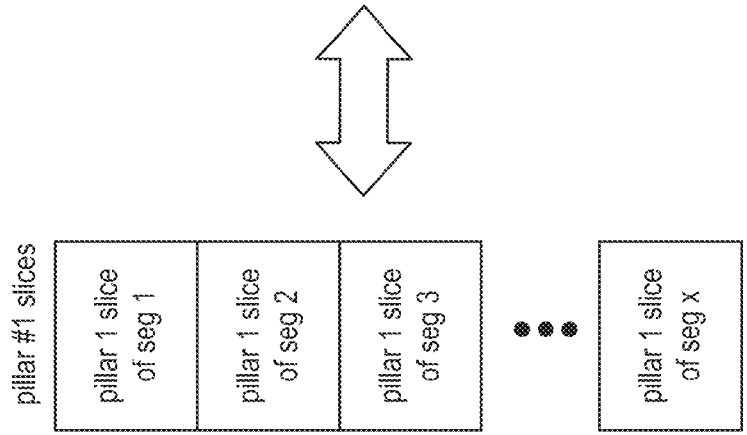
FIG. 24

DST allocation info 242 | data partition info 320: data ID; No. of partitions; Addr. info for each partition; format conversion indication task execution info 322

| task 326 | task ordering 328 | data partition 330 | set of DT EX mods 332 | intermediate result info 324 ||||
|---|---|---|---|---|---|---|---|
| | | | | Name 334 | interm. result processing 336 | scratch pad storage 338 | intermediate result storage 340 |
| 1_1 | none | 2_1 - 2_z | 1_1, 2_1, 3_1, 4_1, & 5_1 | R1-1 | DST unit 1 | DST unit 1 | DST units 1-5 |
| 1_2 | none | 2_1 - 2_4 | 1_1, 2_1, 3_1, 4_1, & 5_1 | R1-2 | DST unit 1 | DST unit 1 | DST units 1-5 |
| 1_3 | none | 2_1 - 2_4 / 2_5 - 2_z | 1_1, 2_1, 3_1, 4_1, & 5_1 / 1_2, 2_2, 3_2, 4_2, & 5_2 | R1-3 | DST unit 2 | DST unit 2 | DST units 2-6 |
| 1_4 | after 1_3 | R1-3_1 - R1-3_4 / R1-3_5 - R1-3_z | 1_1, 2_1, 3_1, 4_1, & 5_1 / 1_2, 2_2, 6_1, 7_1, & 7_2 | R1_4 | DST unit 3 | DST unit 3 | DST units 3-7 |
| 1_5 | after 1_4 | R1-4_1 - R1-4_z & 2_1 - 2_z | 1_1, 2_1, 3_1, 4_1, & 5_1 | R1-5 | DST unit 1 | DST unit 1 | DST units 1-5 |
| 1_6 | after 1_1 & 1_5 | R1-1_1 - R1-1_z & R1-5_1 - R1-5_z | 1_1, 2_1, 3_1, 4_1, & 5_1 | R1-6 | DST unit 2 | DST unit 2 | DST units 2-6 |
| 1_7 | after 1_2 & 1_5 | R1-2_1 - R1-2_z & R1-5_1 - R1-5_z | 1_2, 2_2, 3_2, 4_2, & 5_2 | R1-7 | DST unit 3 | DST unit 3 | DST units 3-7 |
| 2 | none | 2_1 - 2_z | 3_1, 4_1, 5_1, 6_1, & 7_1 | R2 | DST unit 7 | DST unit 7 | DST units 7, 1-4 |
| 3_1 | none (same as 1_3) | use R1_3 | | R1-1 | | | |
| 3_2 | after 3_1 | R1-3_1 - R1-3_z | 1_2, 2_2, 3_2, 4_2, & 5_2 | R3-2 | DST unit 5 | DST unit 5 | DST units 5,6, 1-3 |

FIG. 32

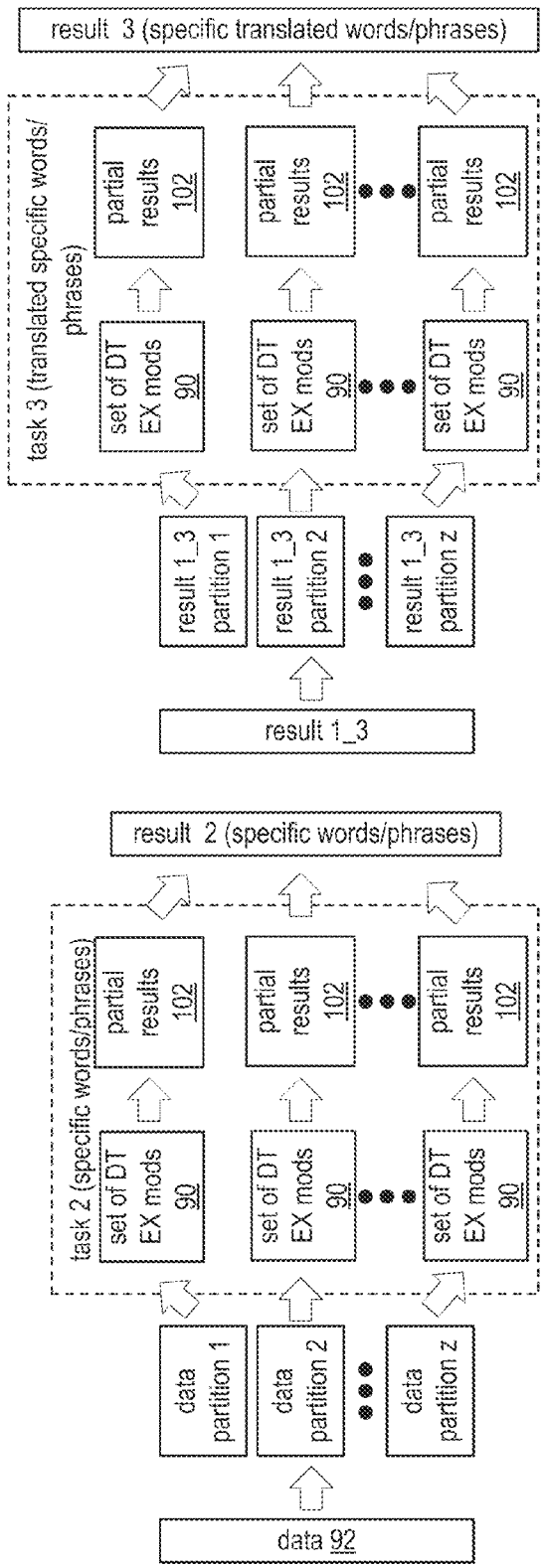
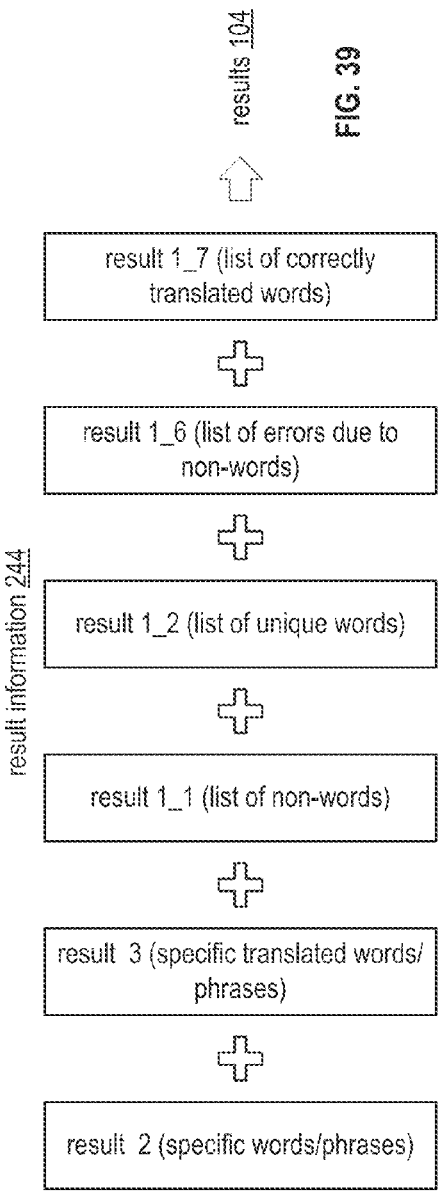

| | T1 | T2 | T3 | T4 | T5 |
|---|---|---|---|---|---|
| SLICE | 300 | 300 | 300 | 300 | 350 |
| RBSLICE | 0 | 0 | 20 | 50 | 0 |
| RESV | 0 | 50 | 30 | 0 | 0 |
| UNUTIL | 200 | 150 | 150 | 150 | 150 |
| TTL | 500 | 500 | 500 | 500 | 500 | memory utilization 614

| | T6 | T7 | T8 | T9 | T10 |
|---|---|---|---|---|---|
| SLICE | 350 | 450 | 450 | 450 | 500 |
| RBSLICE | 0 | 0 | 0 | 0 | 0 |
| RESV | 0 | 0 | 50 | 50 | 0 |
| UNUTIL | 150 | 50 | 0 | 0 | 0 |
| TTL | 500 | 500 | 500 | 500 | 500 | memory utilization 616

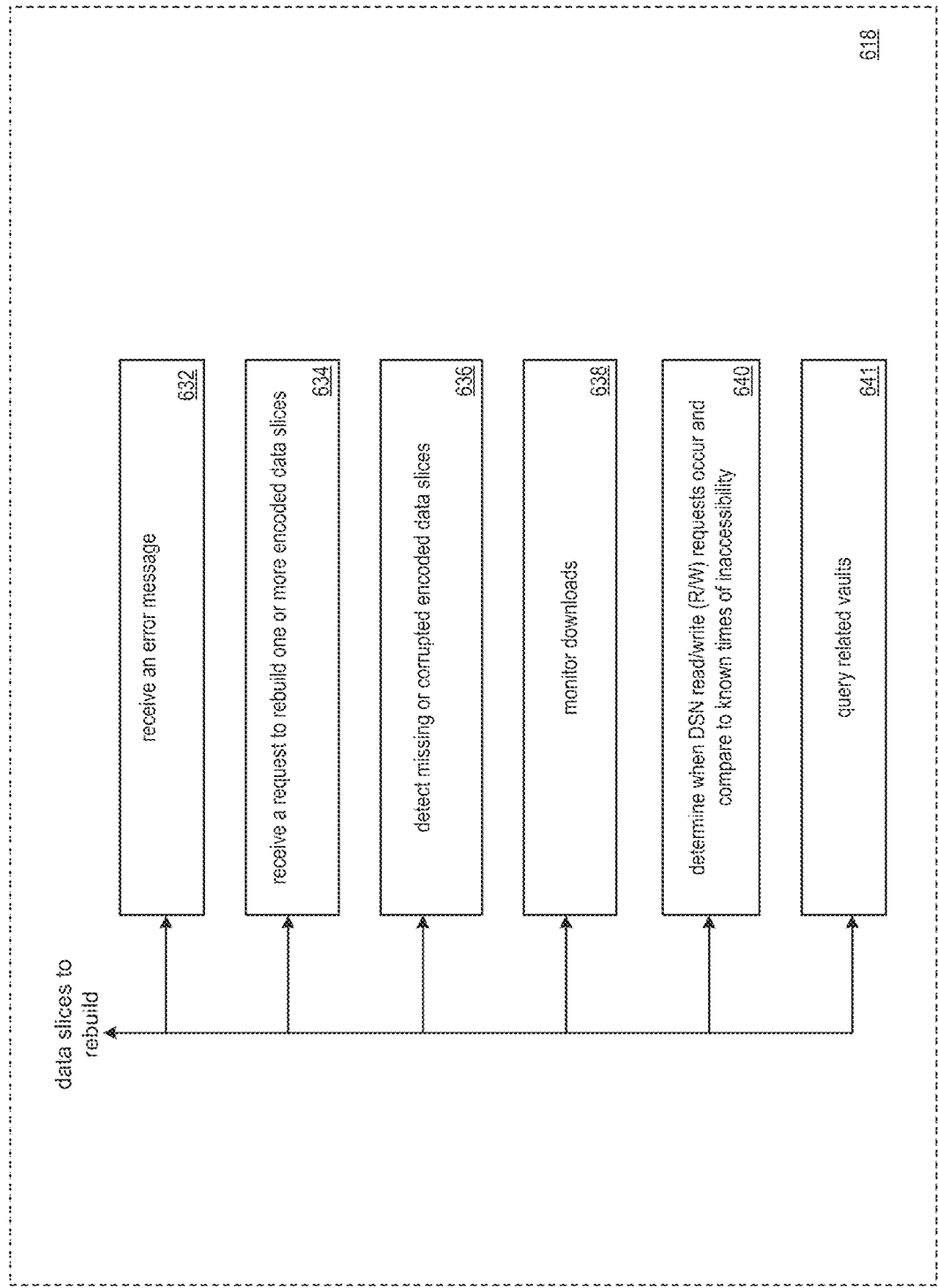

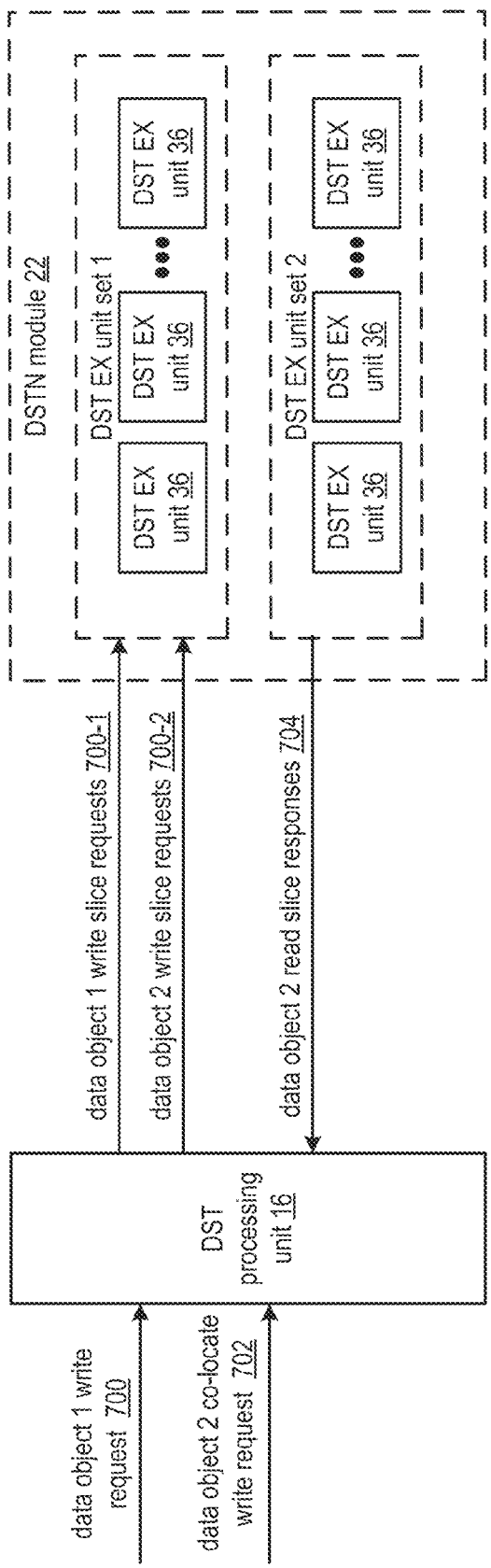

TIME-BASED STORAGE WITHIN A DISPERSED STORAGE NETWORK

CROSS REFERENCE TO RELATED PATENTS

The present U.S. Utility Patent Application claims priority pursuant to 35 U.S.C. §119(e) to U.S. Provisional Application No. 61/860,498, entitled "DISPERSED STORAGE AND COMPUTING NETWORK COMPONENTS AND OPTIMIZATIONS", filed Jul. 31, 2013, which is hereby incorporated herein by reference in its entirety and made part of the present U.S. Utility Patent Application for all purposes.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC—NOT APPLICABLE

BACKGROUND

Technical Field

This present disclosure relates generally to computer networks and more particularly to dispersed storage of data and distributed task processing of data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 24 is a diagram of an example of a storage operation of a DST execution unit in accordance with the present disclosure;

FIG. 32 is a diagram of an example of DST allocation information for the example of FIG. 30 in accordance with the present disclosure;

FIGS. 33-38 are schematic block diagrams of the DSTN module performing the example of FIG. 30 in accordance with the present disclosure;

FIG. 39 is a diagram of an example of combining result information into final results for the example of FIG. 30 in accordance with the present disclosure;

Figure 43A:
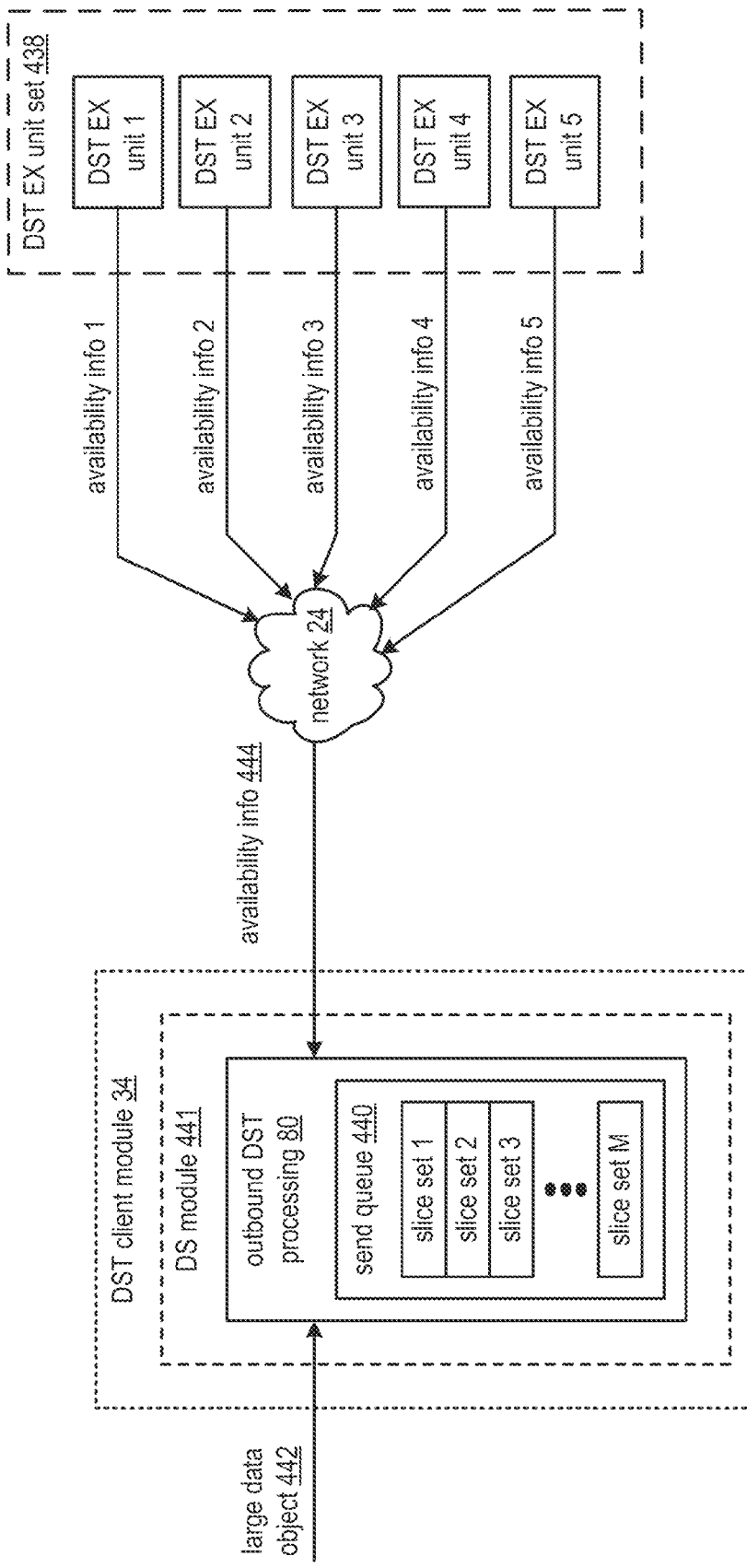
Figure 43B:
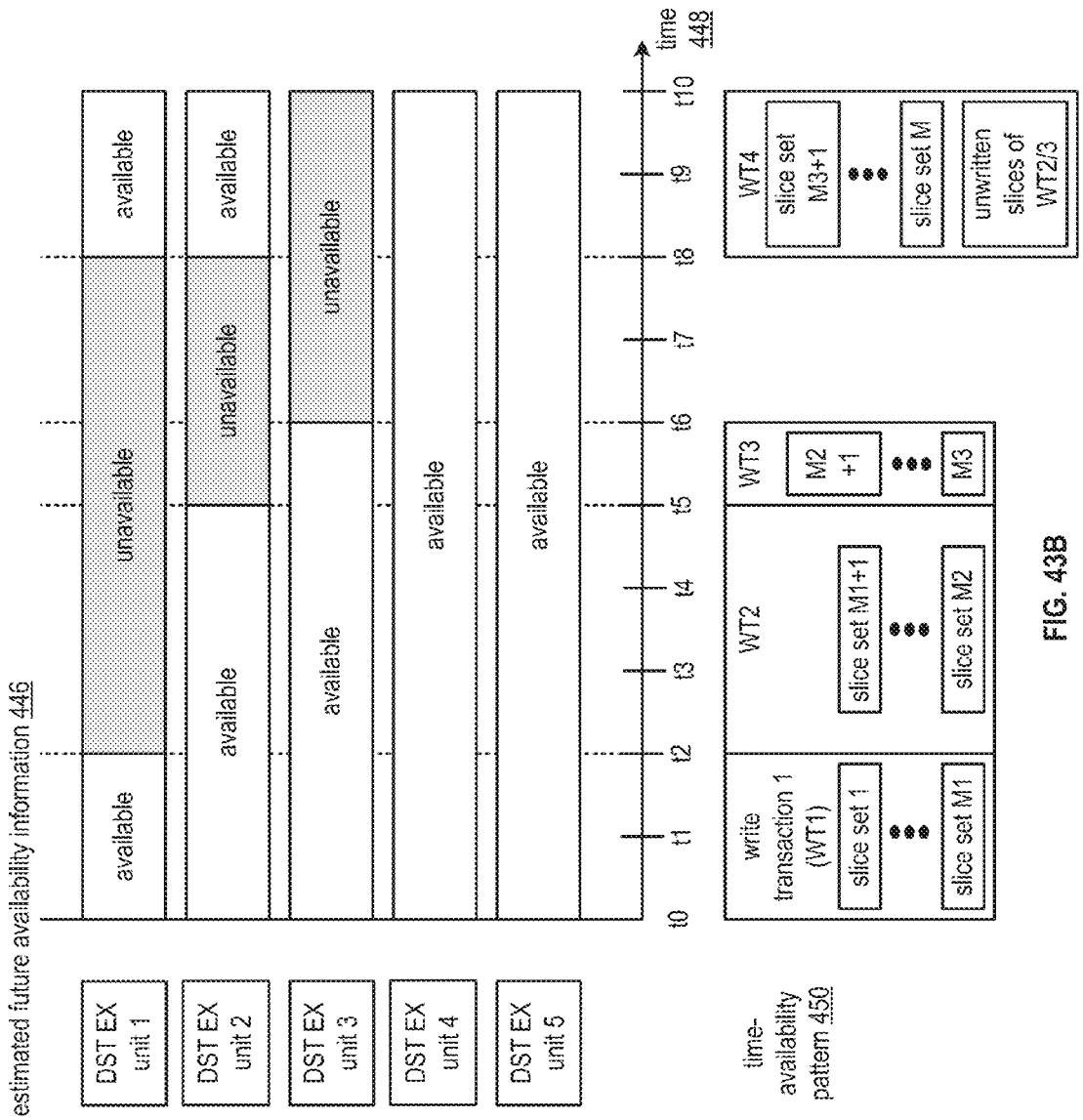
Figure 43C:
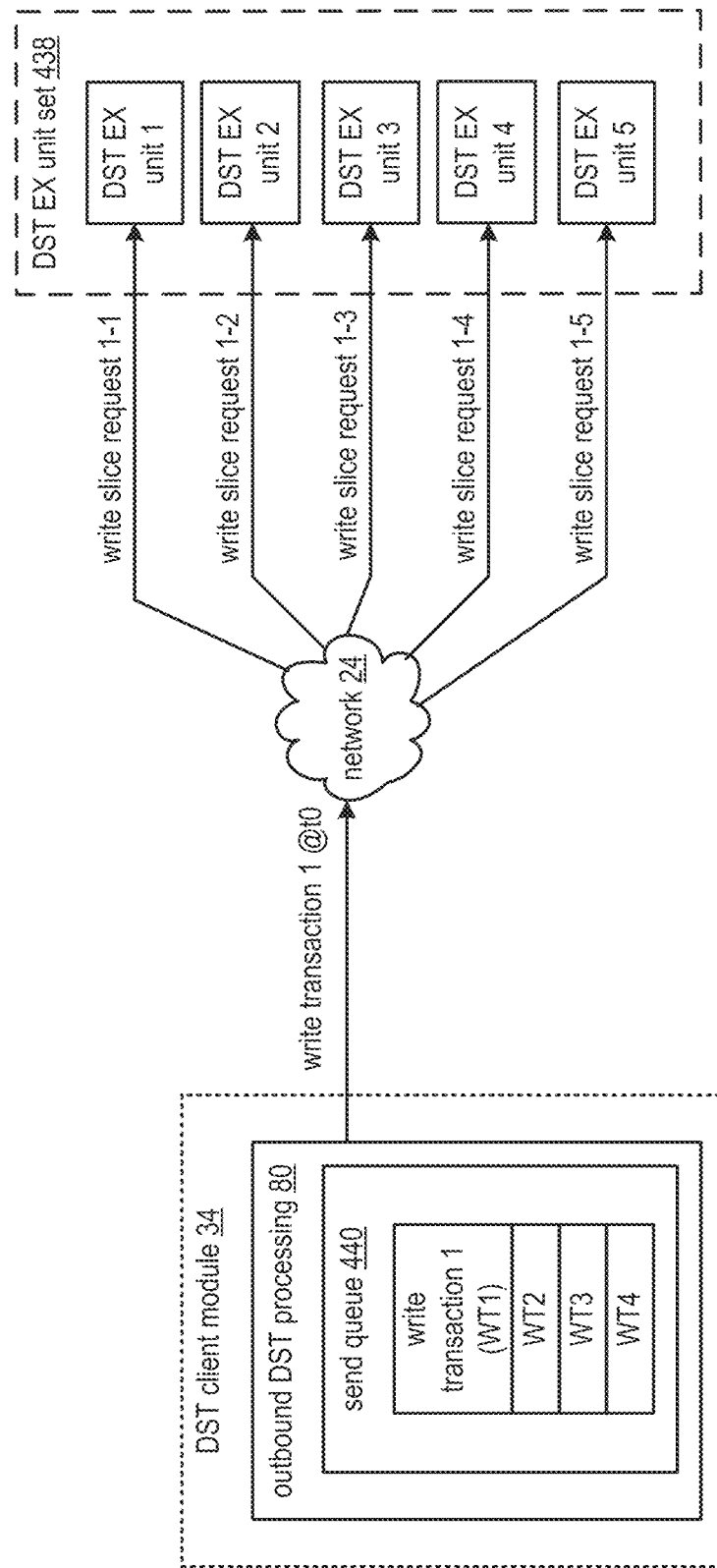
Figure 43D:
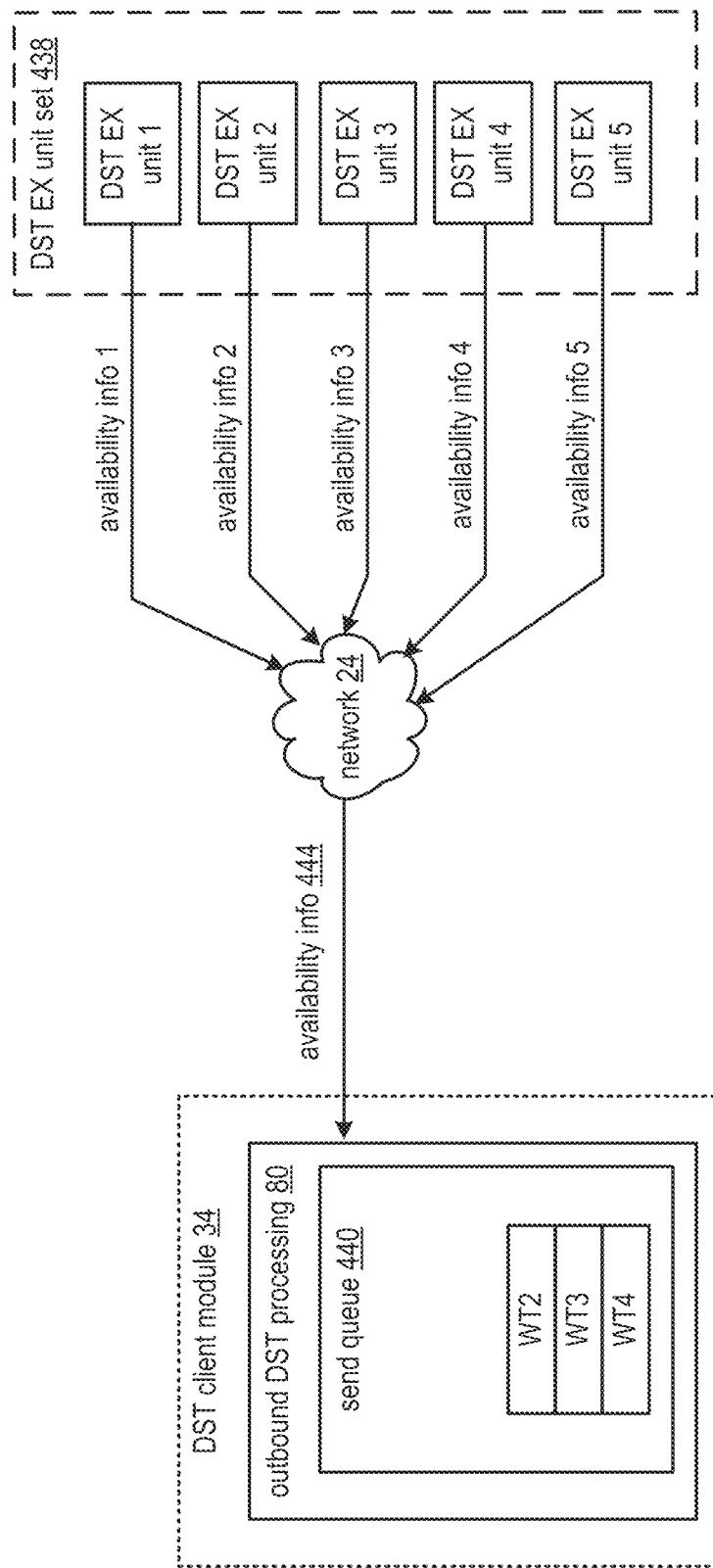
Figure 43E:
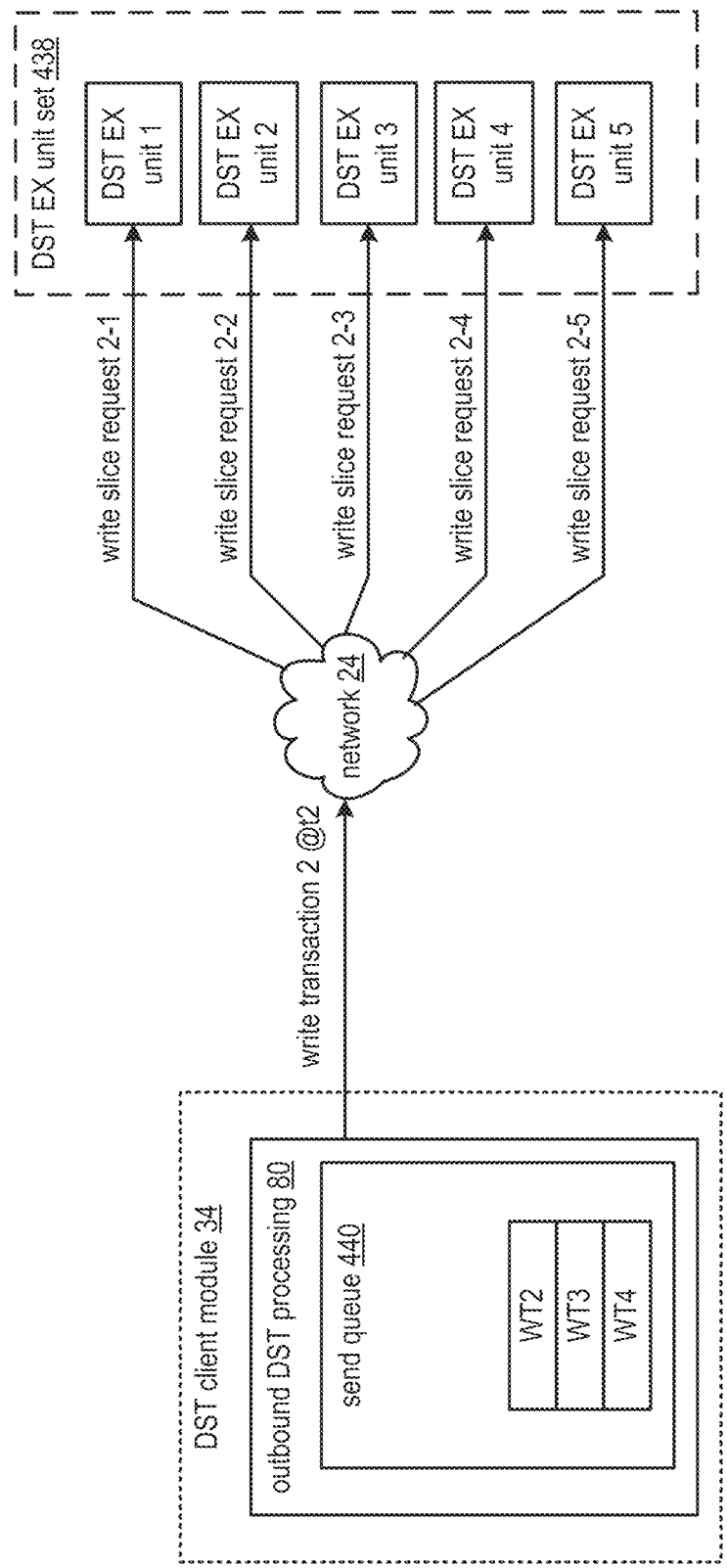
Figure 43F:
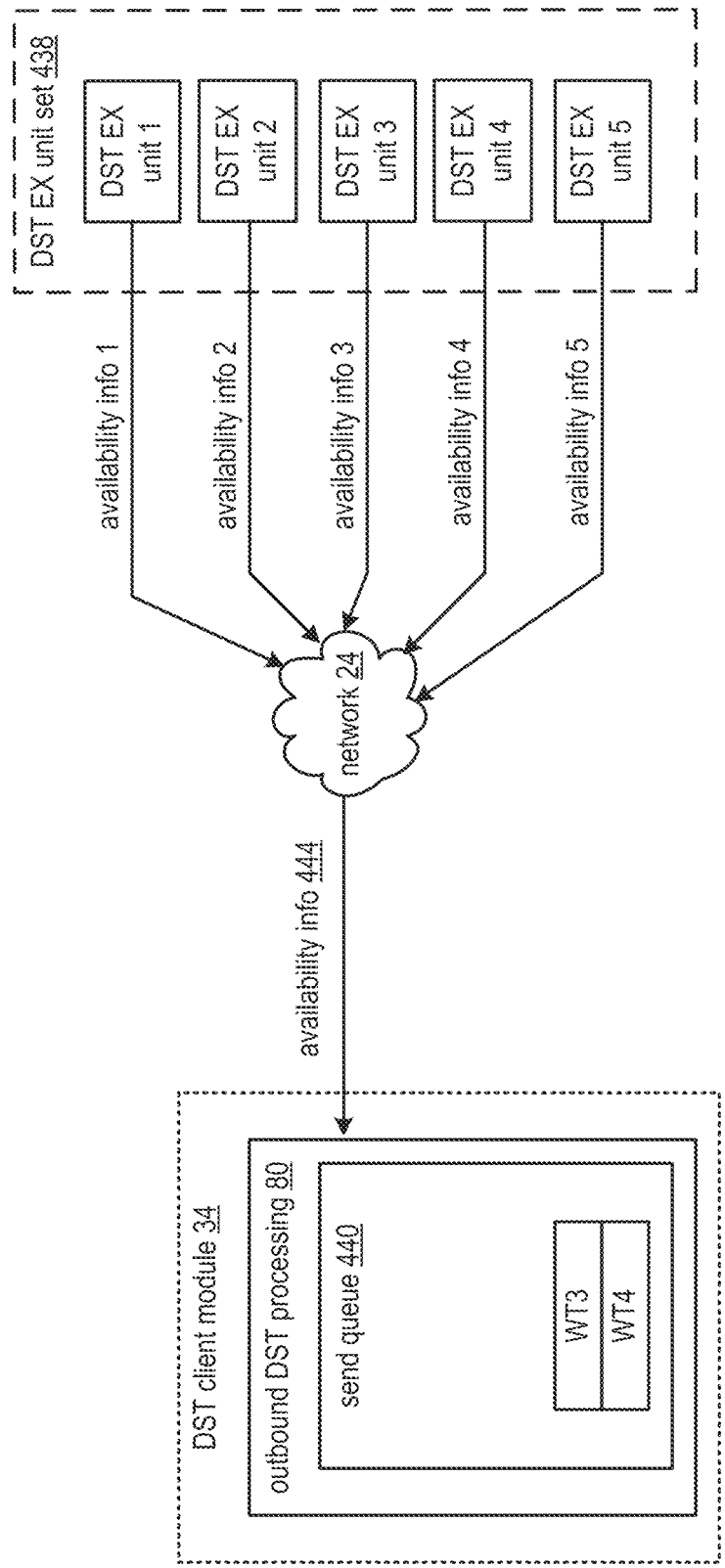
Figure 43G:
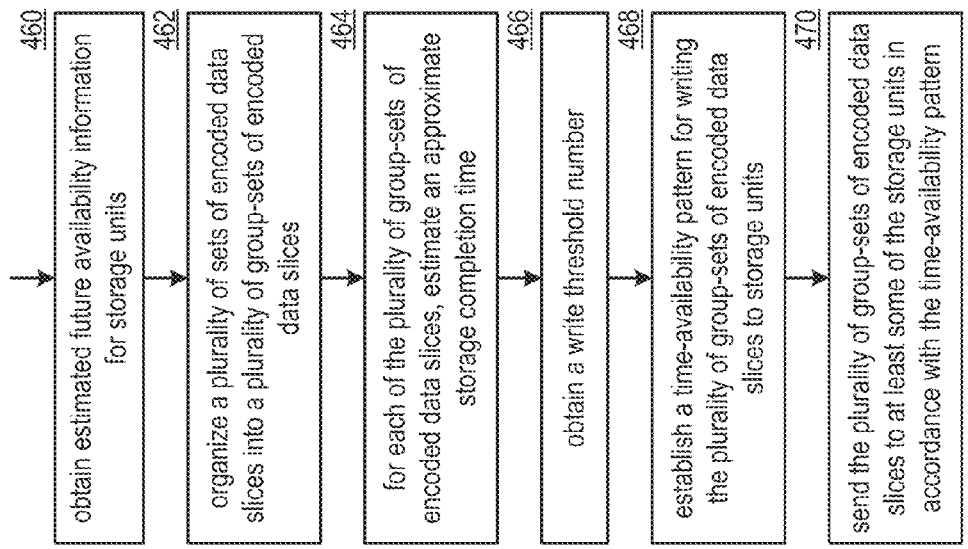
Figure 44A:
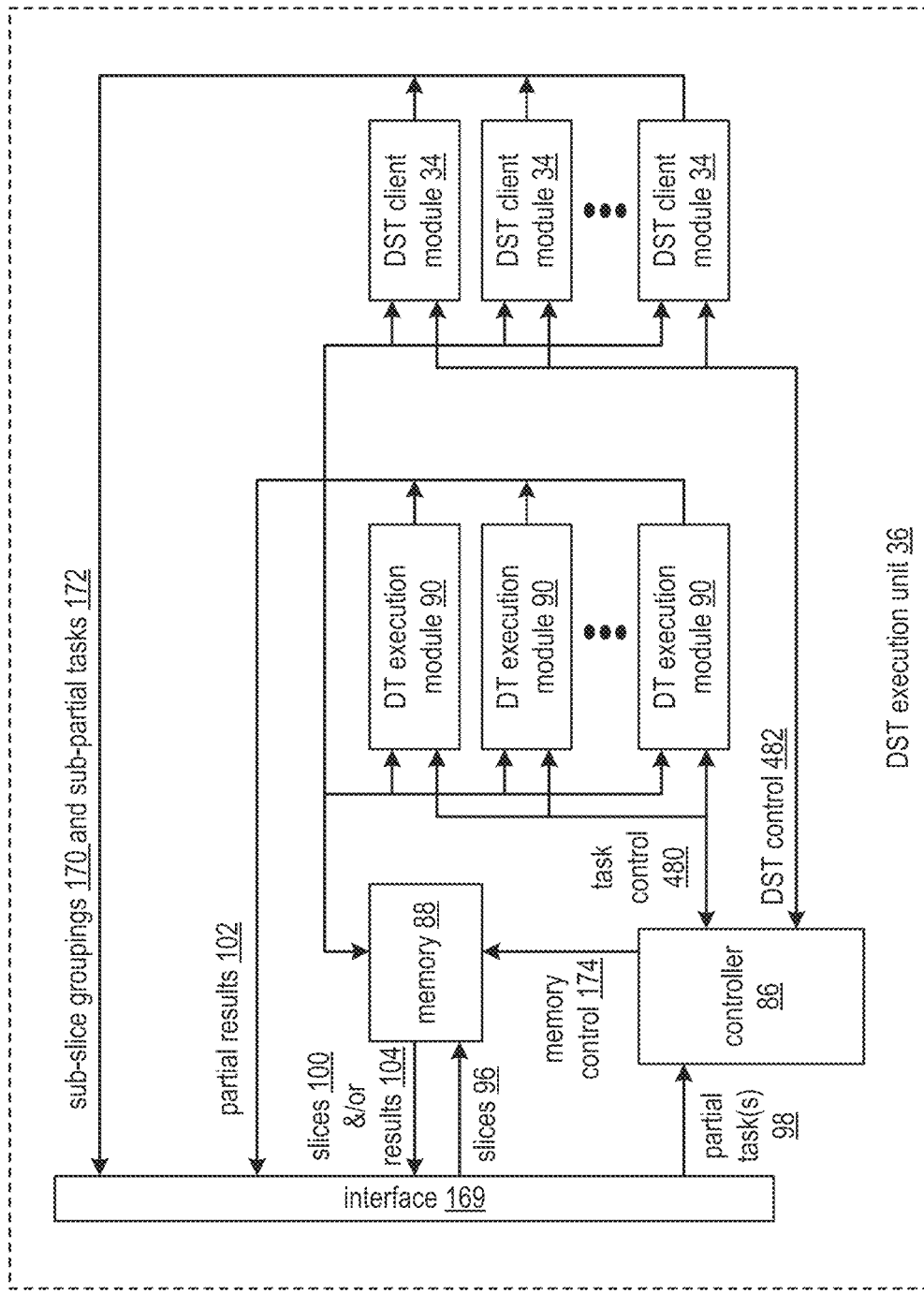
Figure 44B:
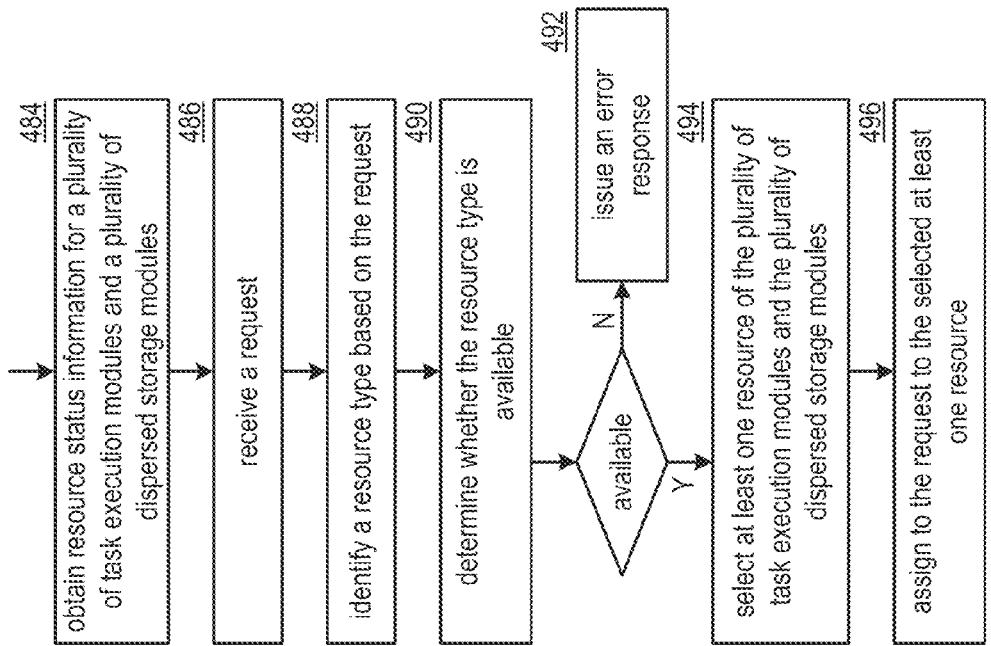
Figure 45A:
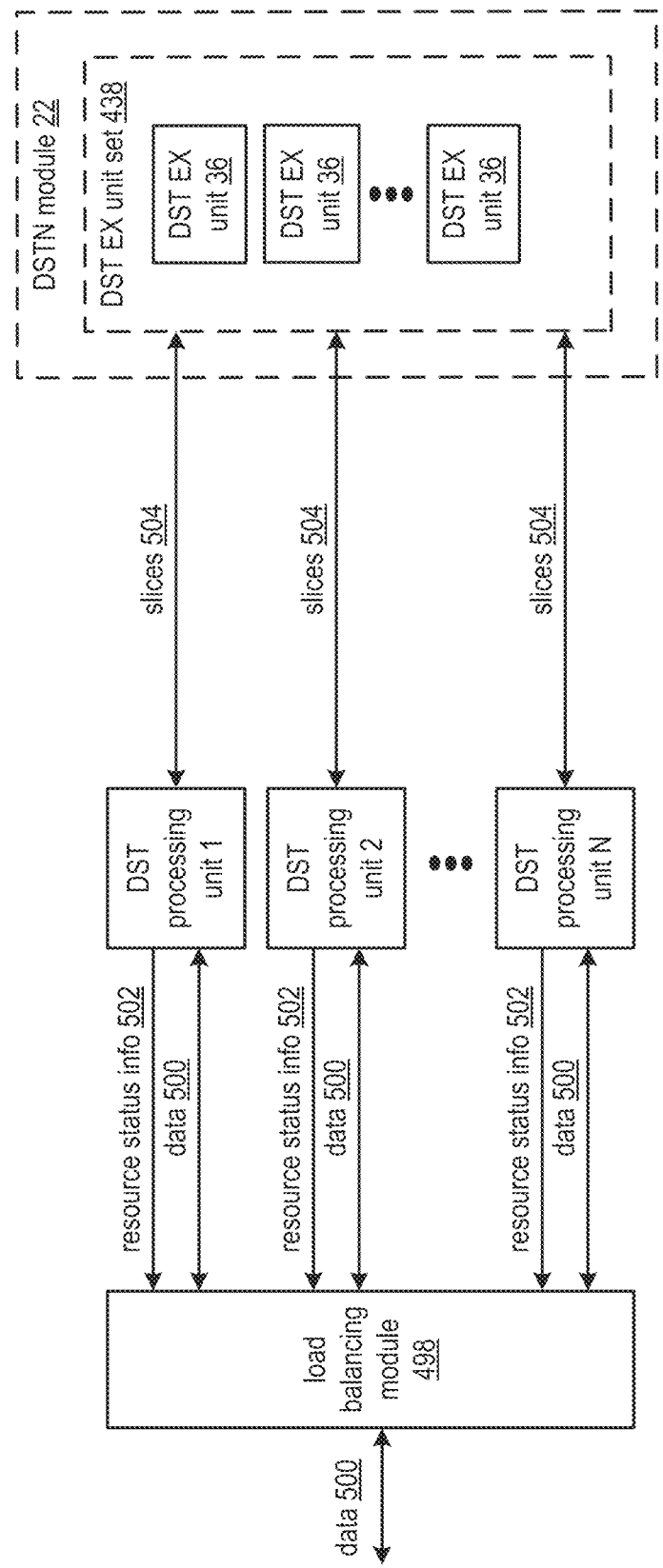
Figure 45B:
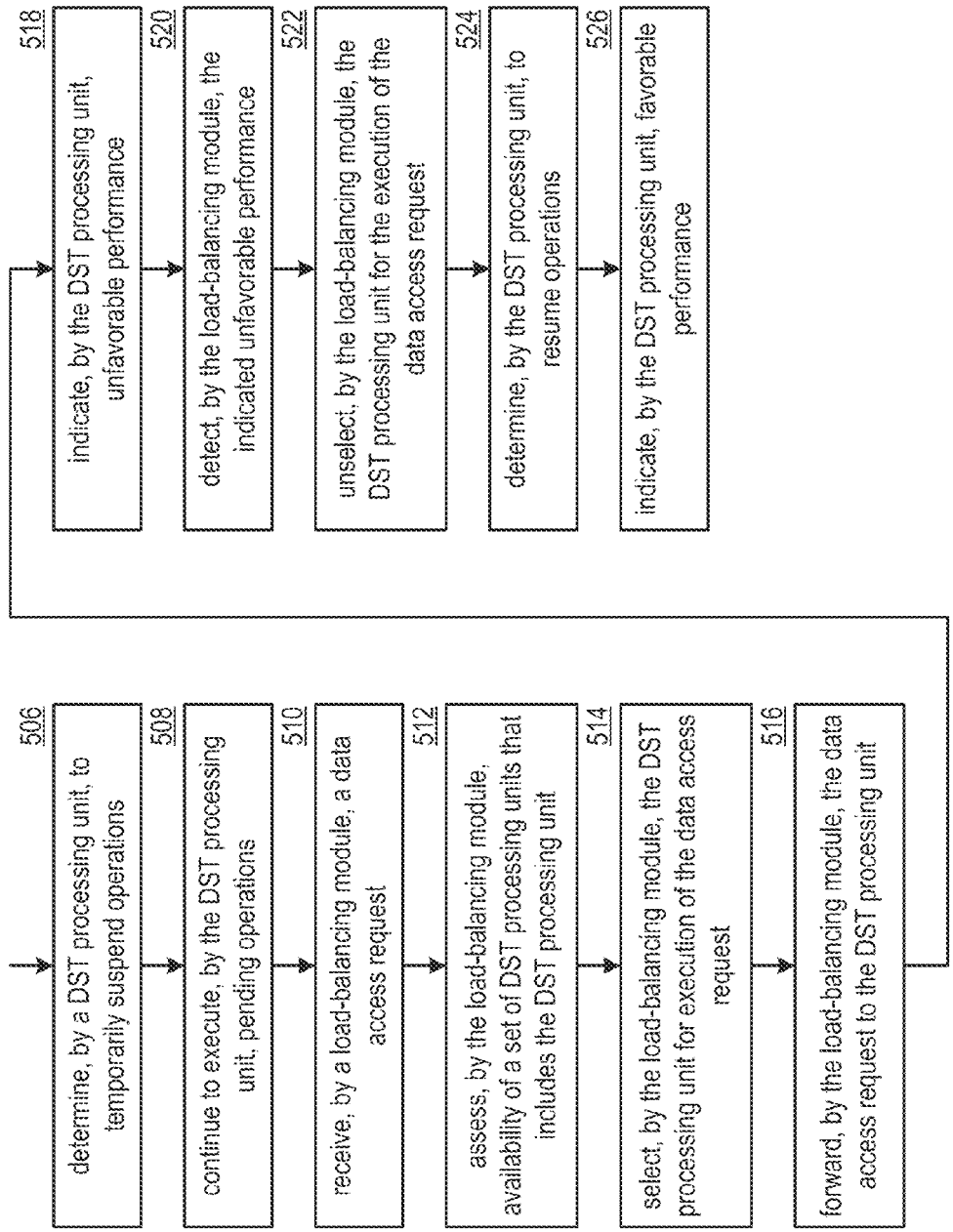
Figures 46A, 46B, 46C:
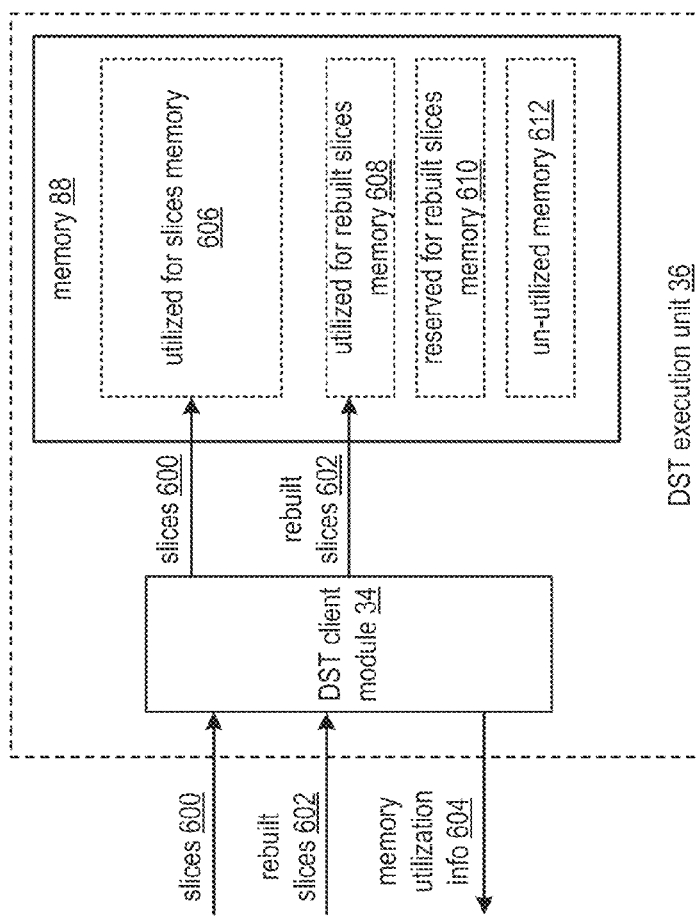
Figure 46D:
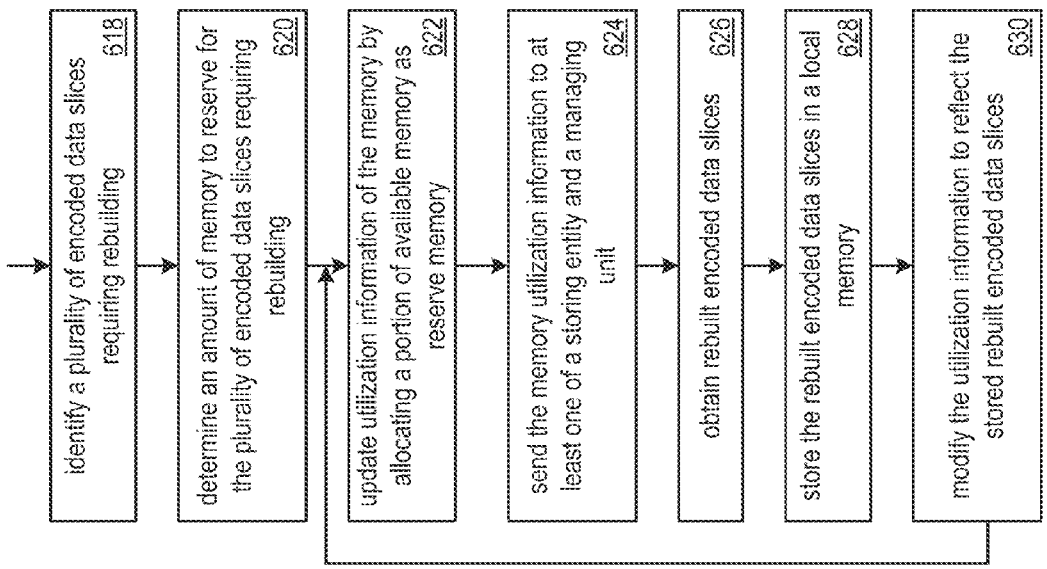
Figure 46F:
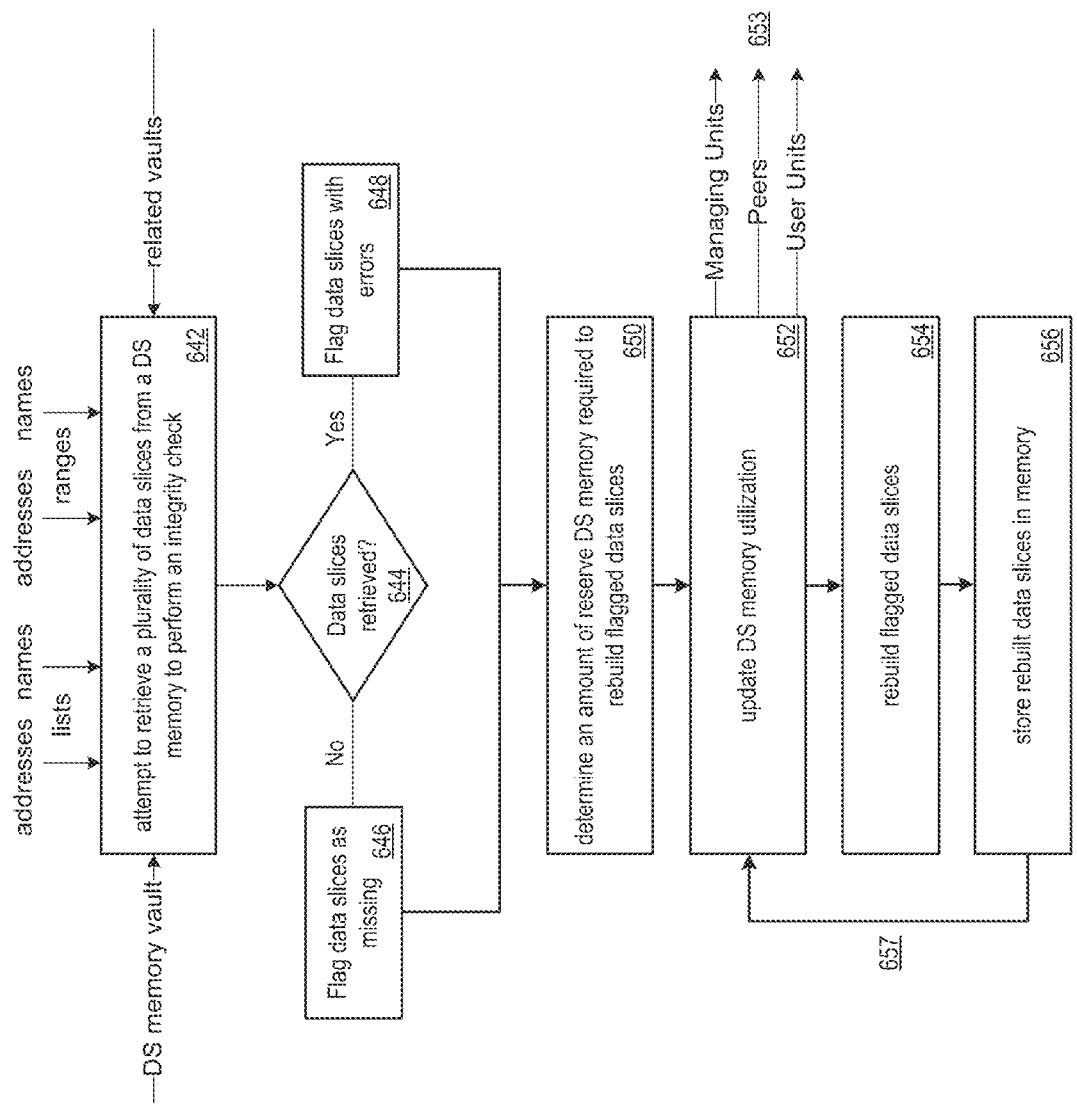
Figure 46G:
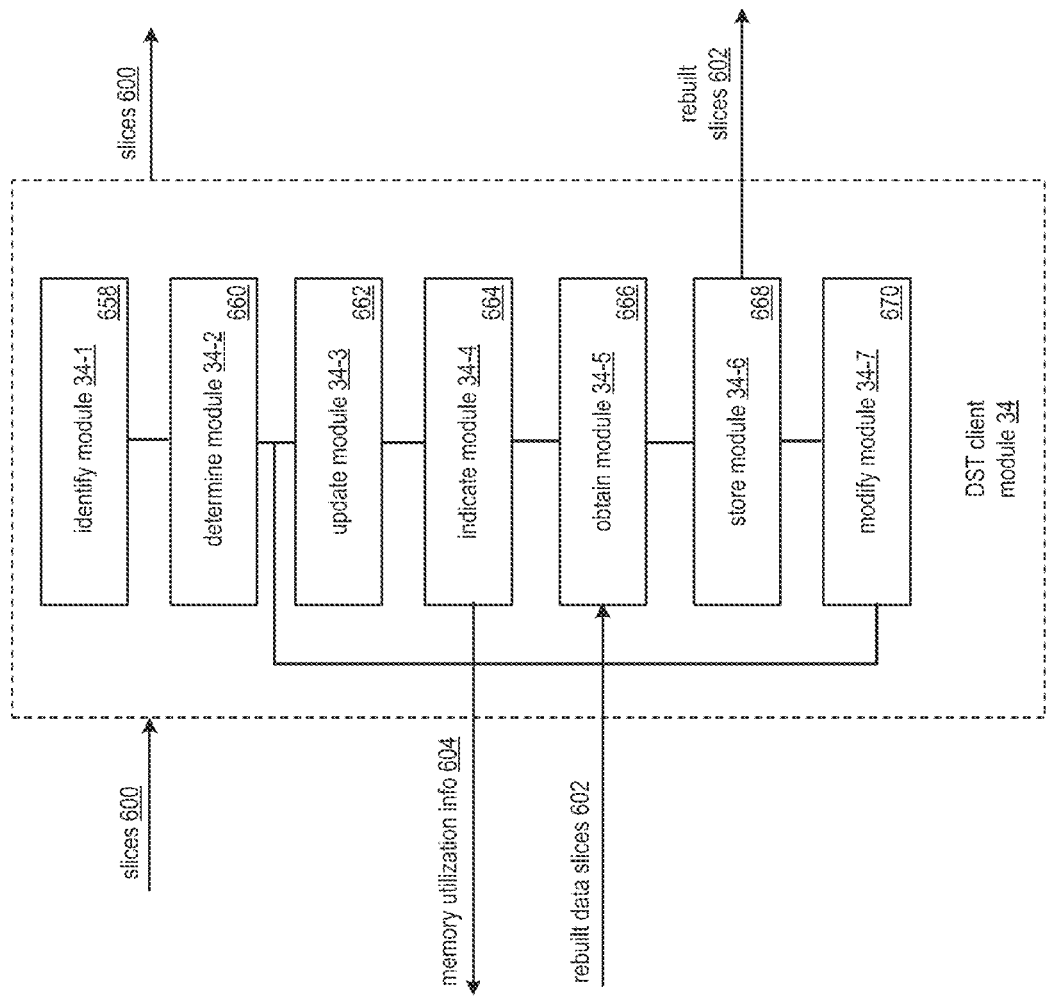
Figure 47C:
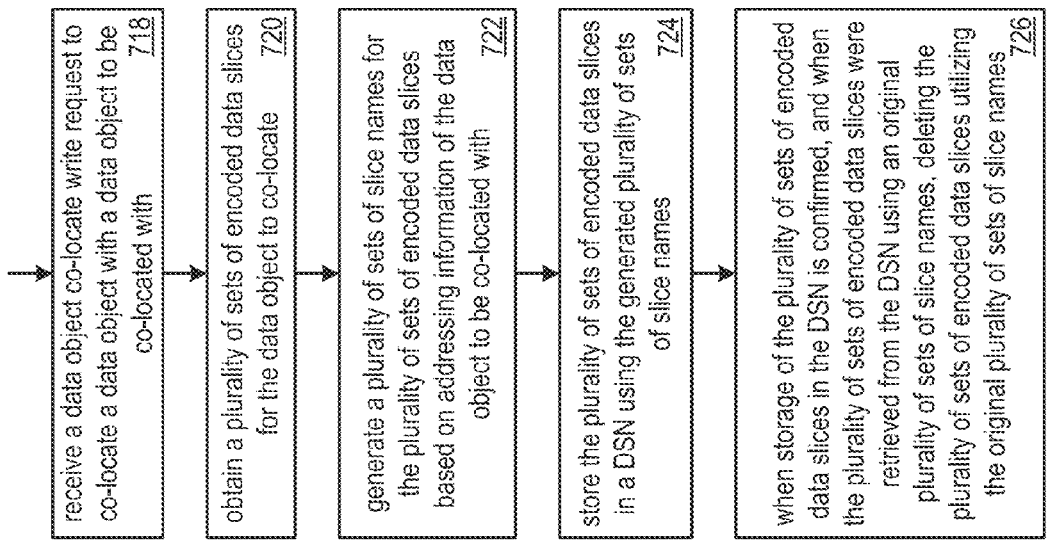
Figure 47D:
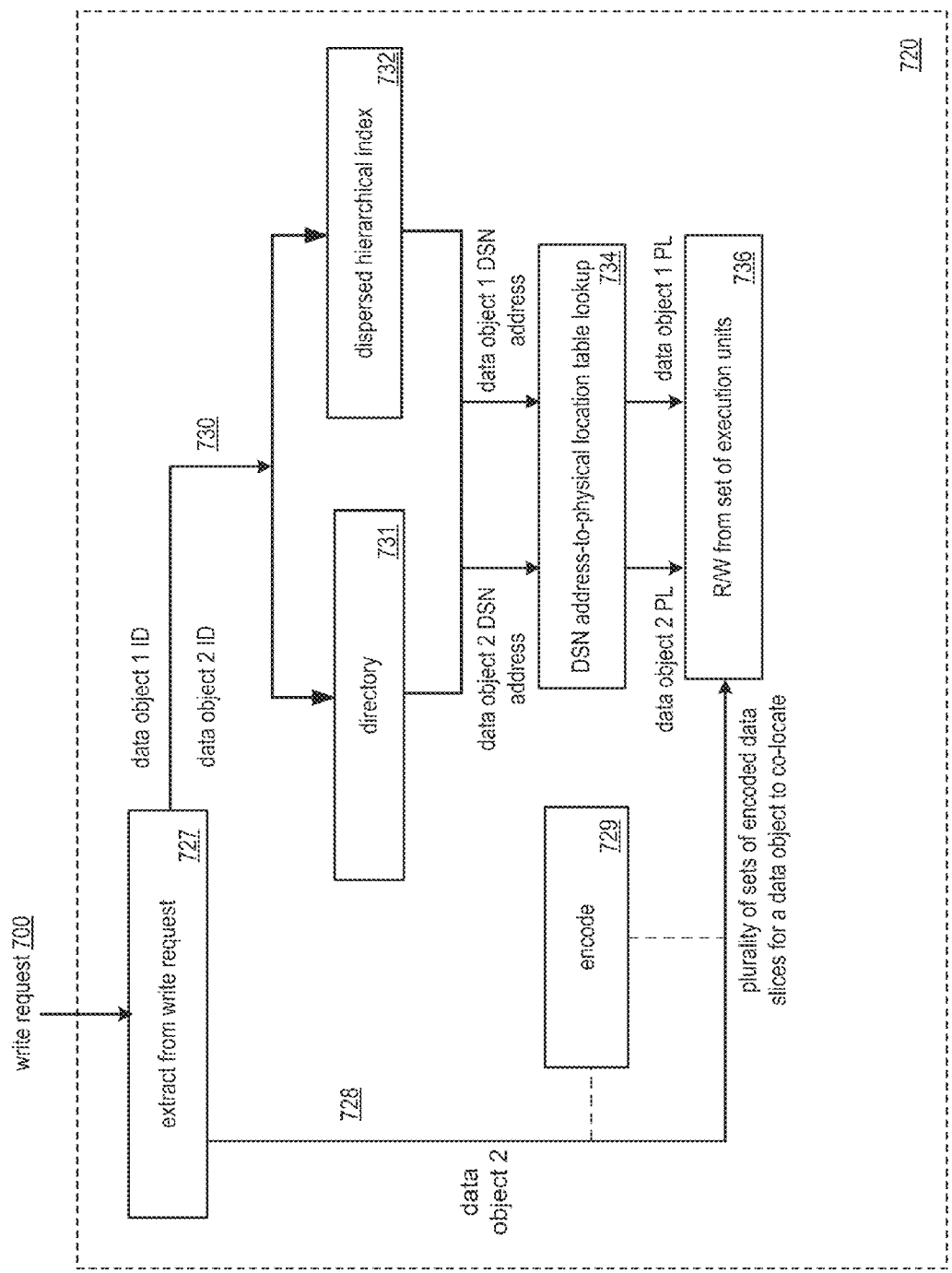
Figure 47E:
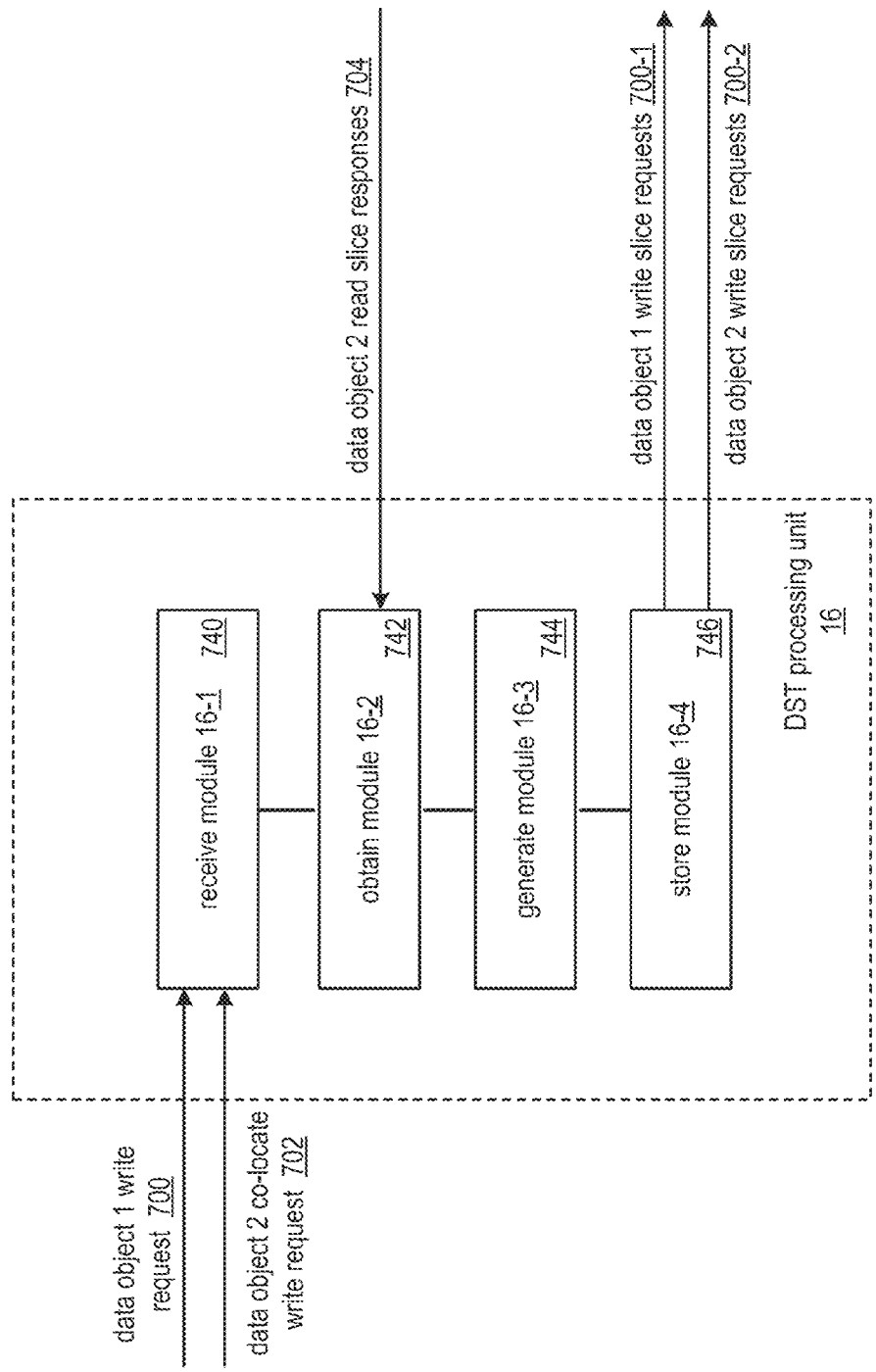

FIGS. 43A, 43C-F are schematic block diagrams of an embodiment of a dispersed storage network (DSN) illustrating an example of time-based storage of data in accordance with the present disclosure;

FIG. 43B is a timing diagram illustrating an example of generating a time-availability pattern in accordance with the present disclosure;

FIG. 43G is a flowchart illustrating an example of time-based storage of data in accordance with the present disclosure;

FIG. 44A is a schematic block diagram of another embodiment of a distributed storage and task (DST) execution unit in accordance with the present disclosure;

FIG. 44B is a flowchart illustrating an example of assigning resources in accordance with the present disclosure;

FIG. 45A is a schematic block diagram of another embodiment of a dispersed storage network (DSN) system in accordance with the present disclosure;

FIG. 45B is a diagram illustrating an example of load-balancing in accordance with the present disclosure;

FIG. 46A is a schematic block diagram of another embodiment of a distributed storage and task (DST) execution unit in accordance with the present disclosure;

FIG. 46B is a diagram illustrating an example of memory utilization in accordance with the present disclosure;

FIG. 46C is a diagram illustrating another example of memory utilization in accordance with the present disclosure;

FIG. 46D is a flowchart illustrating an example of updating memory utilization information in accordance with the present disclosure;

FIG. 46E is a flowchart illustrating example ways to identify slices needing a rebuild in accordance with the present disclosure;

FIG. 46F is a flowchart illustrating another example of updating memory utilization information;

FIG. 46G is a schematic block diagram illustrating an example DST client module structure for memory utilization;

FIG. 47A is a schematic block diagram of another embodiment of a dispersed storage network (DSN) system in accordance with the present disclosure;

FIG. 47B is a diagram illustrating an example of generating a slice name in accordance with the present disclosure;

FIG. 47C is a flowchart illustrating an example of co-locating storage of data in accordance with the present disclosure;

FIG. 47D is a flowchart illustrating one example of obtaining the plurality of sets of encoded data slices to be co-located; and FIG. 47E is a schematic block diagram of another embodiment of a dispersed storage network (DSN) system in accordance with the present disclosure;

DETAILED DESCRIPTION

Figure 1:
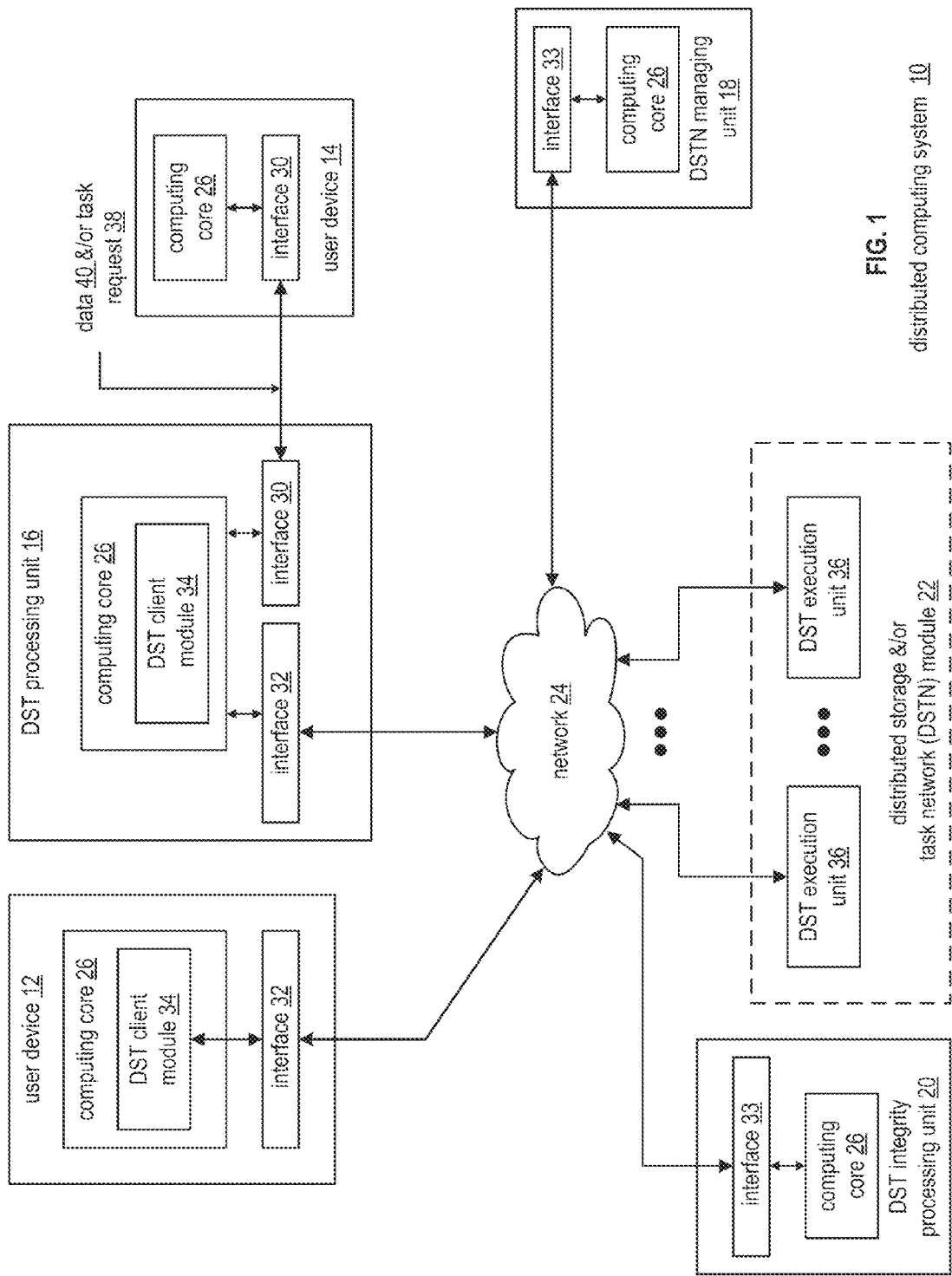
FIG. 1 is a schematic block diagram of an embodiment of a distributed computing system in accordance with the present disclosure.

FIG. 1 is a schematic block diagram of an embodiment of a distributed computing system 10 that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more private intranet systems and/or public internet systems; and/or one or more local area networks (LAN) and/or wide area networks (WAN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc.

Each of the user devices 12-14, the DST processing unit 16, the DSTN managing unit 18, and the DST integrity processing unit 20 include a computing core 26 and may be a portable computing device and/or a fixed computing device. A portable computing device may be a social networking device, a gaming device, a cell phone, a smart phone, a personal digital assistant, a digital music player, a digital video player, a laptop computer, a handheld computer, a tablet, a video game controller, and/or any other portable device that includes a computing core. A fixed computing device may be a personal computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general and with respect to DS error encoded data storage and retrieval, the distributed computing system 10 supports three primary operations: storage management, data storage and retrieval (an example of which will be discussed with reference to FIGS. 20-26), and data storage integrity verification. In accordance with these three primary functions, data can be encoded, distributedly stored in physically different locations, and subsequently retrieved in a reliable and secure manner. Such a system is tolerant of a significant number of failures (e.g., up to a failure level, which may be greater than or equal to a pillar width minus a decode threshold minus one) that may result from individual storage device failures and/or network equipment failures without loss of data and without the need for a redundant or backup copy. Further, the system allows the data to be stored for an indefinite period of time without data loss and does so in a secure manner (e.g., the system is very resistant to attempts at hacking the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated registry information in one or more of the DSTN module 22, the user device 12, the DST processing unit 16, and the DST integrity processing unit 20.

The DS error encoding parameters (e.g., or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a private vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations includes authenticating user data allocation requests (e.g., read and/or write requests), managing creation of vaults, establishing authentication credentials for user devices, adding/deleting components (e.g., user devices, DST execution units, and/or DST processing units) from the distributed computing system 10, and/or establishing authentication credentials for DST execution units 36. Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

To support distributed task processing on received data, the distributed computing system 10 has two primary operations: DST (distributed storage and/or task processing) management and DST execution on received data (an example of which will be discussed with reference to FIGS. 3-19). With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. An example of DST execution on stored data will be discussed in greater detail with reference to FIGS. 27-39. With respect to the DST management, it is substantially similar to the DST management to support distributed task processing on received data.

Figure 2:
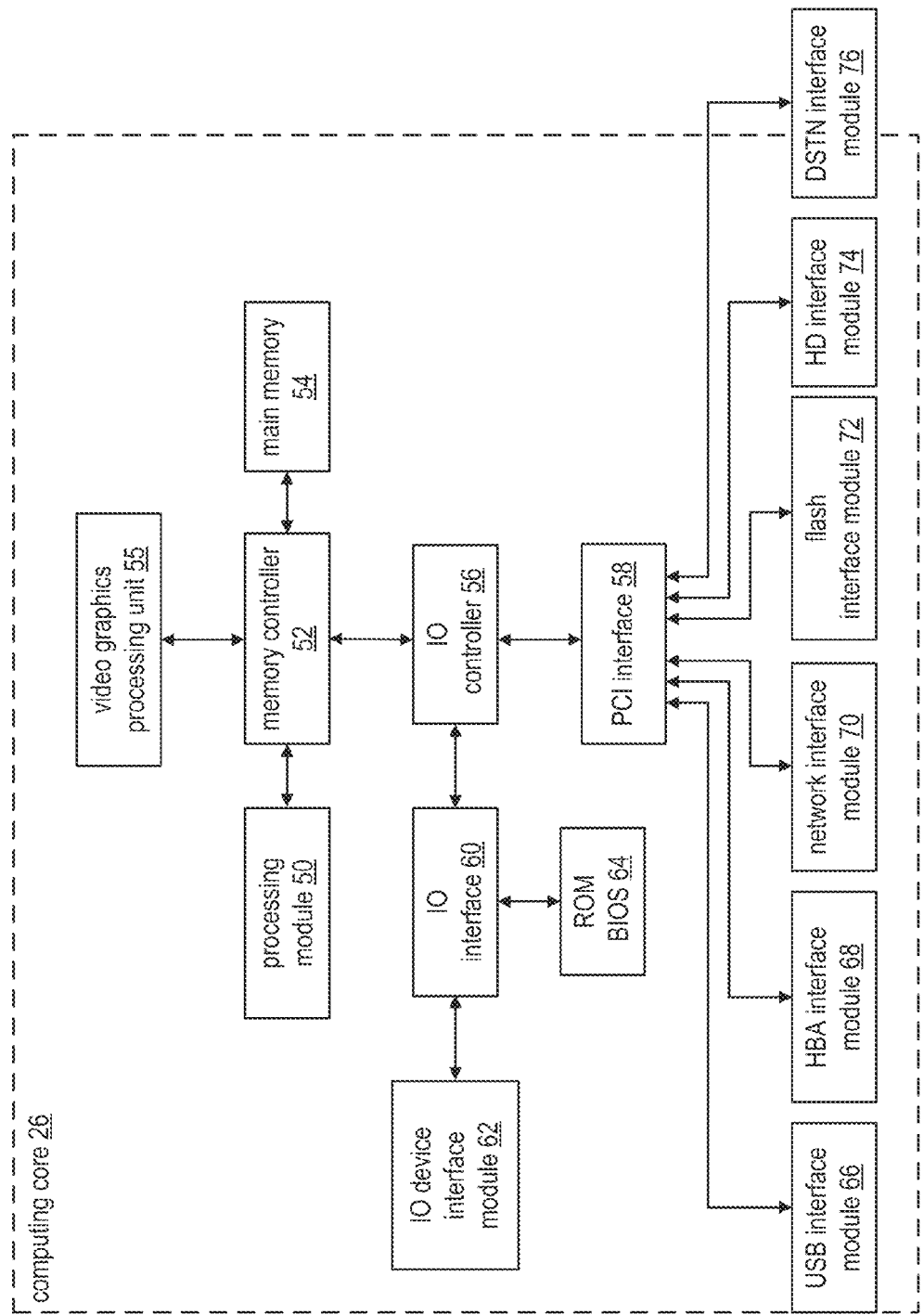
FIG. 2 is a schematic block diagram of an embodiment of a computing core in accordance with the present disclosure.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the I0 device interface module 62 and/or the memory interface modules may be collectively or individually referred to as IO ports.

Figure 3:
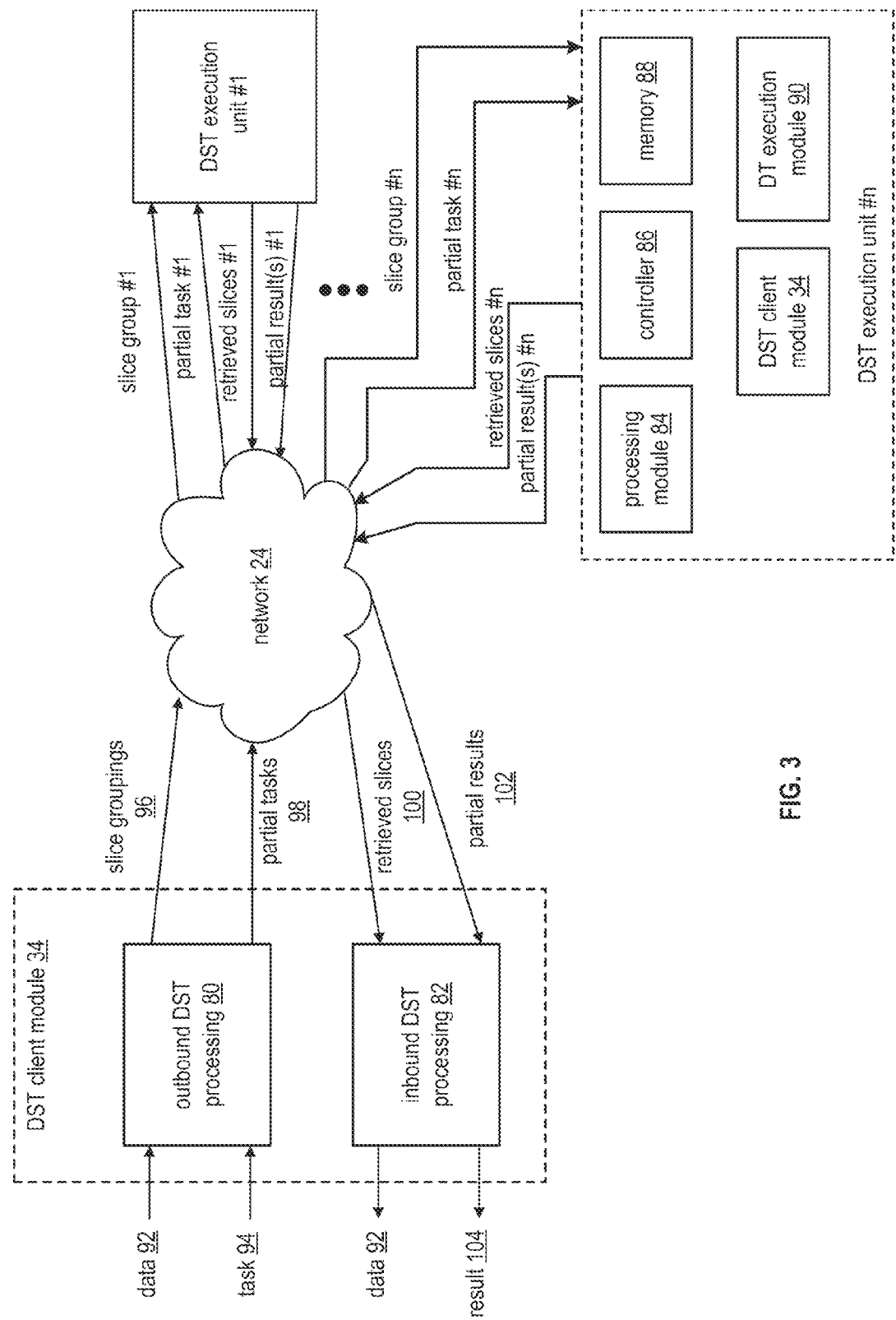
FIG. 3 is a diagram of an example of a distributed storage and task processing in accordance with the present disclosure.

FIG. 3 is a diagram of an example of the distributed computing system performing a distributed storage and task processing operation. The distributed computing system includes a DST (distributed storage and/or task) client module 34 (which may be in user device 14 and/or in DST processing unit 16 of FIG. 1), a network 24, a plurality of DST execution units 1-$n$ that includes two or more DST execution units 36 of FIG. 1 (which form at least a portion of DSTN module 22 of FIG. 1), a DST managing module (not shown), and a DST integrity verification module (not shown). The DST client module 34 includes an outbound DST processing section 80 and an inbound DST processing section 82. Each of the DST execution units 1-$n$ includes a controller 86, a processing module 84, memory 88, a DT (distributed task) execution module 90, and a DST client module 34.

In an example of operation, the DST client module 34 receives data 92 and one or more tasks 94 to be performed upon the data 92. The data 92 may be of any size and of any content, where, due to the size (e.g., greater than a few Terabytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes).

Within the DST client module 34, the outbound DST processing section 80 receives the data 92 and the task(s) 94. The outbound DST processing section 80 processes the data 92 to produce slice groupings 96. As an example of such processing, the outbound DST processing section 80 partitions the data 92 into a plurality of data partitions. For each data partition, the outbound DST processing section 80 dispersed storage (DS) error encodes the data partition to produce encoded data slices and groups the encoded data slices into a slice grouping 96. In addition, the outbound DST processing section 80 partitions the task 94 into partial tasks 98, where the number of partial tasks 98 may correspond to the number of slice groupings 96.

The outbound DST processing section 80 then sends, via the network 24, the slice groupings 96 and the partial tasks 98 to the DST execution units 1-$n$ of the DSTN module 22 of FIG. 1. For example, the outbound DST processing section 80 sends slice group 1 and partial task 1 to DST execution unit 1. As another example, the outbound DST processing section 80 sends slice group #n and partial task #n to DST execution unit #n.

Each DST execution unit performs its partial task 98 upon its slice group 96 to produce partial results 102. For example, DST execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DST execution units send, via the network 24, their partial results 102 to the inbound DST processing section 82 of the DST client module 34. The inbound DST processing section 82 processes the received partial results 102 to produce a result 104. Continuing with the specific example of the preceding paragraph, the inbound DST processing section 82 combines the phrase count from each of the DST execution units 36 to produce a total phrase count. In addition, the inbound DST processing section 82 combines the 'where the phrase was found' information from each of the DST execution units 36 within their respective data partitions to produce 'where the phrase was found' information for the series of digital books.

In another example of operation, the DST client module 34 requests retrieval of stored data within the memory of the DST execution units 36 (e.g., memory of the DSTN module). In this example, the task 94 is retrieve data stored in the memory of the DSTN module. Accordingly, the outbound DST processing section 80 converts the task 94 into a plurality of partial tasks 98 and sends the partial tasks 98 to the respective DST execution units 1-n.

In response to the partial task 98 of retrieving stored data, a DST execution unit 36 identifies the corresponding encoded data slices 100 and retrieves them. For example, DST execution unit #1 receives partial task #1 and retrieves, in response thereto, retrieved slices #1. The DST execution units 36 send their respective retrieved slices 100 to the inbound DST processing section 82 via the network 24.

The inbound DST processing section 82 converts the retrieved slices 100 into data 92. For example, the inbound DST processing section 82 de-groups the retrieved slices 100 to produce encoded slices per data partition. The inbound DST processing section 82 then DS error decodes the encoded slices per data partition to produce data partitions. The inbound DST processing section 82 de-partitions the data partitions to recapture the data 92.

Figure 4:
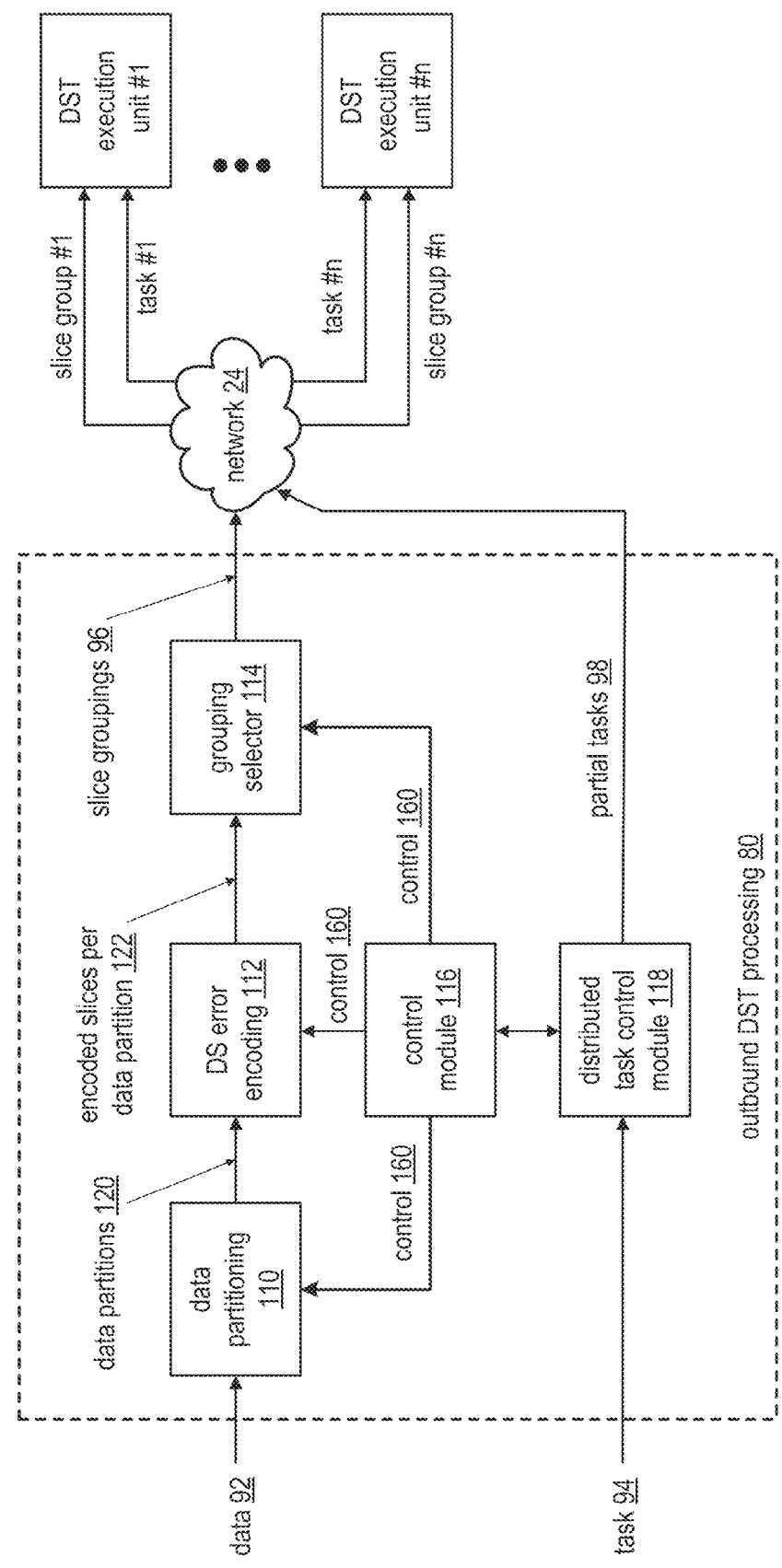
FIG. 4 is a schematic block diagram of an embodiment of an outbound distributed storage and/or task (DST) processing in accordance with the present disclosure.

FIG. 4 is a schematic block diagram of an embodiment of an outbound distributed storage and/or task (DST) processing section 80 of a DST client module 34 FIG. 1 coupled to a DSTN module 22 of a FIG. 1 (e.g., a plurality of n DST execution units 36) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 partitions data 92 into a plurality of data partitions 120. The number of partitions and the size of the partitions may be selected by the control module 116 via control 160 based on the data 92 (e.g., its size, its content, etc.), a corresponding task 94 to be performed (e.g., simple, complex, single step, multiple steps, etc.), DS encoding parameters (e.g., pillar width, decode threshold, write threshold, segment security parameters, slice security parameters, etc.), capabilities of the DST execution units 36 (e.g., processing resources, availability of processing recourses, etc.), and/or as may be inputted by a user, system administrator, or other operator (human or automated). For example, the data partitioning module 110 partitions the data 92 (e.g., 100 Terabytes) into 100,000 data segments, each being 1 Gigabyte in size. Alternatively, the data partitioning module 110 partitions the data 92 into a plurality of data segments, where some of data segments are of a different size, are of the same size, or a combination thereof.

The DS error encoding module 112 receives the data partitions 120 in a serial manner, a parallel manner, and/or a combination thereof. For each data partition 120, the DS error encoding module 112 DS error encodes the data partition 120 in accordance with control information 160 from the control module 116 to produce encoded data slices 122. The DS error encoding includes segmenting the data partition into data segments, segment security processing (e.g., encryption, compression, watermarking, integrity check (e.g., CRC), etc.), error encoding, slicing, and/or per slice security processing (e.g., encryption, compression, watermarking, integrity check (e.g., CRC), etc.). The control information 160 indicates which steps of the DS error encoding are active for a given data partition and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 122 of a data partition into a set of slice groupings 96. The number of slice groupings corresponds to the number of DST execution units 36 identified for a particular task 94. For example, if five DST execution units 36 are identified for the particular task 94, the grouping selector module groups the encoded slices 122 of a data partition into five slice groupings 96. The grouping selector module 114 outputs the slice groupings 96 to the corresponding DST execution units 36 via the network 24.

The distributed task control module 118 receives the task 94 and converts the task 94 into a set of partial tasks 98. For example, the distributed task control module 118 receives a task to find where in the data (e.g., a series of books) a phrase occurs and a total count of the phrase usage in the data. In this example, the distributed task control module 118 replicates the task 94 for each DST execution unit 36 to produce the partial tasks 98. In another example, the distributed task control module 118 receives a task to find where in the data a first phrase occurs, where in the data a second phrase occurs, and a total count for each phrase usage in the data. In this example, the distributed task control module 118 generates a first set of partial tasks 98 for finding and counting the first phrase and a second set of partial tasks for finding and counting the second phrase. The distributed task control module 118 sends respective first and/or second partial tasks 98 to each DST execution unit 36.

Figure 5:
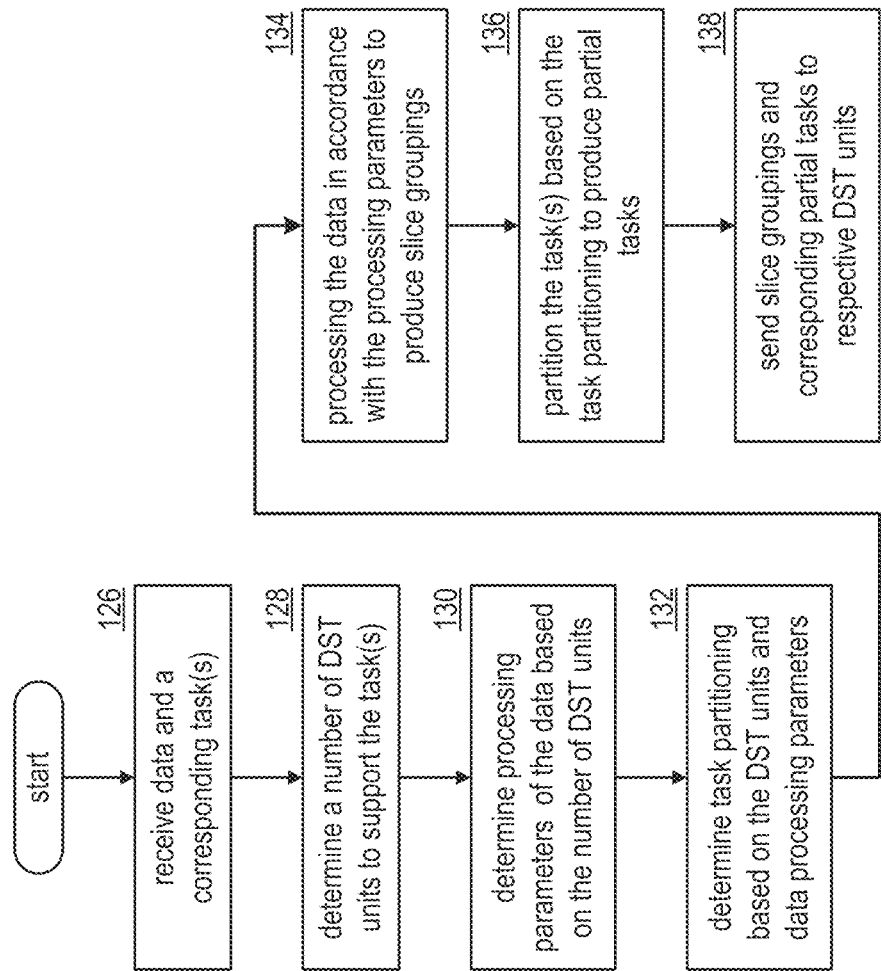
FIG. 5 is a logic diagram of an example of a method for outbound DST processing in accordance with the present disclosure.

FIG. 5 is a logic diagram of an example of a method for outbound distributed storage and task (DST) processing that begins at step 126 where a DST client module receives data and one or more corresponding tasks. The method continues at step 128 where the DST client module determines a number of DST units to support the task for one or more data partitions. For example, the DST client module may determine the number of DST units to support the task based on the size of the data, the requested task, the content of the data, a predetermined number (e.g., user indicated, system administrator determined, etc.), available DST units, capability of the DST units, and/or any other factor regarding distributed task processing of the data. The DST client module may select the same DST units for each data partition, may select different DST units for the data partitions, or a combination thereof.

The method continues at step 130 where the DST client module determines processing parameters of the data based on the number of DST units selected for distributed task processing. The processing parameters include data partitioning information, DS encoding parameters, and/or slice grouping information. The data partitioning information includes a number of data partitions, size of each data partition, and/or organization of the data partitions (e.g., number of data blocks in a partition, the size of the data blocks, and arrangement of the data blocks). The DS encoding parameters include segmenting information, segment security information, error encoding information (e.g., dispersed storage error encoding function parameters including one or more of pillar width, decode threshold, write threshold, read threshold, generator matrix), slicing information, and/or per slice security information. The slice grouping information includes information regarding how to arrange the encoded data slices into groups for the selected DST units. As a specific example, if the DST client module determines that five DST units are needed to support the task, then it determines that the error encoding parameters include a pillar width of five and a decode threshold of three.

The method continues at step 132 where the DST client module determines task partitioning information (e.g., how to partition the tasks) based on the selected DST units and data processing parameters. The data processing parameters include the processing parameters and DST unit capability information. The DST unit capability information includes the number of DT (distributed task) execution units, execution capabilities of each DT execution unit (e.g., MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.)), and/or any information germane to executing one or more tasks.

The method continues at step 134 where the DST client module processes the data in accordance with the processing parameters to produce slice groupings. The method continues at step 136 where the DST client module partitions the task based on the task partitioning information to produce a set of partial tasks. The method continues at step 138 where the DST client module sends the slice groupings and the corresponding partial tasks to respective DST units.

Figure 6:
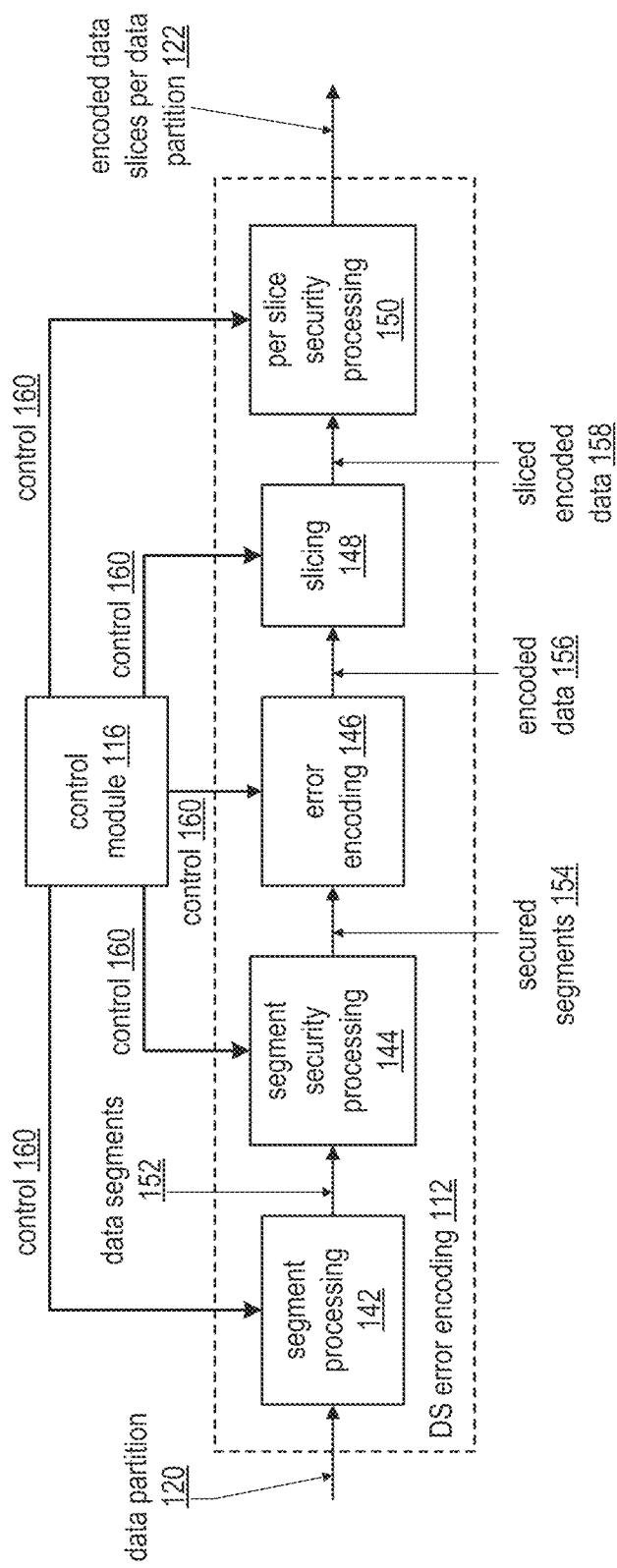
FIG. 6 is a schematic block diagram of an embodiment of a dispersed error encoding in accordance with the present disclosure.

FIG. 6 is a schematic block diagram of an embodiment of the dispersed storage (DS) error encoding module 112 of an outbound distributed storage and task (DST) processing section. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives a data partition 120 from a data partitioning module and receives segmenting information as the control information 160 from the control module 116. The segmenting information indicates how the segment processing module 142 is to segment the data partition 120. For example, the segmenting information indicates how many rows to segment the data based on a decode threshold of an error encoding scheme, indicates how many columns to segment the data into based on a number and size of data blocks within the data partition 120, and indicates how many columns to include in a data segment 152. The segment processing module 142 segments the data 120 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., cyclic redundancy check (CRC), etc.), and/or any other type of digital security. For example, when the segment security processing module 144 is enabled, it may compress a data segment 152, encrypt the compressed data segment, and generate a CRC value for the encrypted data segment to produce a secure data segment 154. When the segment security processing module 144 is not enabled, it passes the data segments 152 to the error encoding module 146 or is bypassed such that the data segments 152 are provided to the error encoding module 146.

The error encoding module 146 encodes the secure data segments 154 in accordance with error correction encoding parameters received as control information 160 from the control module 116. The error correction encoding parameters (e.g., also referred to as dispersed storage error coding parameters) include identifying an error correction encoding scheme (e.g., forward error correction algorithm, a Reed-Solomon based algorithm, an online coding algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment 154 to produce an encoded data segment 156.

The slicing module 148 slices the encoded data segment 156 in accordance with the pillar width of the error correction encoding parameters received as control information 160. For example, if the pillar width is five, the slicing module 148 slices an encoded data segment 156 into a set of five encoded data slices. As such, for a plurality of encoded data segments 156 for a given data partition, the slicing module outputs a plurality of sets of encoded data slices 158.

The per slice security processing module 150, when enabled by the control module 116, secures each encoded data slice 158 based on slice security information received as control information 160 from the control module 116. The slice security information includes data compression, encryption, watermarking, integrity check (e.g., CRC, etc.), and/or any other type of digital security. For example, when the per slice security processing module 150 is enabled, it compresses an encoded data slice 158, encrypts the compressed encoded data slice, and generates a CRC value for the encrypted encoded data slice to produce a secure encoded data slice 122. When the per slice security processing module 150 is not enabled, it passes the encoded data slices 158 or is bypassed such that the encoded data slices 158 are the output of the DS error encoding module 112. Note that the control module 116 may be omitted and each module stores its own parameters.

Figure 7:
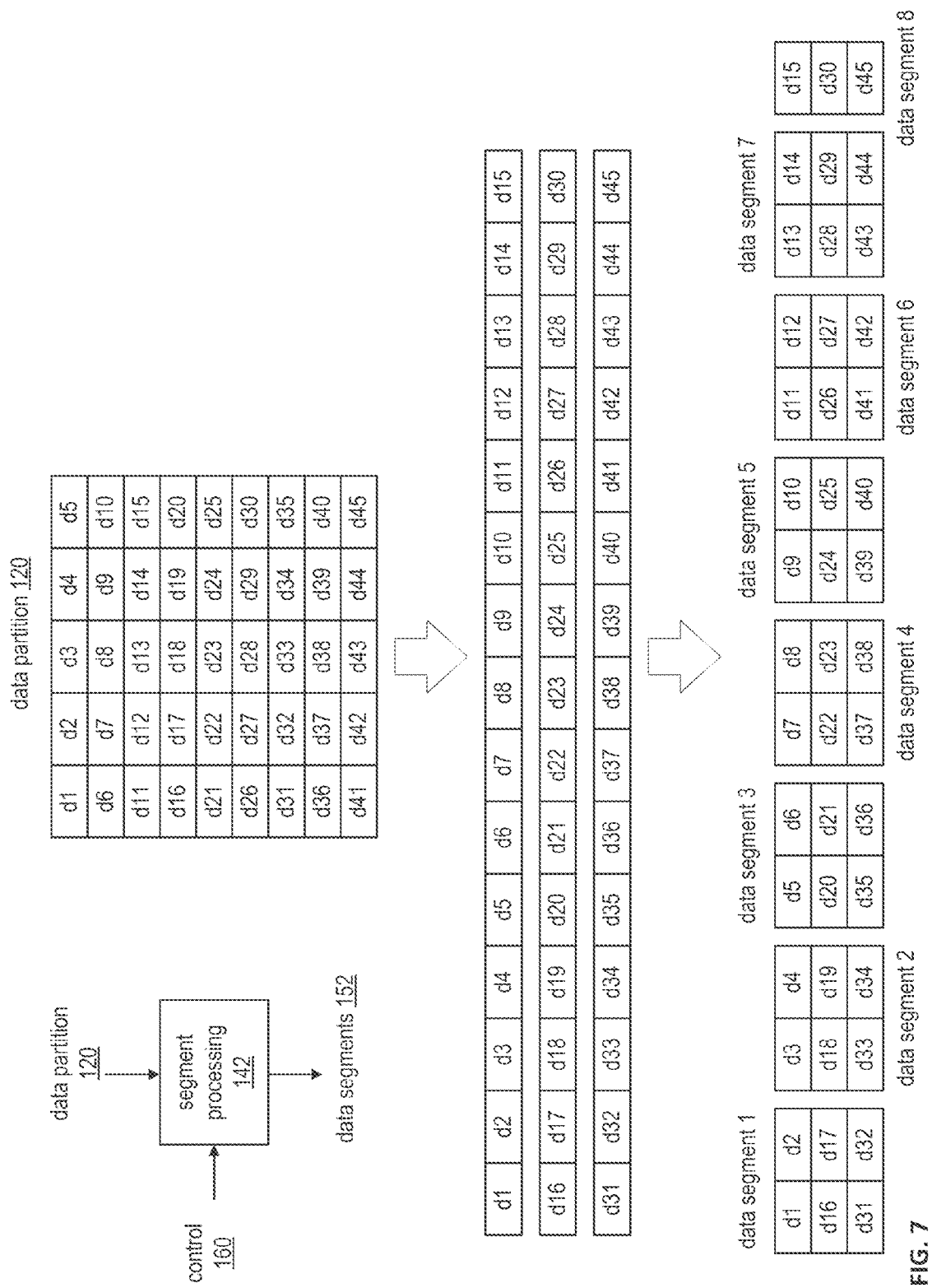
FIG. 7 is a diagram of an example of a segment processing of the dispersed error encoding in accordance with the present disclosure.

FIG. 7 is a diagram of an example of a segment processing of a dispersed storage (DS) error encoding module. In this example, a segment processing module 142 receives a data partition 120 that includes 45 data blocks (e.g., d1-d45), receives segmenting information (i.e., control information 160) from a control module, and segments the data partition 120 in accordance with the control information 160 to produce data segments 152. Each data block may be of the same size as other data blocks or of a different size. In addition, the size of each data block may be a few bytes to megabytes of data. As previously mentioned, the segmenting information indicates how many rows to segment the data partition into, indicates how many columns to segment the data partition into, and indicates how many columns to include in a data segment.

In this example, the decode threshold of the error encoding scheme is three; as such the number of rows to divide the data partition into is three. The number of columns for each row is set to 15, which is based on the number and size of data blocks. The data blocks of the data partition are arranged in rows and columns in a sequential order (i.e., the first row includes the first 15 data blocks; the second row includes the second 15 data blocks; and the third row includes the last 15 data blocks).

With the data blocks arranged into the desired sequential order, they are divided into data segments based on the segmenting information. In this example, the data partition is divided into 8 data segments; the first 7 include 2 columns of three rows and the last includes 1 column of three rows. Note that the first row of the 8 data segments is in sequential order of the first 15 data blocks; the second row of the 8 data segments in sequential order of the second 15 data blocks; and the third row of the 8 data segments in sequential order of the last 15 data blocks. Note that the number of data blocks, the grouping of the data blocks into segments, and size of the data blocks may vary to accommodate the desired distributed task processing function.

Figure 8:
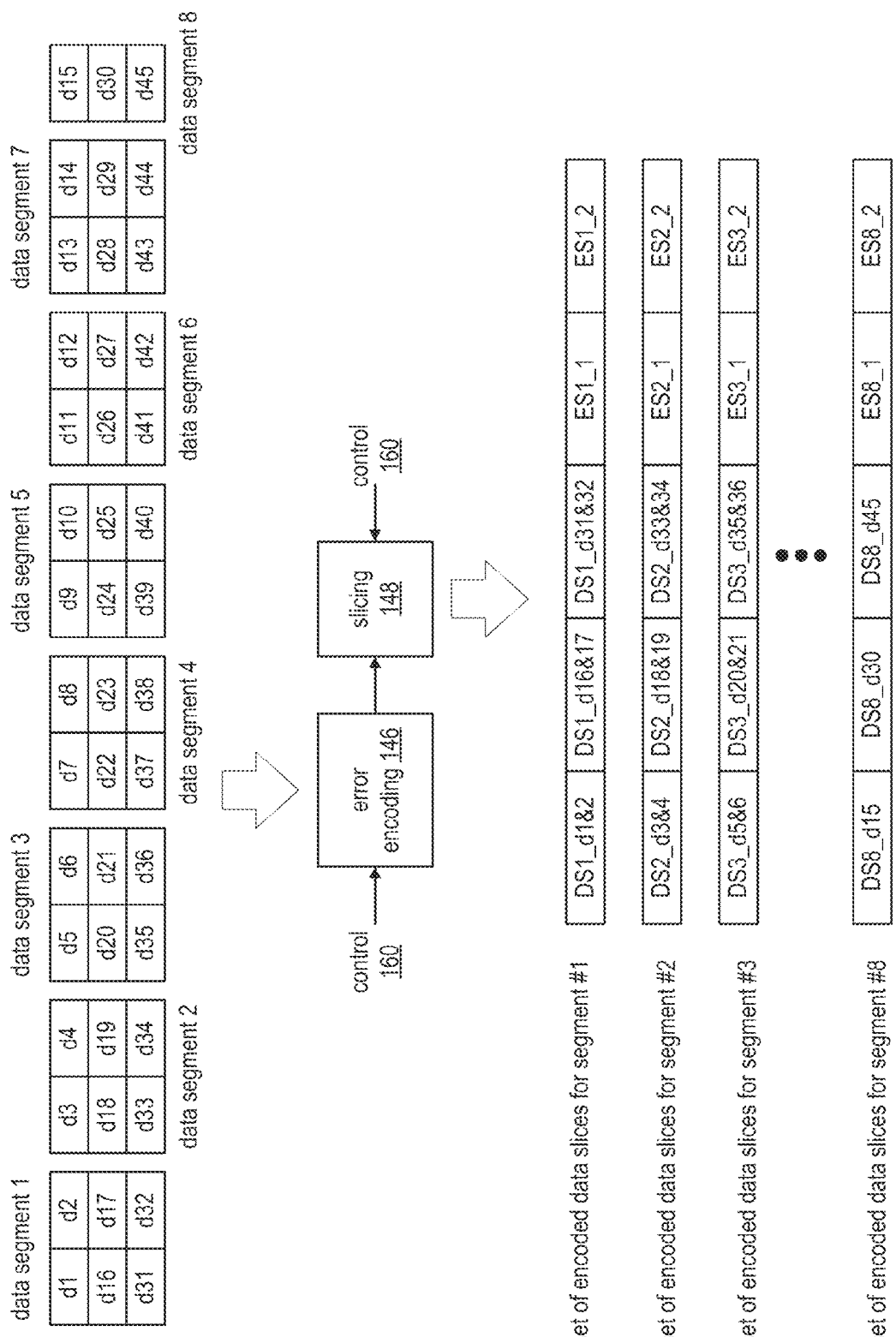
FIG. 8 is a diagram of an example of error encoding and slicing processing of the dispersed error encoding in accordance with the present disclosure.

FIG. 8 is a diagram of an example of error encoding and slicing processing of the dispersed error encoding processing the data segments of FIG. 7. In this example, data segment 1 includes 3 rows with each row being treated as one word for encoding. As such, data segment 1 includes three words for encoding: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

In operation, an error encoding module 146 and a slicing module 148 convert each data segment into a set of encoded data slices in accordance with error correction encoding parameters as control information 160. More specifically, when the error correction encoding parameters indicate a unity matrix Reed-Solomon based encoding algorithm, 5 pillars, and decode threshold of 3, the first three encoded data slices of the set of encoded data slices for a data segment are substantially similar to the corresponding word of the data segment. For instance, when the unity matrix Reed-Solomon based encoding algorithm is applied to data segment 1, the content of the first encoded data slice (DS1_d1&2) of the first set of encoded data slices (e.g., corresponding to data segment 1) is substantially similar to content of the first word (e.g., d1 & d2); the content of the second encoded data slice (DS1_d16&17) of the first set of encoded data slices is substantially similar to content of the second word (e.g., d16 & d17); and the content of the third encoded data slice (DS1_d31&32) of the first set of encoded data slices is substantially similar to content of the third word (e.g., d31 & d32).

The content of the fourth and fifth encoded data slices (e.g., ES1_1 and ES1_2) of the first set of encoded data slices include error correction data based on the first—third words of the first data segment. With such an encoding and slicing scheme, retrieving any three of the five encoded data slices allows the data segment to be accurately reconstructed.

The encoding and slicing of data segments 2-7 yield sets of encoded data slices similar to the set of encoded data slices of data segment 1. For instance, the content of the first encoded data slice (DS2_d3&4) of the second set of encoded data slices (e.g., corresponding to data segment 2) is substantially similar to content of the first word (e.g., d3 & d4); the content of the second encoded data slice (DS2_d18&19) of the second set of encoded data slices is substantially similar to content of the second word (e.g., d18 & d19); and the content of the third encoded data slice (DS2_d33&34) of the second set of encoded data slices is substantially similar to content of the third word (e.g., d33 & d34). The content of the fourth and fifth encoded data slices (e.g., ES1_1 and ES1_2) of the second set of encoded data slices includes error correction data based on the first—third words of the second data segment.

Figure 9:
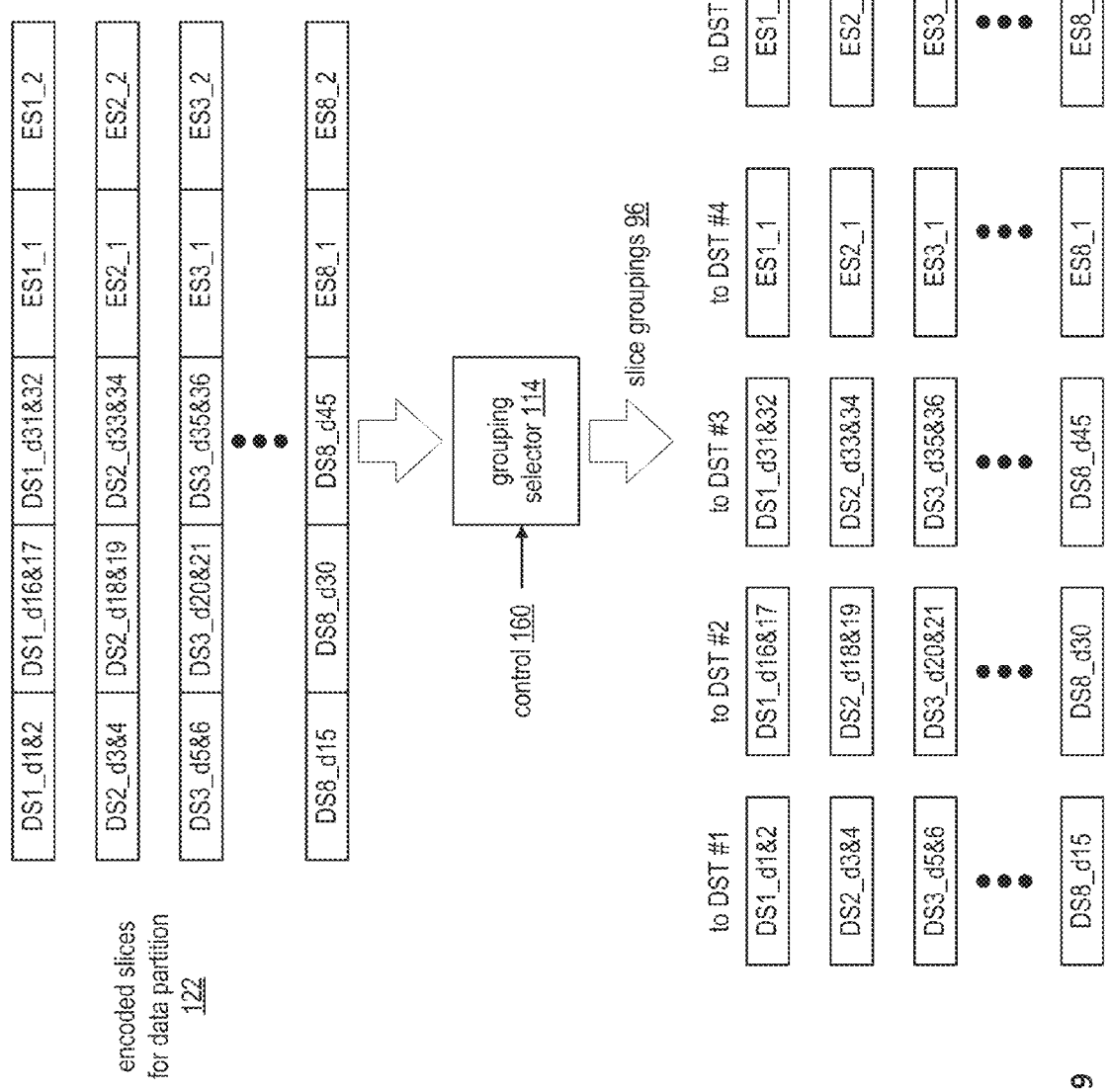
FIG. 9 is a diagram of an example of grouping selection processing of the outbound DST processing in accordance with the present disclosure.

FIG. 9 is a diagram of an example of grouping selection processing of an outbound distributed storage and task (DST) processing in accordance with group selection information as control information 160 from a control module. Encoded slices for data partition 122 are grouped in accordance with the control information 160 to produce slice groupings 96. In this example, a grouping selector module 114 organizes the encoded data slices into five slice groupings (e.g., one for each DST execution unit of a distributed storage and task network (DSTN) module). As a specific example, the grouping selector module 114 creates a first slice grouping for a DST execution unit #1, which includes first encoded slices of each of the sets of encoded slices. As such, the first DST execution unit receives encoded data slices corresponding to data blocks 1-15 (e.g., encoded data slices of contiguous data).

The grouping selector module 114 also creates a second slice grouping for a DST execution unit #2, which includes second encoded slices of each of the sets of encoded slices. As such, the second DST execution unit receives encoded data slices corresponding to data blocks 16-30. The grouping selector module 114 further creates a third slice grouping for DST execution unit #3, which includes third encoded slices of each of the sets of encoded slices. As such, the third DST execution unit receives encoded data slices corresponding to data blocks 31-45.

The grouping selector module 114 creates a fourth slice grouping for DST execution unit #4, which includes fourth encoded slices of each of the sets of encoded slices. As such, the fourth DST execution unit receives encoded data slices corresponding to first error encoding information (e.g., encoded data slices of error coding (EC) data). The grouping selector module 114 further creates a fifth slice grouping for DST execution unit #5, which includes fifth encoded slices of each of the sets of encoded slices. As such, the fifth DST execution unit receives encoded data slices corresponding to second error encoding information.

Figure 10:
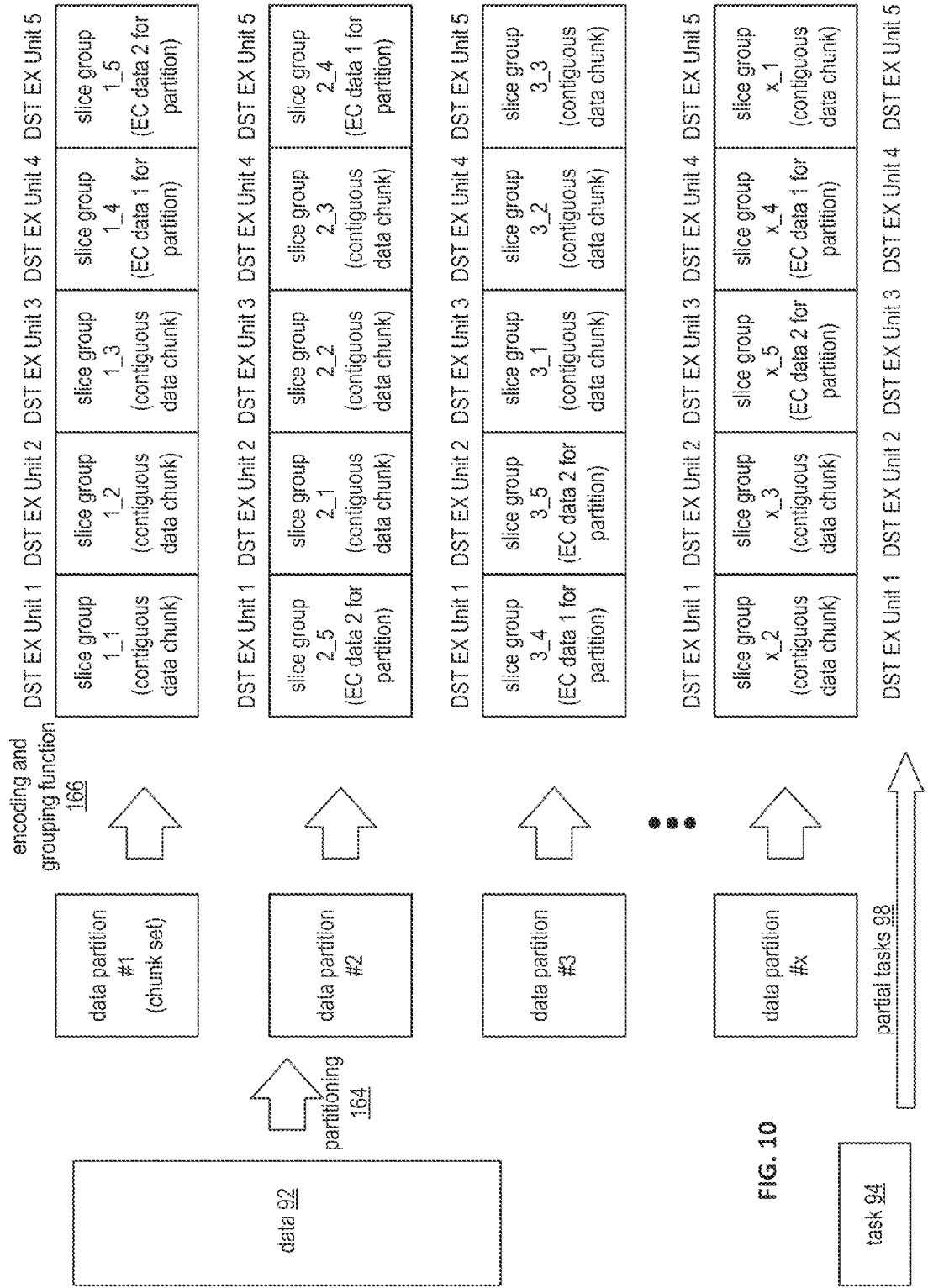
FIG. 10 is a diagram of an example of converting data into slice groups in accordance with the present disclosure.

FIG. 10 is a diagram of an example of converting data 92 into slice groups that expands on the preceding figures. As shown, the data 92 is partitioned in accordance with a partitioning function 164 into a plurality of data partitions (1-*x*, where x is an integer greater than 4). Each data partition (or chunkset of data) is encoded and grouped into slice groupings as previously discussed by an encoding and grouping function 166. For a given data partition, the slice groupings are sent to distributed storage and task (DST)

execution units. From data partition to data partition, the ordering of the slice groupings to the DST execution units may vary.

For example, the slice groupings of data partition #1 is sent to the DST execution units such that the first DST execution receives first encoded data slices of each of the sets of encoded data slices, which corresponds to a first continuous data chunk of the first data partition (e.g., refer to FIG. 9), a second DST execution receives second encoded data slices of each of the sets of encoded data slices, which corresponds to a second continuous data chunk of the first data partition, etc.

For the second data partition, the slice groupings may be sent to the DST execution units in a different order than it was done for the first data partition. For instance, the first slice grouping of the second data partition (e.g., slice group 2_1) is sent to the second DST execution unit; the second slice grouping of the second data partition (e.g., slice group 2_2) is sent to the third DST execution unit; the third slice grouping of the second data partition (e.g., slice group 2_3) is sent to the fourth DST execution unit; the fourth slice grouping of the second data partition (e.g., slice group 2_4, which includes first error coding information) is sent to the fifth DST execution unit; and the fifth slice grouping of the second data partition (e.g., slice group 2_5, which includes second error coding information) is sent to the first DST execution unit.

The pattern of sending the slice groupings to the set of DST execution units may vary in a predicted pattern, a random pattern, and/or a combination thereof from data partition to data partition. In addition, from data partition to data partition, the set of DST execution units may change. For example, for the first data partition, DST execution units 1-5 may be used; for the second data partition, DST execution units 6-10 may be used; for the third data partition, DST execution units 3-7 may be used; etc. As is also shown, the task is divided into partial tasks that are sent to the DST execution units in conjunction with the slice groupings of the data partitions.

Figure 11:
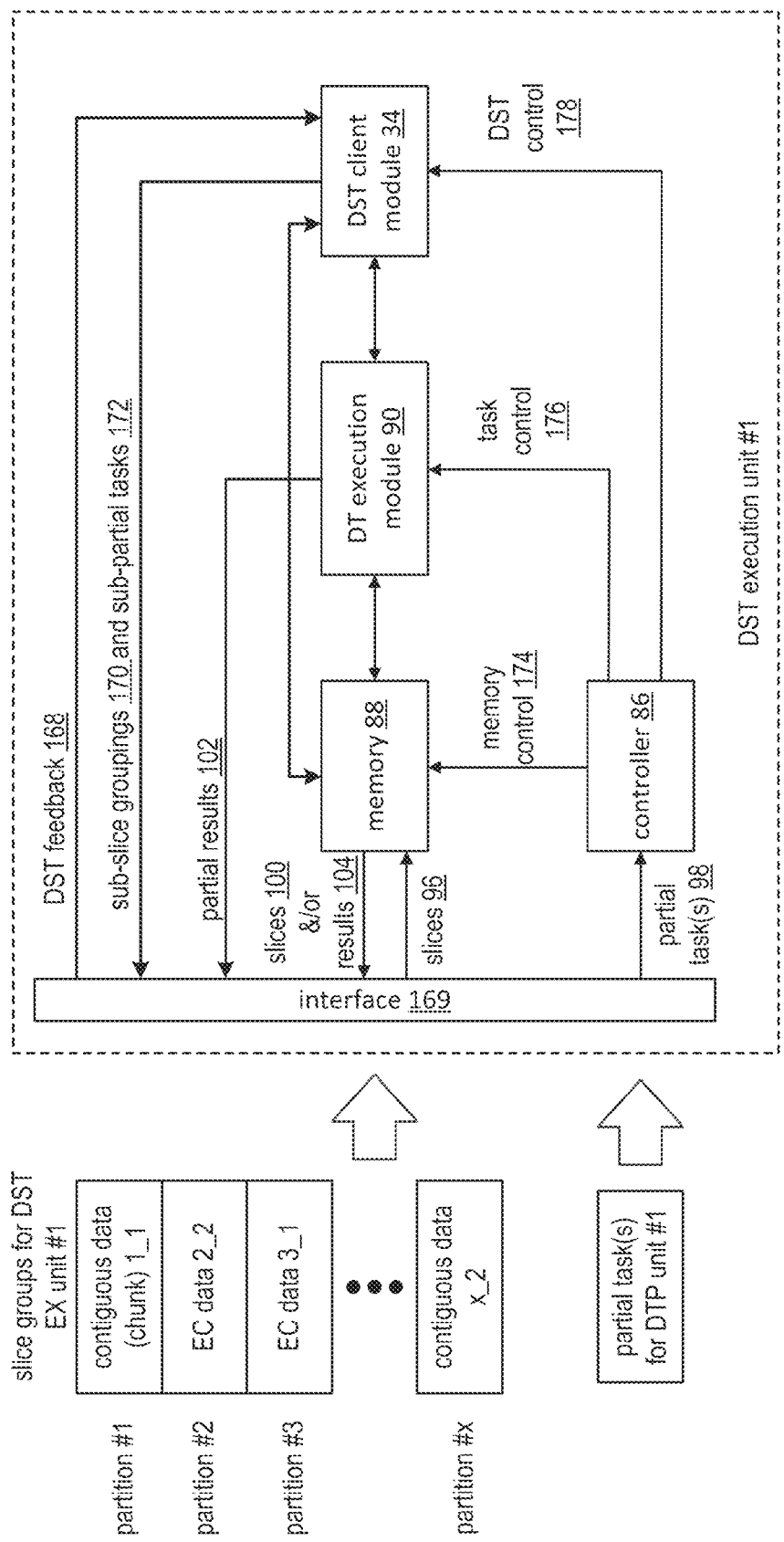
FIG. 11 is a schematic block diagram of an embodiment of a DST execution unit in accordance with the present disclosure.

FIG. 11 is a schematic block diagram of an embodiment of a DST (distributed storage and/or task) execution unit that includes an interface 169, a controller 86, memory 88, one or more DT (distributed task) execution modules 90, and a DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a slice group, the DST execution module receives a slice grouping 96 (e.g., slice group #1) via interface 169. The slice grouping 96 includes, per partition, encoded data slices of contiguous data or encoded data slices of error coding (EC) data. For slice group #1, the DST execution module receives encoded data slices of contiguous data for partitions #1 and #x (and potentially others between 3 and x) and receives encoded data slices of EC data for partitions #2 and #3 (and potentially others between 3 and x). Examples of encoded data slices of contiguous data and encoded data slices of error coding (EC) data are discussed with reference to FIG. 9. The memory 88 stores the encoded data slices of slice groupings 96 in accordance with memory control information 174 it receives from the controller 86.

The controller 86 (e.g., a processing module, a CPU, etc.) generates the memory control information 174 based on a partial task(s) 98 and distributed computing information (e.g., user information (e.g., user ID, distributed computing permissions, data access permission, etc.), vault information (e.g., virtual memory assigned to user, user group, temporary storage for task processing, etc.), task validation information, etc.). For example, the controller 86 interprets the partial task(s) 98 in light of the distributed computing information to determine whether a requestor is authorized to perform the task 98, is authorized to access the data, and/or is authorized to perform the task on this particular data. When the requestor is authorized, the controller 86 determines, based on the task 98 and/or another input, whether the encoded data slices of the slice grouping 96 are to be temporarily stored or permanently stored. Based on the foregoing, the controller 86 generates the memory control information 174 to write the encoded data slices of the slice grouping 96 into the memory 88 and to indicate whether the slice grouping 96 is permanently stored or temporarily stored.

With the slice grouping 96 stored in the memory 88, the controller 86 facilitates execution of the partial task(s) 98. In an example, the controller 86 interprets the partial task 98 in light of the capabilities of the DT execution module(s) 90. The capabilities include one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, etc. If the controller 86 determines that the DT execution module(s) 90 have sufficient capabilities, it generates task control information 176.

The task control information 176 may be a generic instruction (e.g., perform the task on the stored slice grouping) or a series of operational codes. In the former instance, the DT execution module 90 includes a co-processor function specifically configured (fixed or programmed) to perform the desired task 98. In the latter instance, the DT execution module 90 includes a general processor topology where the controller stores an algorithm corresponding to the particular task 98. In this instance, the controller 86 provides the operational codes (e.g., assembly language, source code of a programming language, object code, etc.) of the algorithm to the DT execution module 90 for execution.

Depending on the nature of the task 98, the DT execution module 90 may generate intermediate partial results 102 that are stored in the memory 88 or in a cache memory (not shown) within the DT execution module 90. In either case, when the DT execution module 90 completes execution of the partial task 98, it outputs one or more partial results 102. The partial results 102 may also be stored in memory 88.

If, when the controller 86 is interpreting whether capabilities of the DT execution module(s) 90 can support the partial task 98, the controller 86 determines that the DT execution module(s) 90 cannot adequately support the task 98 (e.g., does not have the right resources, does not have sufficient available resources, available resources would be too slow, etc.), it then determines whether the partial task 98 should be fully offloaded or partially offloaded.

If the controller 86 determines that the partial task 98 should be fully offloaded, it generates DST control information 178 and provides it to the DST client module 34. The DST control information 178 includes the partial task 98, memory storage information regarding the slice grouping 96, and distribution instructions. The distribution instructions instruct the DST client module 34 to divide the partial task 98 into sub-partial tasks 172, to divide the slice grouping 96 into sub-slice groupings 170, and identify other DST execution units. The DST client module 34 functions in a similar manner as the DST client module 34 of FIGS. 3-10 to produce the sub-partial tasks 172 and the sub-slice groupings 170 in accordance with the distribution instructions.

The DST client module 34 receives DST feedback 168 (e.g., sub-partial results), via the interface 169, from the DST execution units to which the task was offloaded. The DST client module 34 provides the sub-partial results to the DST execution unit, which processes the sub-partial results to produce the partial result(s) 102.

If the controller 86 determines that the partial task 98 should be partially offloaded, it determines what portion of the task 98 and/or slice grouping 96 should be processed locally and what should be offloaded. For the portion that is being locally processed, the controller 86 generates task control information 176 as previously discussed. For the portion that is being offloaded, the controller 86 generates DST control information 178 as previously discussed.

When the DST client module 34 receives DST feedback 168 (e.g., sub-partial results) from the DST executions units to which a portion of the task was offloaded, it provides the sub-partial results to the DT execution module 90. The DT execution module 90 processes the sub-partial results with the sub-partial results it created to produce the partial result(s) 102.

The memory 88 may be further utilized to retrieve one or more of stored slices 100, stored results 104, partial results 102 when the DT execution module 90 stores partial results 102 and/or results 104 in the memory 88. For example, when the partial task 98 includes a retrieval request, the controller 86 outputs the memory control 174 to the memory 88 to facilitate retrieval of slices 100 and/or results 104.

Figure 12:
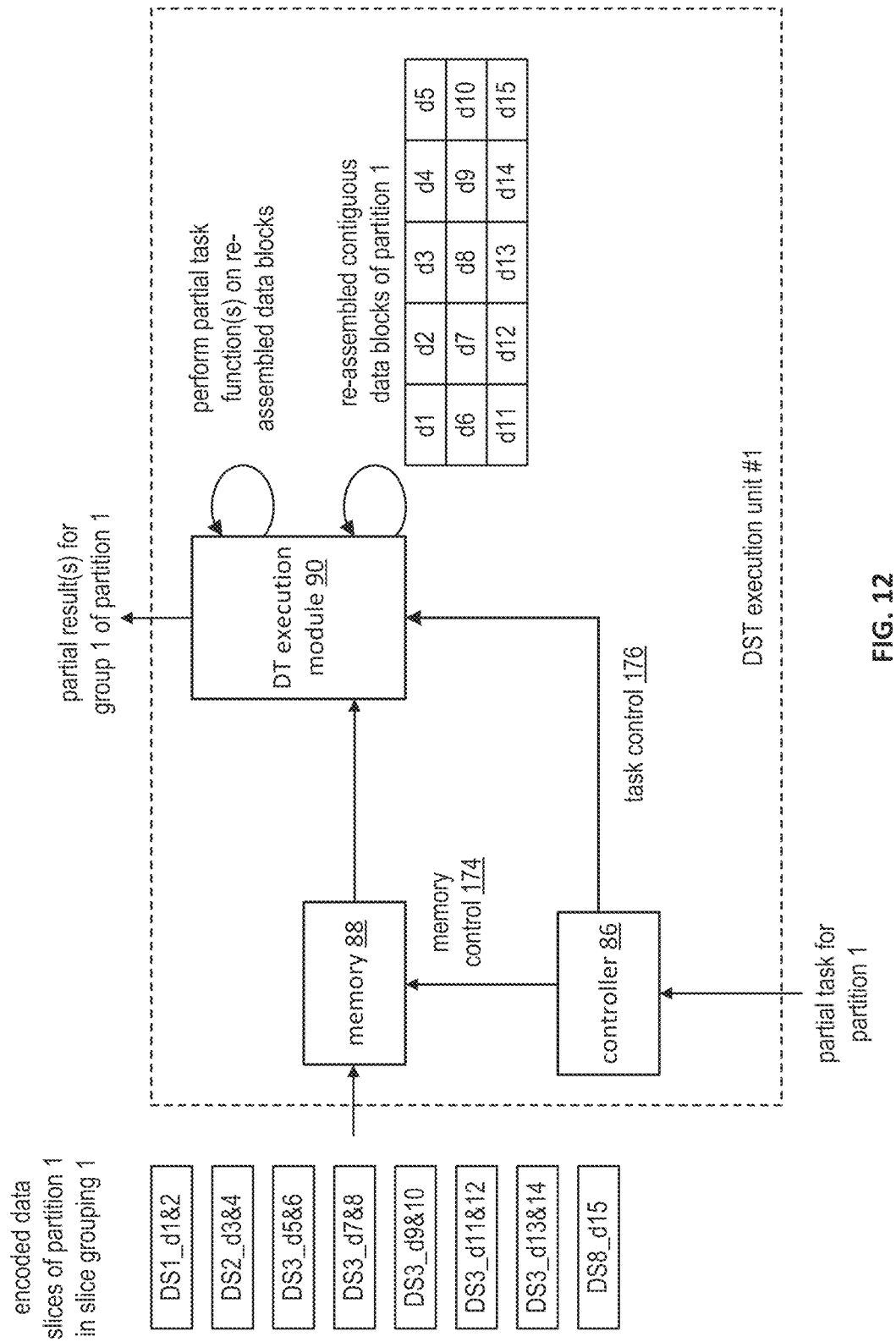
FIG. 12 is a schematic block diagram of an example of operation of a DST execution unit in accordance with the present disclosure.

FIG. 12 is a schematic block diagram of an example of operation of a distributed storage and task (DST) execution unit storing encoded data slices and executing a task thereon. To store the encoded data slices of a partition 1 of slice grouping 1, a controller 86 generates write commands as memory control information 174 such that the encoded slices are stored in desired locations (e.g., permanent or temporary) within memory 88.

Once the encoded slices are stored, the controller 86 provides task control information 176 to a distributed task (DT) execution module 90. As a first step of executing the task in accordance with the task control information 176, the DT execution module 90 retrieves the encoded slices from memory 88. The DT execution module 90 then reconstructs contiguous data blocks of a data partition. As shown for this example, reconstructed contiguous data blocks of data partition 1 include data blocks 1-15 (e.g., d1-d15).

With the contiguous data blocks reconstructed, the DT execution module 90 performs the task on the reconstructed contiguous data blocks. For example, the task may be to search the reconstructed contiguous data blocks for a particular word or phrase, identify where in the reconstructed contiguous data blocks the particular word or phrase occurred, and/or count the occurrences of the particular word or phrase on the reconstructed contiguous data blocks. The DST execution unit continues in a similar manner for the encoded data slices of other partitions in slice grouping 1. Note that with using the unity matrix error encoding scheme previously discussed, if the encoded data slices of contiguous data are uncorrupted, the decoding of them is a relatively straightforward process of extracting the data.

If, however, an encoded data slice of contiguous data is corrupted (or missing), it can be rebuilt by accessing other DST execution units that are storing the other encoded data slices of the set of encoded data slices of the corrupted encoded data slice. In this instance, the DST execution unit having the corrupted encoded data slices retrieves at least three encoded data slices (of contiguous data and of error coding data) in the set from the other DST execution units (recall for this example, the pillar width is 5 and the decode threshold is 3). The DST execution unit decodes the retrieved data slices using the DS error encoding parameters to recapture the corresponding data segment. The DST execution unit then re-encodes the data segment using the DS error encoding parameters to rebuild the corrupted encoded data slice. Once the encoded data slice is rebuilt, the DST execution unit functions as previously described.

Figure 13:
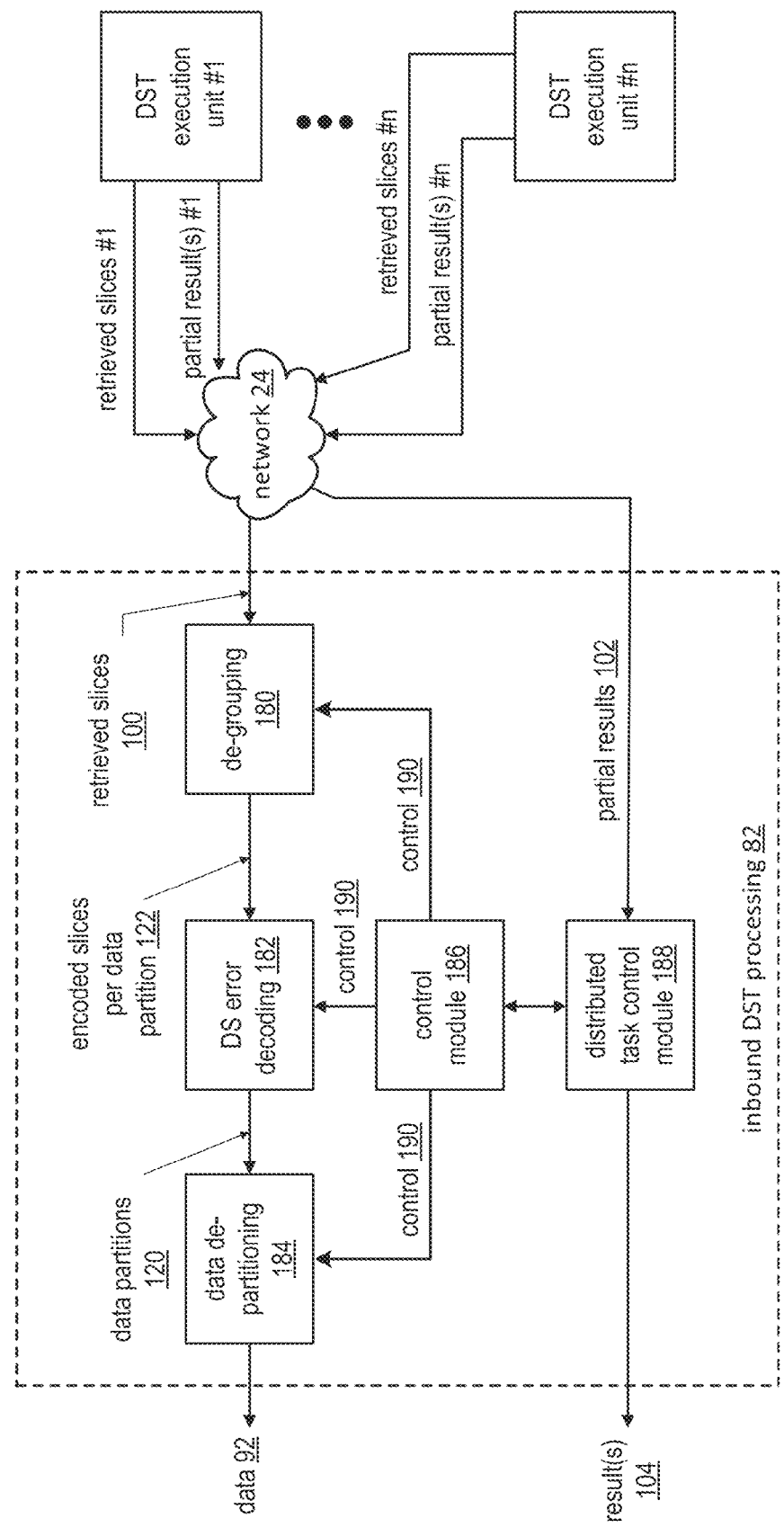
FIG. 13 is a schematic block diagram of an embodiment of an inbound distributed storage and/or task (DST) processing in accordance with the present disclosure.

FIG. 13 is a schematic block diagram of an embodiment of an inbound distributed storage and/or task (DST) processing section 82 of a DST client module coupled to DST execution units of a distributed storage and task network (DSTN) module via a network 24. The inbound DST processing section 82 includes a de-grouping module 180, a DS (dispersed storage) error decoding module 182, a data de-partitioning module 184, a control module 186, and a distributed task control module 188. Note that the control module 186 and/or the distributed task control module 188 may be separate modules from corresponding ones of outbound DST processing section or may be the same modules.

In an example of operation, the DST execution units have completed execution of corresponding partial tasks on the corresponding slice groupings to produce partial results 102. The inbound DST processing section 82 receives the partial results 102 via the distributed task control module 188. The inbound DST processing section 82 then processes the partial results 102 to produce a final result, or results 104. For example, if the task was to find a specific word or phrase within data, the partial results 102 indicate where in each of the prescribed portions of the data the corresponding DST execution units found the specific word or phrase. The distributed task control module 188 combines the individual partial results 102 for the corresponding portions of the data into a final result 104 for the data as a whole.

In another example of operation, the inbound DST processing section 82 is retrieving stored data from the DST execution units (i.e., the DSTN module). In this example, the DST execution units output encoded data slices 100 corresponding to the data retrieval requests. The de-grouping module 180 receives retrieved slices 100 and de-groups them to produce encoded data slices per data partition 122. The DS error decoding module 182 decodes, in accordance with DS error encoding parameters, the encoded data slices per data partition 122 to produce data partitions 120.

The data de-partitioning module 184 combines the data partitions 120 into the data 92. The control module 186 controls the conversion of retrieved slices 100 into the data 92 using control signals 190 to each of the modules. For instance, the control module 186 provides de-grouping information to the de-grouping module 180, provides the DS error encoding parameters to the DS error decoding module 182, and provides de-partitioning information to the data de-partitioning module 184.

Figure 14:
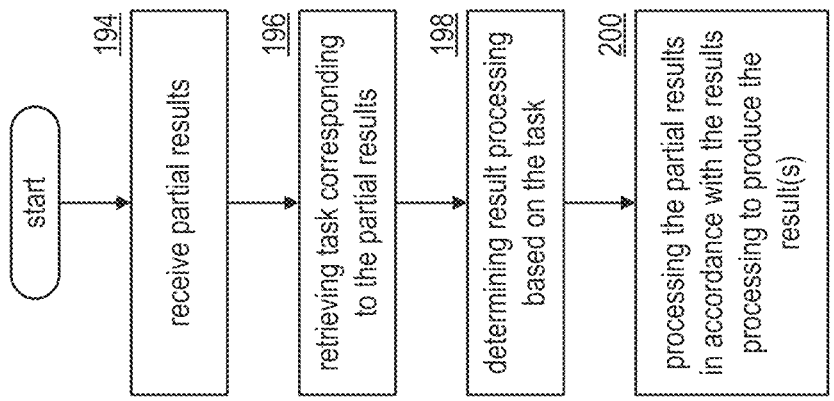
FIG. 14 is a logic diagram of an example of a method for inbound DST processing in accordance with the present disclosure.

FIG. 14 is a logic diagram of an example of a method that is executable by distributed storage and task (DST) client module regarding inbound DST processing. The method begins at step 194 where the DST client module receives partial results. The method continues at step 196 where the DST client module retrieves the task corresponding to the partial results. For example, the partial results include header information that identifies the requesting entity, which correlates to the requested task.

The method continues at step 198 where the DST client module determines result processing information based on the task. For example, if the task were to identify a particular word or phrase within the data, the result processing information would indicate to aggregate the partial results for the corresponding portions of the data to produce the final result. As another example, if the task were to count the occurrences of a particular word or phrase within the data, results of processing the information would indicate to add the partial results to produce the final results. The method continues at step 200 where the DST client module processes the partial results in accordance with the result processing information to produce the final result or results.

Figure 15:
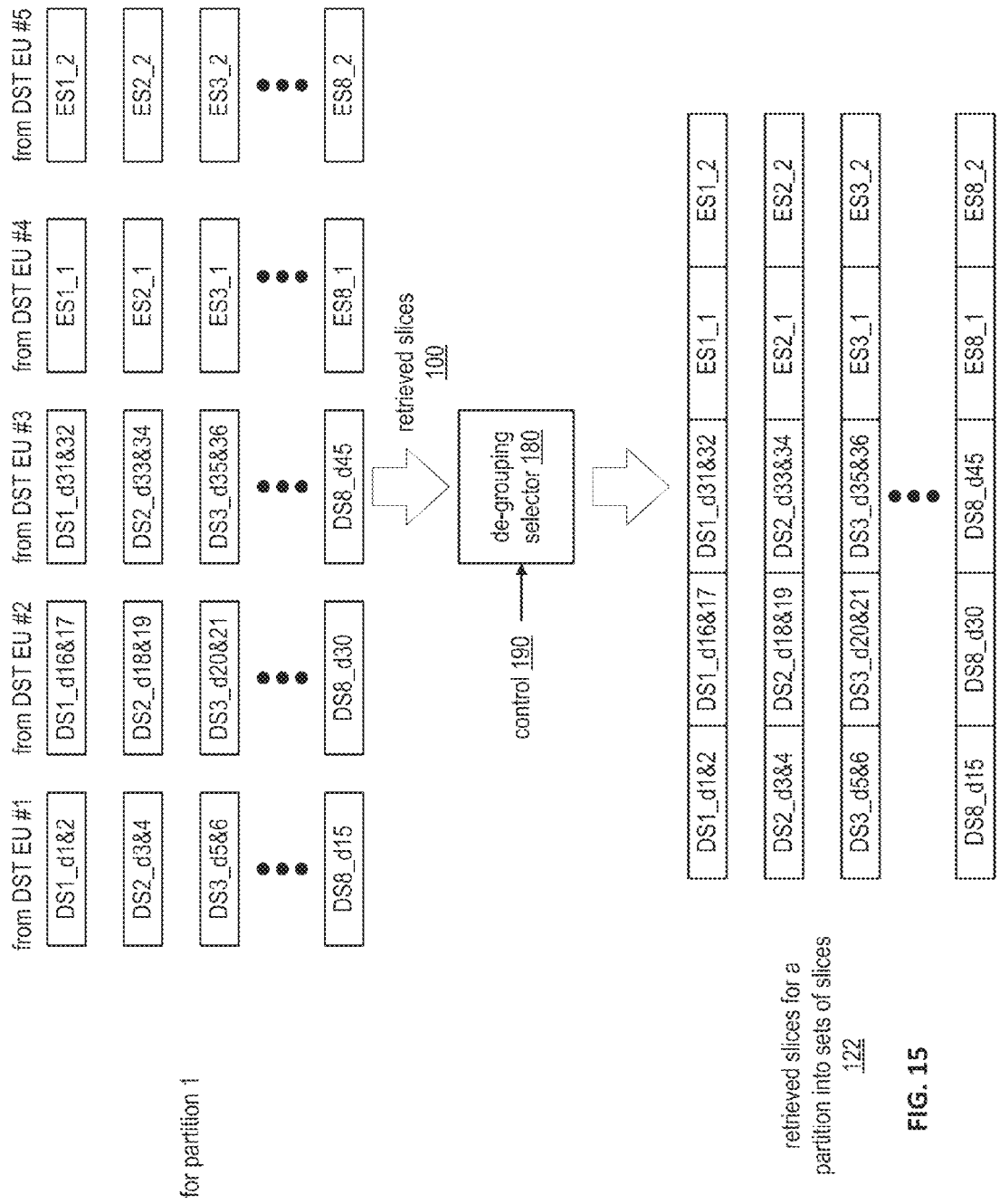
FIG. 15 is a diagram of an example of de-grouping selection processing of the inbound DST processing in accordance with the present disclosure.

FIG. 15 is a diagram of an example of de-grouping selection processing of an inbound distributed storage and task (DST) processing section of a DST client module. In general, this is an inverse process of the grouping module of the outbound DST processing section of FIG. 9. Accordingly, for each data partition (e.g., partition #1), the de-grouping module retrieves the corresponding slice grouping from the DST execution units (EU) (e.g., DST 1-5).

As shown, DST execution unit #1 provides a first slice grouping, which includes the first encoded slices of each of the sets of encoded slices (e.g., encoded data slices of contiguous data of data blocks 1-15); DST execution unit #2 provides a second slice grouping, which includes the second encoded slices of each of the sets of encoded slices (e.g., encoded data slices of contiguous data of data blocks 16-30); DST execution unit #3 provides a third slice grouping, which includes the third encoded slices of each of the sets of encoded slices (e.g., encoded data slices of contiguous data of data blocks 31-45); DST execution unit #4 provides a fourth slice grouping, which includes the fourth encoded slices of each of the sets of encoded slices (e.g., first encoded data slices of error coding (EC) data); and DST execution unit #5 provides a fifth slice grouping, which includes the fifth encoded slices of each of the sets of encoded slices (e.g., first encoded data slices of error coding (EC) data).

The de-grouping module de-groups the slice groupings (e.g., received slices 100) using a de-grouping selector 180 controlled by a control signal 190 as shown in the example to produce a plurality of sets of encoded data slices (e.g., retrieved slices for a partition into sets of slices 122). Each set corresponding to a data segment of the data partition.

Figure 16:
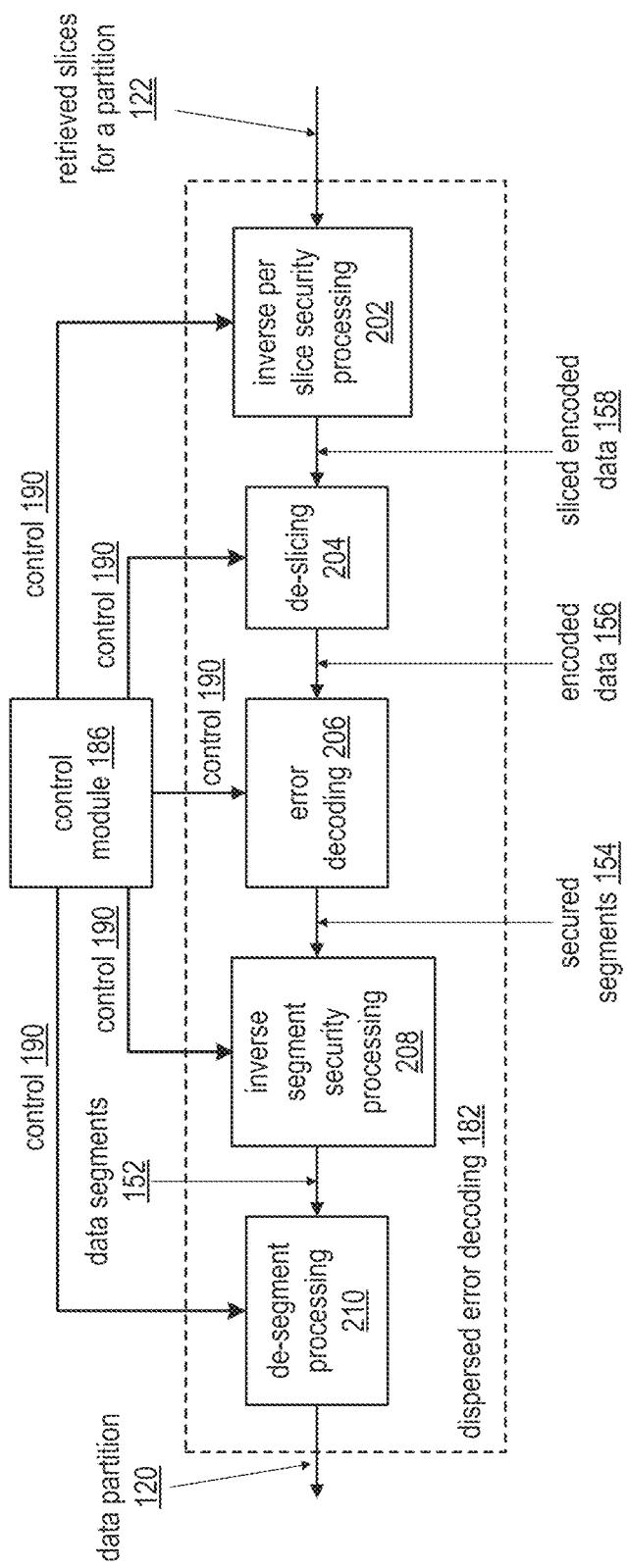
FIG. 16 is a schematic block diagram of an embodiment of a dispersed error decoding in accordance with the present disclosure.

FIG. 16 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, a de-segmenting processing module 210, and a control module 186.

In an example of operation, the inverse per slice security processing module 202, when enabled by the control module 186, unsecures each encoded data slice 122 based on slice de-security information received as control information 190 (e.g., the compliment of the slice security information discussed with reference to FIG. 6) received from the control module 186.

The slice security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 122, it decrypts each verified encoded data slice, and decompresses each decrypted encoded data slice to produce slice encoded data 158. When the inverse per slice security processing module 202 is not enabled, it passes the encoded data slices 122 as the sliced encoded data 158 or is bypassed such that the retrieved encoded data slices 122 are provided as the sliced encoded data 158.

The de-slicing module 204 de-slices the sliced encoded data 158 into encoded data segments 156 in accordance with a pillar width of the error correction encoding parameters received as control information 190 from the control module 186. For example, if the pillar width is five, the de-slicing module 204 de-slices a set of five encoded data slices into an encoded data segment 156. The error decoding module 206 decodes the encoded data segments 156 in accordance with error correction decoding parameters received as control information 190 from the control module 186 to produce secure data segments 154. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments 154 based on segment security information received as control information 190 from the control module 186. The segment security information includes data decompression, decryption, de-watermarking, integrity check (e.g., CRC, etc.) verification, and/or any other type of digital security. For example, when the inverse segment security processing module 208 is enabled, it verifies integrity information (e.g., a CRC value) of each secure data segment 154, it decrypts each verified secured data segment, and decompresses each decrypted secure data segment to produce a data segment 152. When the inverse segment security processing module 208 is not enabled, it passes the decoded data segment 154 as the data segment 152 or is bypassed.

The de-segment processing module 210 receives the data segments 152 and receives de-segmenting information as control information 190 from the control module 186. The de-segmenting information indicates how the de-segment processing module 210 is to de-segment the data segments 152 into a data partition 120. For example, the de-segmenting information indicates how the rows and columns of data segments are to be rearranged to yield the data partition 120.

Figure 17:
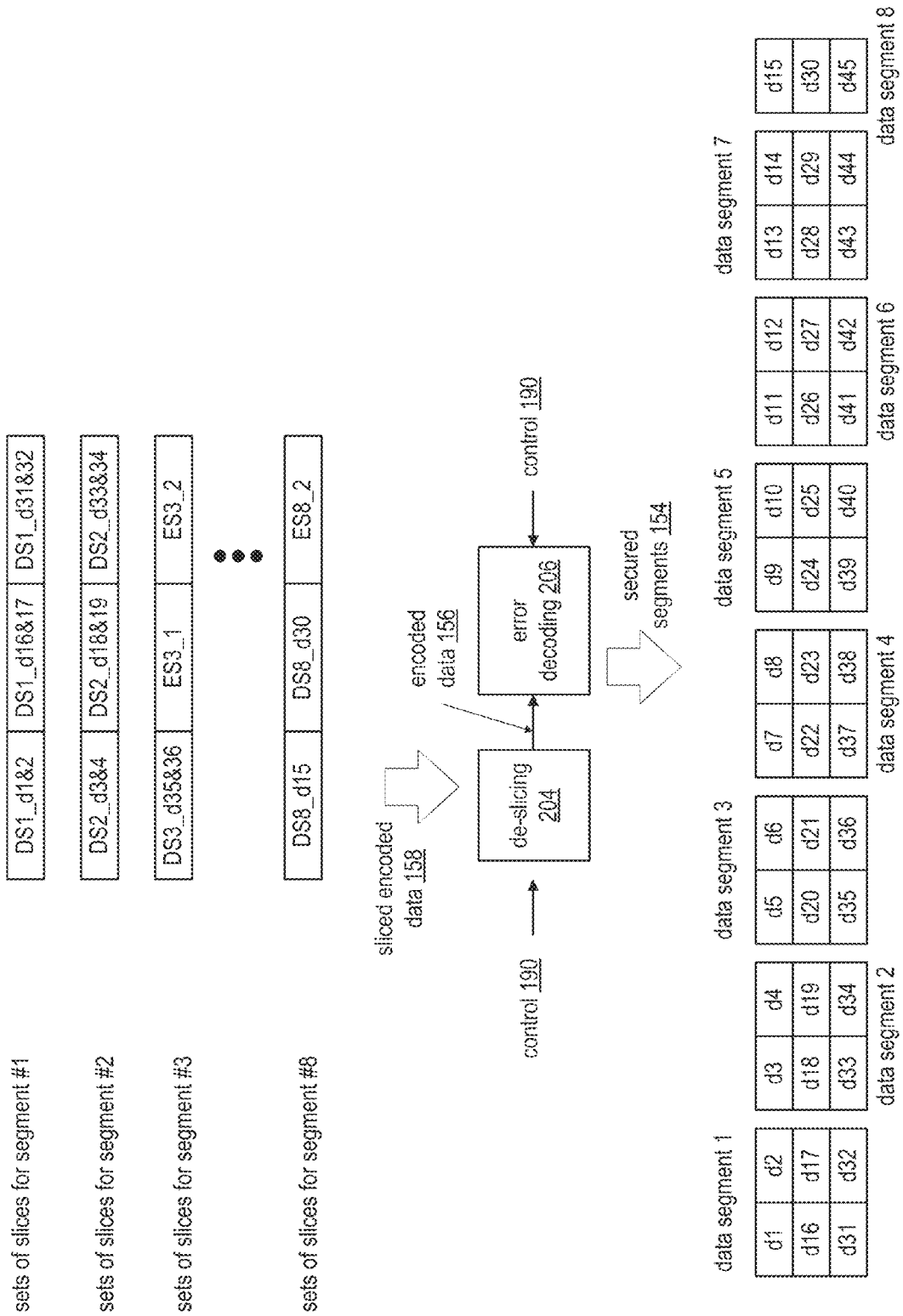
FIG. 17 is a diagram of an example of de-slicing and error decoding processing of the dispersed error decoding in accordance with the present disclosure.

FIG. 17 is a diagram of an example of de-slicing and error decoding processing of a dispersed error decoding module. A de-slicing module 204 receives at least a decode threshold number of encoded data slices 158 for each data segment in accordance with control information 190 and provides encoded data 156. In this example, a decode threshold is three. As such, each set of encoded data slices 158 is shown to have three encoded data slices per data segment. The de-slicing module 204 may receive three encoded data slices per data segment because an associated distributed storage and task (DST) client module requested retrieving only three encoded data slices per segment or selected three of the retrieved encoded data slices per data segment. As shown, which is based on the unity matrix encoding previously discussed with reference to FIG. 8, an encoded data slice may be a data-based encoded data slice (e.g., DS1_d1&d2) or an error code based encoded data slice (e.g., ES3_1).

An error decoding module 206 decodes the encoded data 156 of each data segment in accordance with the error correction decoding parameters of control information 190 to produce secured segments 154. In this example, data segment 1 includes 3 rows with each row being treated as one word for encoding. As such, data segment 1 includes three words: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

Figure 18:
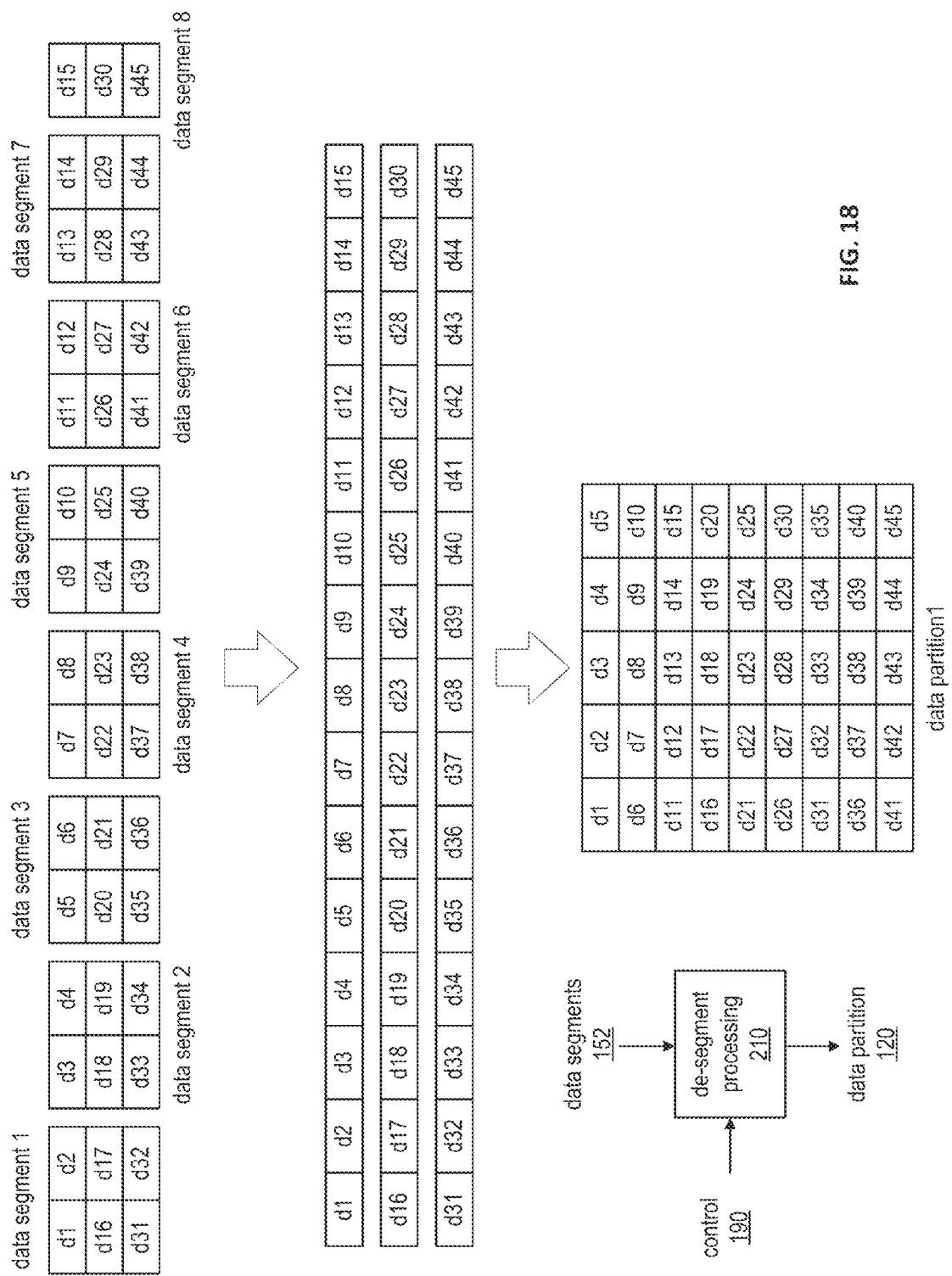
FIG. 18 is a diagram of an example of a de-segment processing of the dispersed error decoding in accordance with the present disclosure.

FIG. 18 is a diagram of an example of de-segment processing of an inbound distributed storage and task (DST) processing. In this example, a de-segment processing module 210 receives data segments 152 (e.g., 1-8) and rearranges the data blocks of the data segments into rows and columns in accordance with de-segmenting information of control information 190 to produce a data partition 120. Note that the number of rows is based on the decode threshold (e.g., 3 in this specific example) and the number of columns is based on the number and size of the data blocks.

The de-segmenting module 210 converts the rows and columns of data blocks into the data partition 120. Note that each data block may be of the same size as other data blocks or of a different size. In addition, the size of each data block may be a few bytes to megabytes of data.

Figure 19:
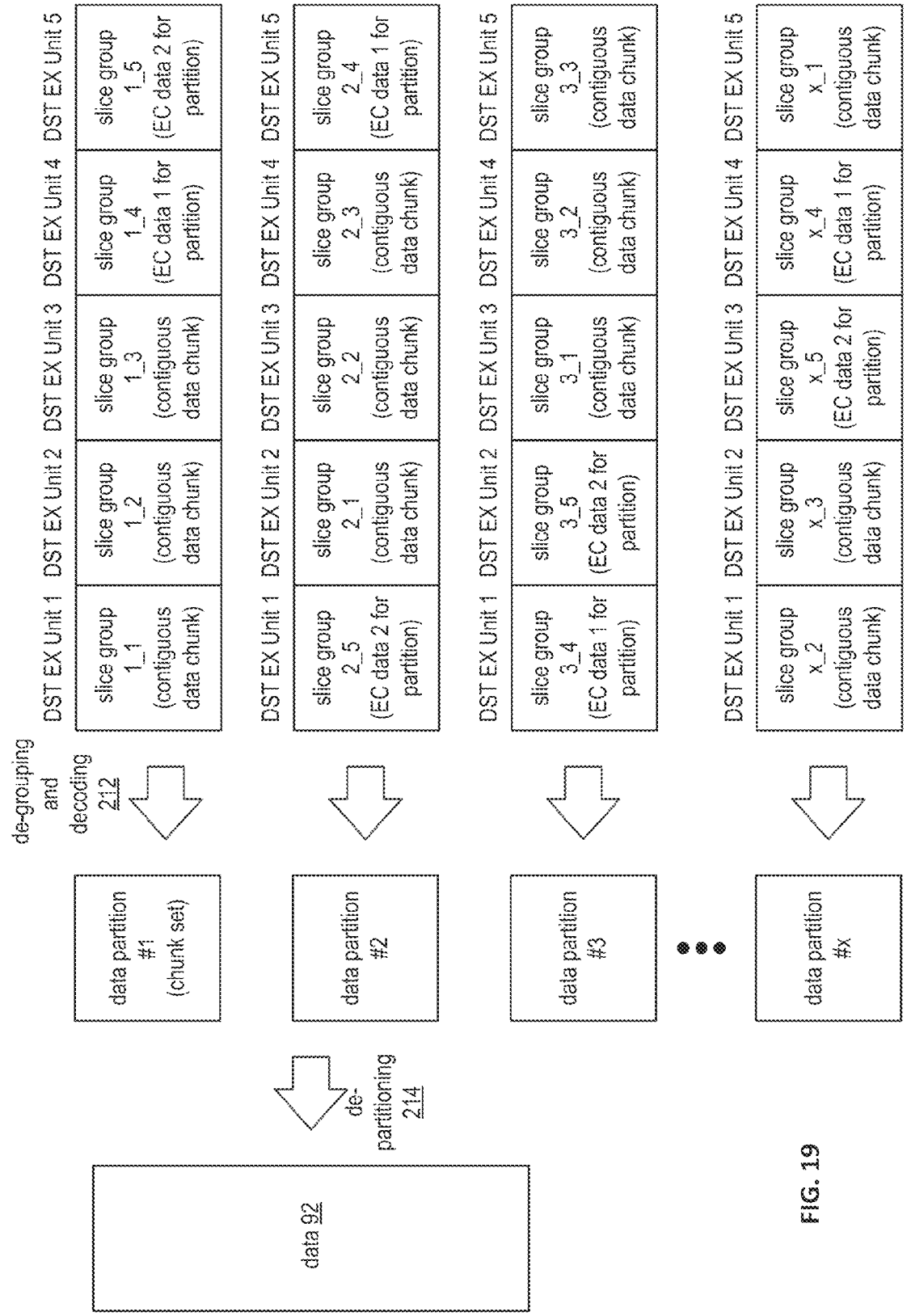
FIG. 19 is a diagram of an example of converting slice groups into data in accordance with the present disclosure.

FIG. 19 is a diagram of an example of converting slice groups into data 92 within an inbound distributed storage and task (DST) processing section. As shown, the data 92 is reconstructed from a plurality of data partitions (1-*x*, where x is an integer greater than 4). Each data partition (or chunk set of data) is decoded and re-grouped using a de-grouping and decoding function 212 and a de-partition function 214 from slice groupings as previously discussed. For a given data partition, the slice groupings (e.g., at least a decode threshold per data segment of encoded data slices) are received from DST execution units. From data partition to data partition, the ordering of the slice groupings received from the DST execution units may vary as discussed with reference to FIG. 10.

Figure 20:
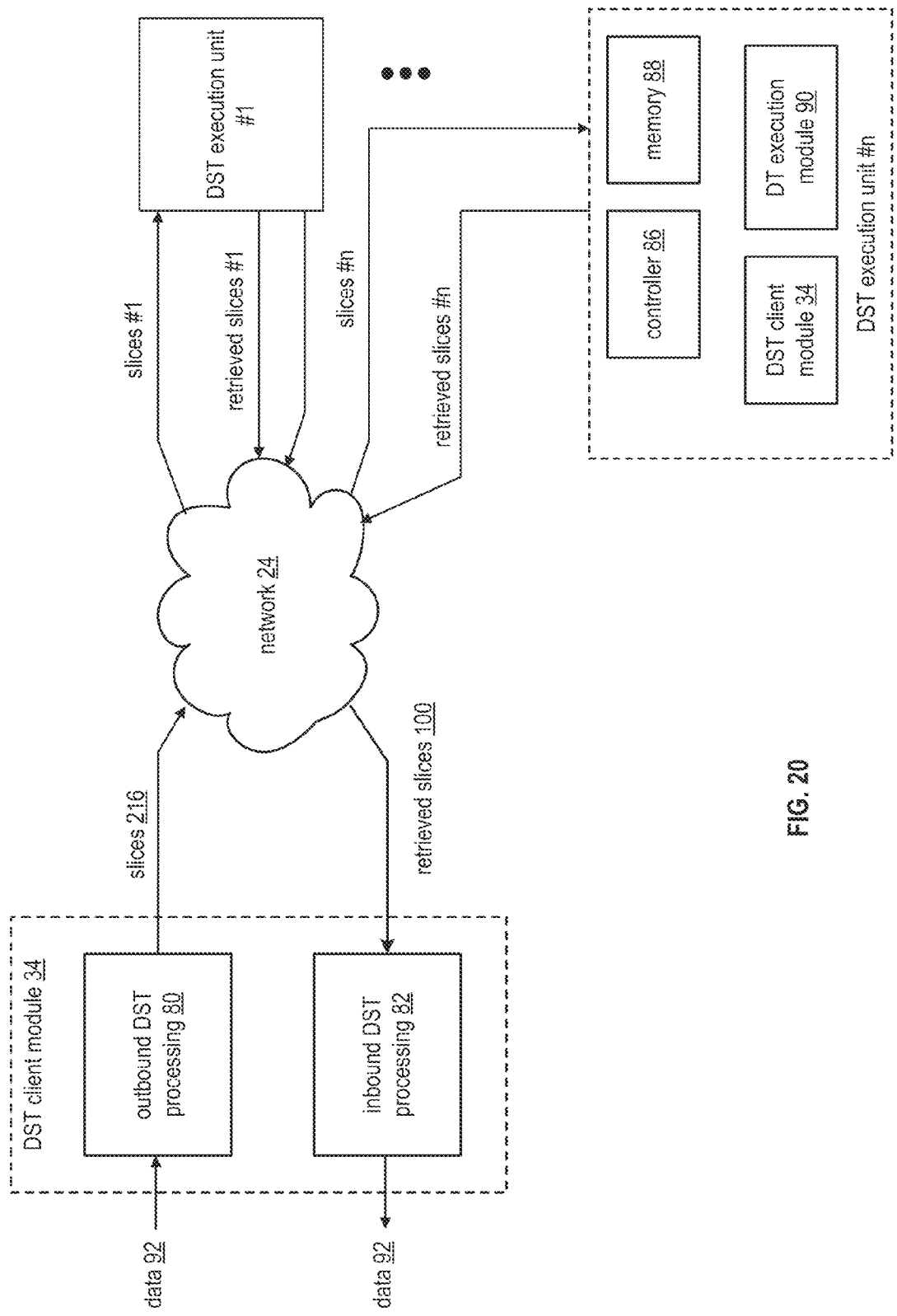
FIG. 20 is a diagram of an example of a distributed storage within the distributed computing system in accordance with the present disclosure.

FIG. 20 is a diagram of an example of a distributed storage and/or retrieval within the distributed computing system. The distributed computing system includes a plurality of distributed storage and/or task (DST) processing client modules 34 (one shown) coupled to a distributed storage and/or task processing network (DSTN) module, or multiple DSTN modules, via a network 24. The DST client module 34 includes an outbound DST processing section 80 and an inbound DST processing section 82. The DSTN module includes a plurality of DST execution units. Each DST execution unit includes a controller 86, memory 88, one or more distributed task (DT) execution modules 90, and a DST client module 34.

In an example of data storage, the DST client module 34 has data 92 that it desires to store in the DSTN module. The data 92 may be a file (e.g., video, audio, text, graphics, etc.), a data object, a data block, an update to a file, an update to a data block, etc. In this instance, the outbound DST processing module 80 converts the data 92 into encoded data slices 216 as will be further described with reference to FIGS. 21-23. The outbound DST processing module 80 sends, via the network 24, to the DST execution units for storage as further described with reference to FIG. 24.

In an example of data retrieval, the DST client module 34 issues a retrieve request to the DST execution units for the desired data 92. The retrieve request may address each DST executions units storing encoded data slices of the desired data, address a decode threshold number of DST execution units, address a read threshold number of DST execution units, or address some other number of DST execution units. In response to the request, each addressed DST execution unit retrieves its encoded data slices 100 of the desired data and sends them to the inbound DST processing section 82, via the network 24.

When, for each data segment, the inbound DST processing section 82 receives at least a decode threshold number of encoded data slices 100, it converts the encoded data slices 100 into a data segment. The inbound DST processing section 82 aggregates the data segments to produce the retrieved data 92.

Figure 21:
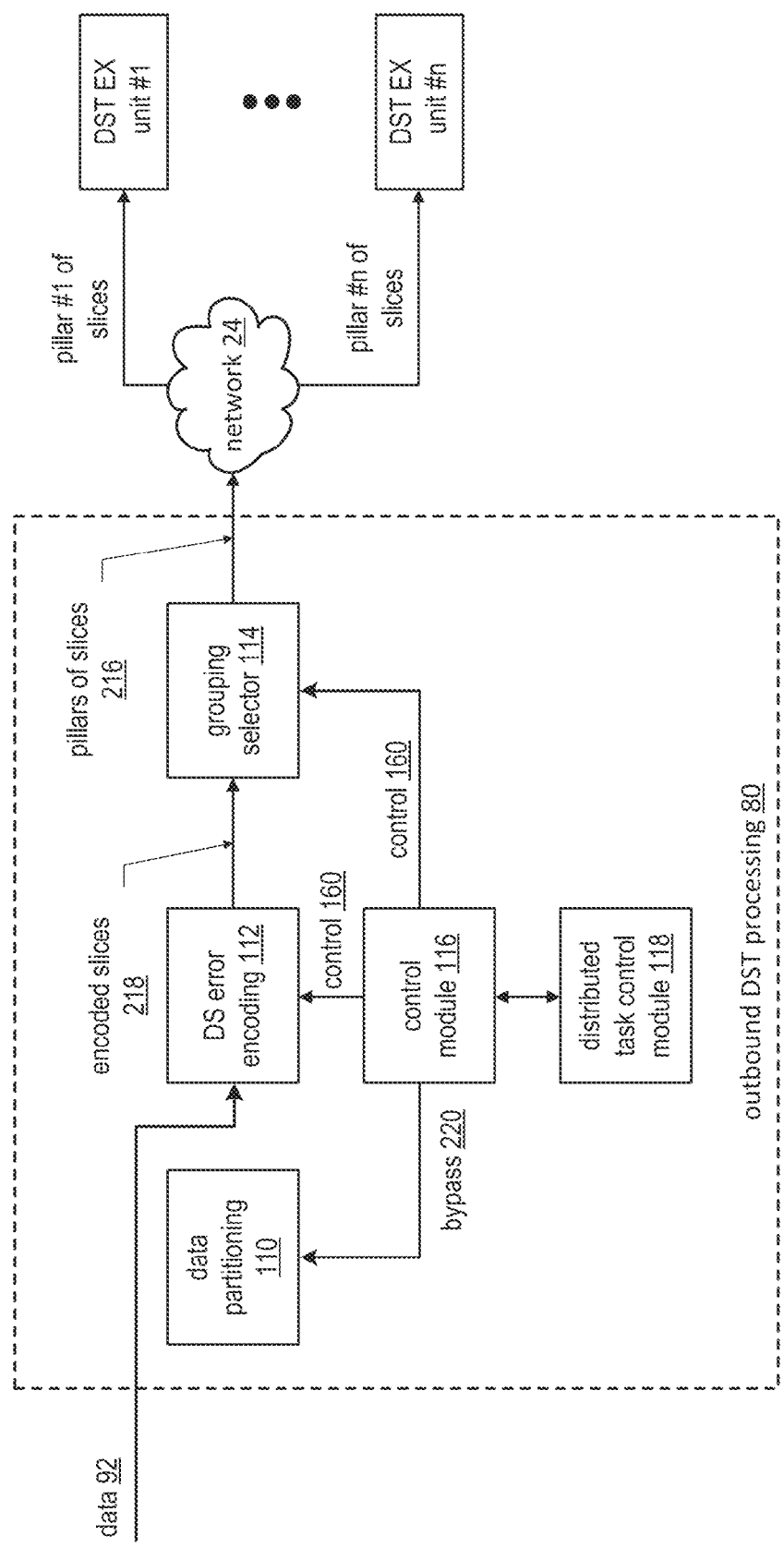
FIG. 21 is a schematic block diagram of an example of operation of outbound distributed storage and/or task (DST) processing for storing data in accordance with the present disclosure.

FIG. 21 is a schematic block diagram of an embodiment of an outbound distributed storage and/or task (DST) processing section 80 of a DST client module coupled to a distributed storage and task network (DSTN) module (e.g., a plurality of DST execution units) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 is by-passed such that data 92 is provided directly to the DS error encoding module 112. The control module 116 coordinates the by-passing of the data partitioning module 110 by outputting a bypass 220 message to the data partitioning module 110.

The DS error encoding module 112 receives the data 92 in a serial manner, a parallel manner, and/or a combination thereof. The DS error encoding module 112 DS error encodes the data in accordance with control information 160 from the control module 116 to produce encoded data slices 218. The DS error encoding includes segmenting the data 92 into data segments, segment security processing (e.g., encryption, compression, watermarking, integrity check (e.g., CRC, etc.)), error encoding, slicing, and/or per slice security processing (e.g., encryption, compression, watermarking, integrity check (e.g., CRC, etc.)). The control information 160 indicates which steps of the DS error encoding are active for the data 92 and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 218 of the data segments into pillars of slices 216. The number of pillars corresponds to the pillar width of the DS error encoding parameters. In this example, the distributed task control module 118 facilitates the storage request.

Figure 22:
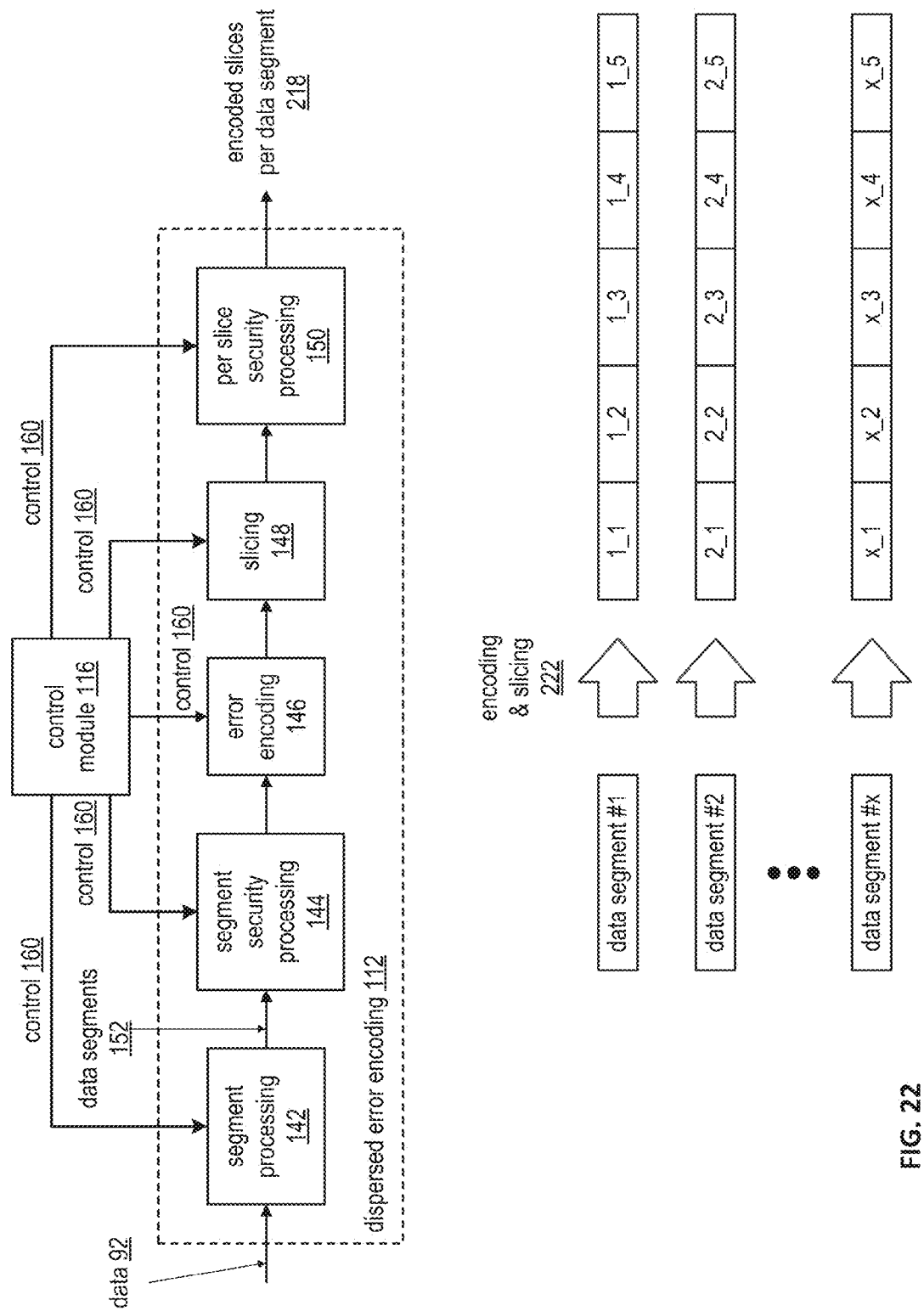
FIG. 22 is a schematic block diagram of an example of a dispersed error encoding for the example of FIG. 21 in accordance with the present disclosure.

FIG. 22 is a schematic block diagram of an example of a dispersed storage (DS) error encoding module 112 for the example of FIG. 21. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives data 92 and receives segmenting information as control information 160 from the control module 116. The segmenting information indicates how the segment processing module is to segment the data. For example, the segmenting information indicates the size of each data segment. The segment processing module 142 segments the data 92 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., CRC, etc.), and/or any other type of digital security. For example, when the segment security processing module 144 is enabled, it compresses a data segment 152, encrypts the compressed data segment, and generates a CRC value for the encrypted data segment to produce a secure data segment. When the segment security processing module 144 is not enabled, it passes the data segments 152 to the error encoding module 146 or is bypassed such that the data segments 152 are provided to the error encoding module 146.

The error encoding module 146 encodes the secure data segments in accordance with error correction encoding parameters received as control information 160 from the control module 116. The error correction encoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment to produce an encoded data segment.

The slicing module 148 slices the encoded data segment in accordance with a pillar width of the error correction encoding parameters. For example, if the pillar width is five, the slicing module slices an encoded data segment into a set of five encoded data slices. As such, for a plurality of data segments, the slicing module 148 outputs a plurality of sets of encoded data slices as shown within encoding and slicing function 222 as described.

The per slice security processing module 150, when enabled by the control module 116, secures each encoded data slice based on slice security information received as control information 160 from the control module 116. The slice security information includes data compression, encryption, watermarking, integrity check (e.g., CRC, etc.), and/or any other type of digital security. For example, when the per slice security processing module 150 is enabled, it may compress an encoded data slice, encrypt the compressed encoded data slice, and generate a CRC value for the encrypted encoded data slice to produce a secure encoded data slice tweaking. When the per slice security processing module 150 is not enabled, it passes the encoded data slices or is bypassed such that the encoded data slices 218 are the output of the DS error encoding module 112.

Figure 23:
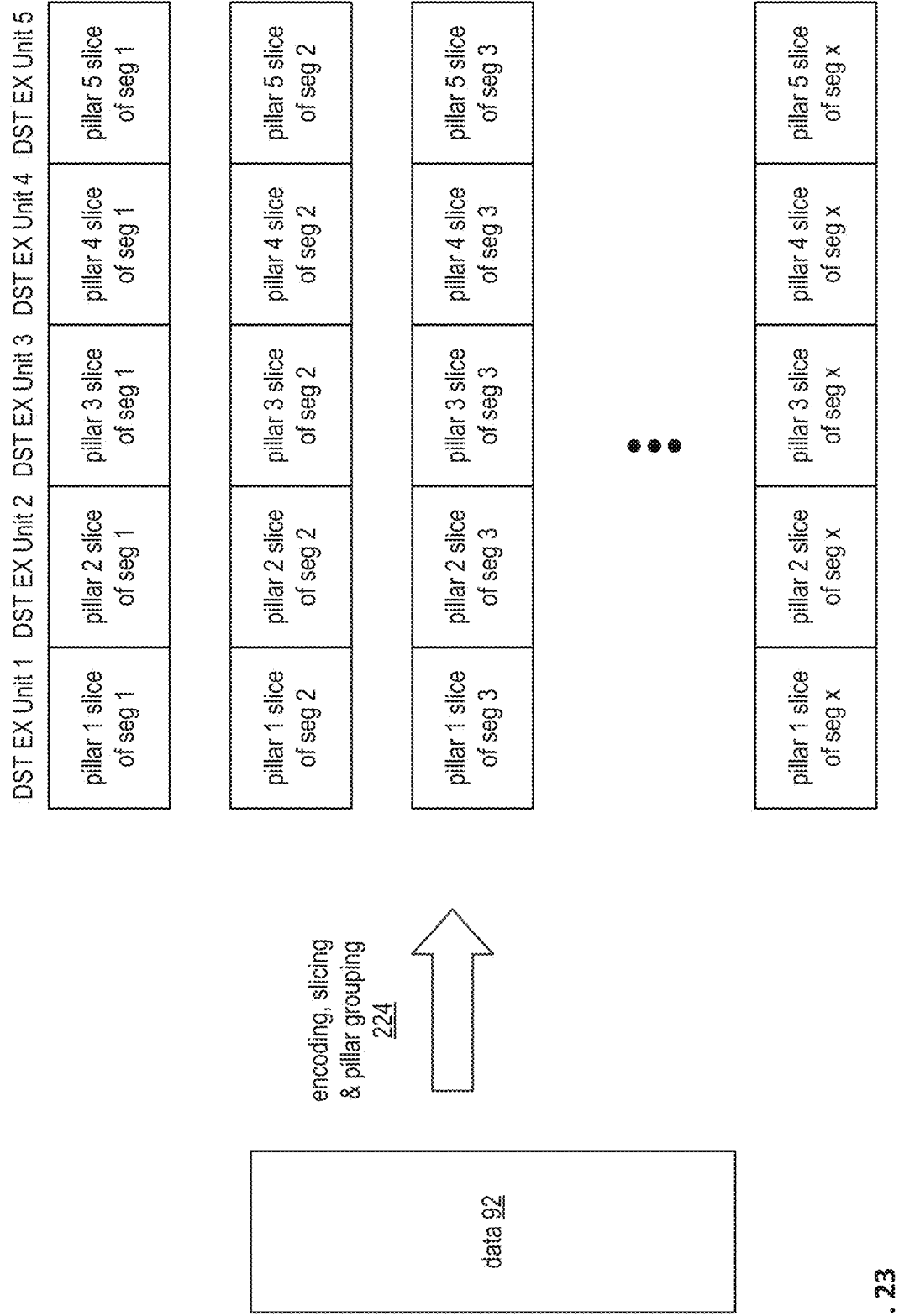
FIG. 23 is a diagram of an example of converting data into pillar slice groups for storage in accordance with the present disclosure.

FIG. 23 is a diagram of an example of converting data 92 into pillar slice groups utilizing encoding, slicing and pillar grouping function 224 for storage in memory of a distributed storage and task network (DSTN) module. As previously discussed the data 92 is encoded and sliced into a plurality of sets of encoded data slices; one set per data segment. The grouping selector module organizes the sets of encoded data slices into pillars of data slices. In this example, the DS error encoding parameters include a pillar width of 5 and a decode threshold of 3. As such, for each data segment, 5 encoded data slices are created.

The grouping selector module takes the first encoded data slice of each of the sets and forms a first pillar, which may be sent to the first DST execution unit. Similarly, the grouping selector module creates the second pillar from the second slices of the sets; the third pillar from the third slices of the sets; the fourth pillar from the fourth slices of the sets; and the fifth pillar from the fifth slices of the set.

FIG. 24 is a schematic block diagram of an embodiment of a distributed storage and/or task (DST) execution unit that includes an interface 169, a controller 86, memory 88, one or more distributed task (DT) execution modules 90, and a DST client module 34. A computing core 26 may be utilized to implement the one or more DT execution modules 90 and the DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a pillar of slices 216, the DST execution unit receives, via interface 169, a pillar of slices 216 (e.g., pillar #1 slices). The memory 88 stores the encoded data slices 216 of the pillar of slices in accordance with memory control information 174 it receives from the controller 86. The controller 86 (e.g., a processing module, a CPU, etc.) generates the memory control information 174 based on distributed storage information (e.g., user information (e.g., user ID, distributed storage permissions, data access permission, etc.), vault information (e.g., virtual memory assigned to user, user group, etc.), etc.). Similarly, when retrieving slices, the DST execution unit receives, via interface 169, a slice retrieval request. The memory 88 retrieves the slice in accordance with memory control information 174 it receives from the controller 86. The memory 88 outputs the slice 100, via the interface 169, to a requesting entity.

Figure 25:
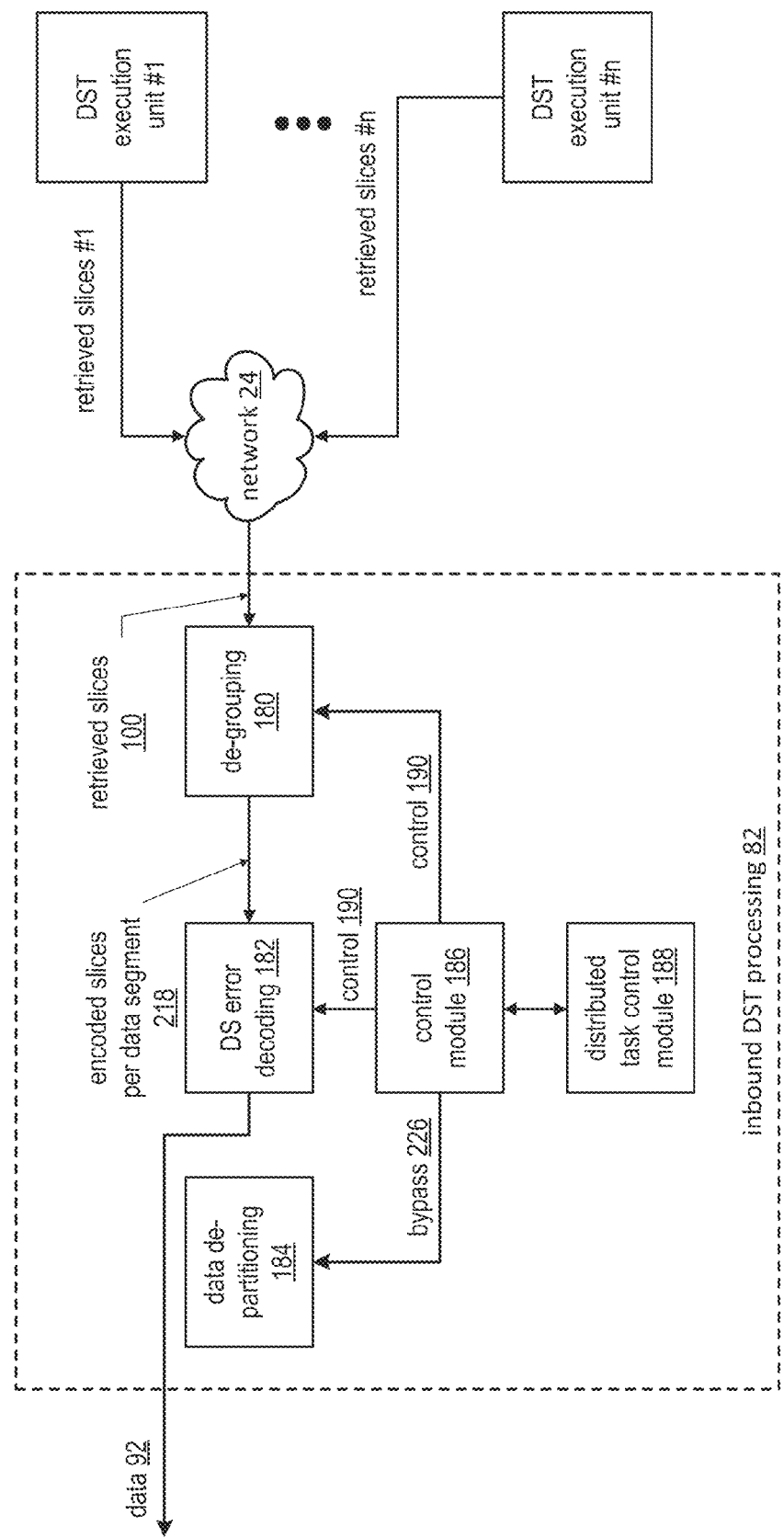
FIG. 25 is a schematic block diagram of an example of operation of inbound distributed storage and/or task (DST) processing for retrieving dispersed error encoded data in accordance with the present disclosure.

FIG. 25 is a schematic block diagram of an example of operation of an inbound distributed storage and/or task (DST) processing section 82 for retrieving dispersed error encoded data 92. The inbound DST processing section 82 includes a de-grouping module 180, a dispersed storage (DS) error decoding module 182, a data de-partitioning module 184, a control module 186, and a distributed task control module 188. Note that the control module 186 and/or the distributed task control module 188 may be separate modules from corresponding ones of an outbound DST processing section or may be the same modules.

In an example of operation, the inbound DST processing section 82 is retrieving stored data 92 from the DST execution units (i.e., the DSTN module). In this example, the DST execution units output encoded data slices corresponding to data retrieval requests from the distributed task control module 188. The de-grouping module 180 receives pillars of slices 100 and de-groups them in accordance with control information 190 from the control module 186 to produce sets of encoded data slices 218. The DS error decoding module 182 decodes, in accordance with the DS error encoding parameters received as control information 190 from the control module 186, each set of encoded data slices 218 to produce data segments, which are aggregated into retrieved data 92. The data de-partitioning module 184 is by-passed in this operational mode via a bypass signal 226 of control information 190 from the control module 186.

Figure 26:
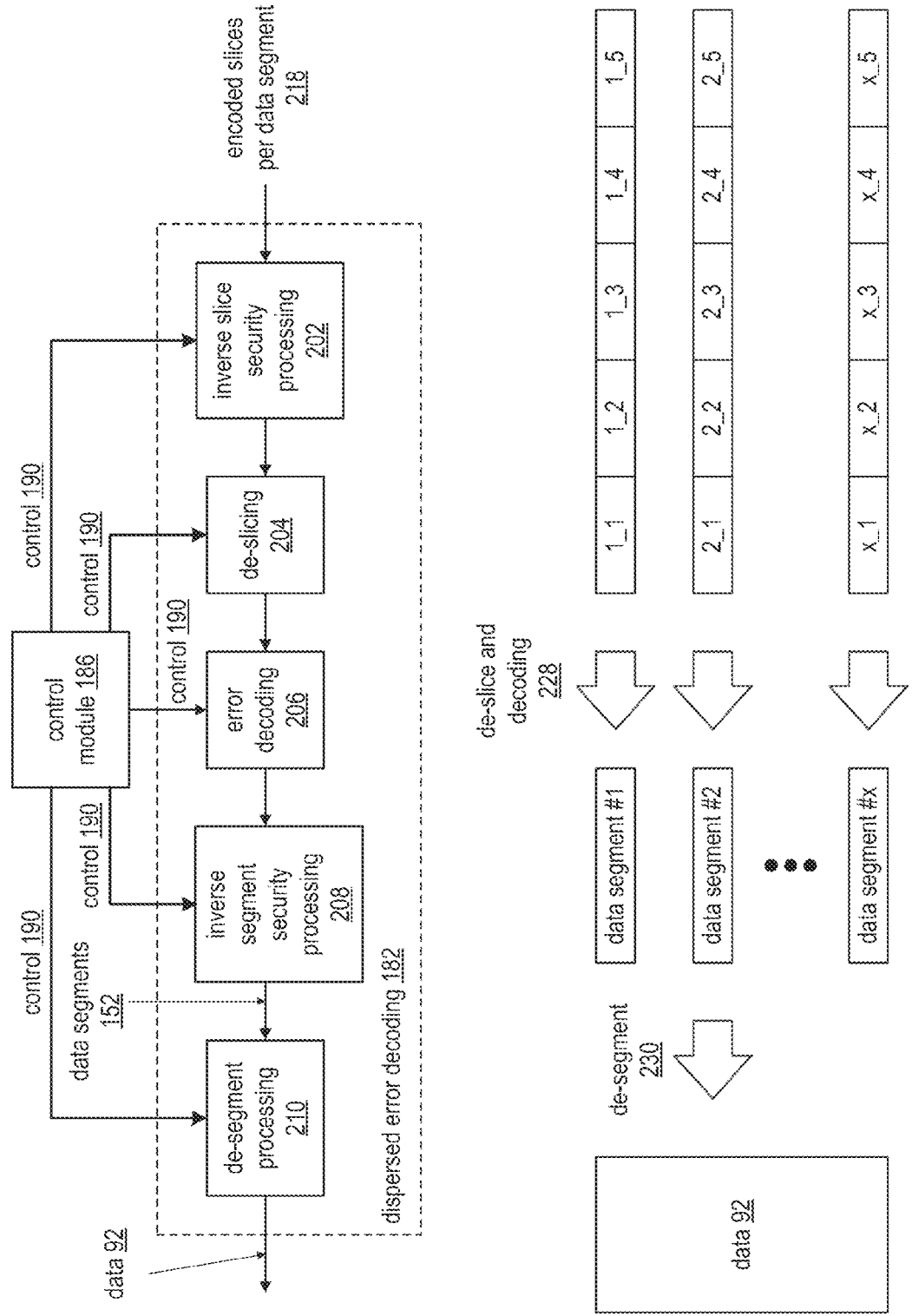
FIG. 26 is a schematic block diagram of an example of a dispersed error decoding for the example of FIG. 25 in accordance with the present disclosure.

FIG. 26 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, and a de-segmenting processing module 210. The dispersed error decoding module 182 is operable to de-slice and decode encoded slices per data segment 218 utilizing a de-slicing and decoding function 228 to produce a plurality of data segments that are de-segmented utilizing a de-segment function 230 to recover data 92.

In an example of operation, the inverse per slice security processing module 202, when enabled by the control module 186 via control information 190, unsecures each encoded data slice 218 based on slice de-security information (e.g., the compliment of the slice security information discussed with reference to FIG. 6) received as control information 190 from the control module 186. The slice de-security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 218, it decrypts each verified encoded data slice, and decompresses each decrypted encoded data slice to produce slice encoded data. When the inverse per slice security processing module 202 is not enabled, it passes the encoded data slices 218 as the sliced encoded data or is bypassed such that the retrieved encoded data slices 218 are provided as the sliced encoded data.

The de-slicing module 204 de-slices the sliced encoded data into encoded data segments in accordance with a pillar width of the error correction encoding parameters received as control information 190 from a control module 186. For example, if the pillar width is five, the de-slicing module de-slices a set of five encoded data slices into an encoded data segment. Alternatively, the encoded data segment may include just three encoded data slices (e.g., when the decode threshold is 3).

The error decoding module 206 decodes the encoded data segments in accordance with error correction decoding parameters received as control information 190 from the control module 186 to produce secure data segments. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments based on segment security information received as control information 190 from the control module 186. The segment security information includes data decompression, decryption, de-watermarking, integrity check (e.g., CRC, etc.) verification, and/or any other type of digital security. For example, when the inverse segment security processing module is enabled, it verifies integrity information (e.g., a CRC value) of each secure data segment, it decrypts each verified secured data segment, and decompresses each decrypted secure data segment to produce a data segment 152. When the inverse segment security processing module 208 is not enabled, it passes the decoded data segment 152 as the data segment or is bypassed. The de-segmenting processing module 210 aggregates the data segments 152 into the data 92 in accordance with control information 190 from the control module 186.

Figure 27:
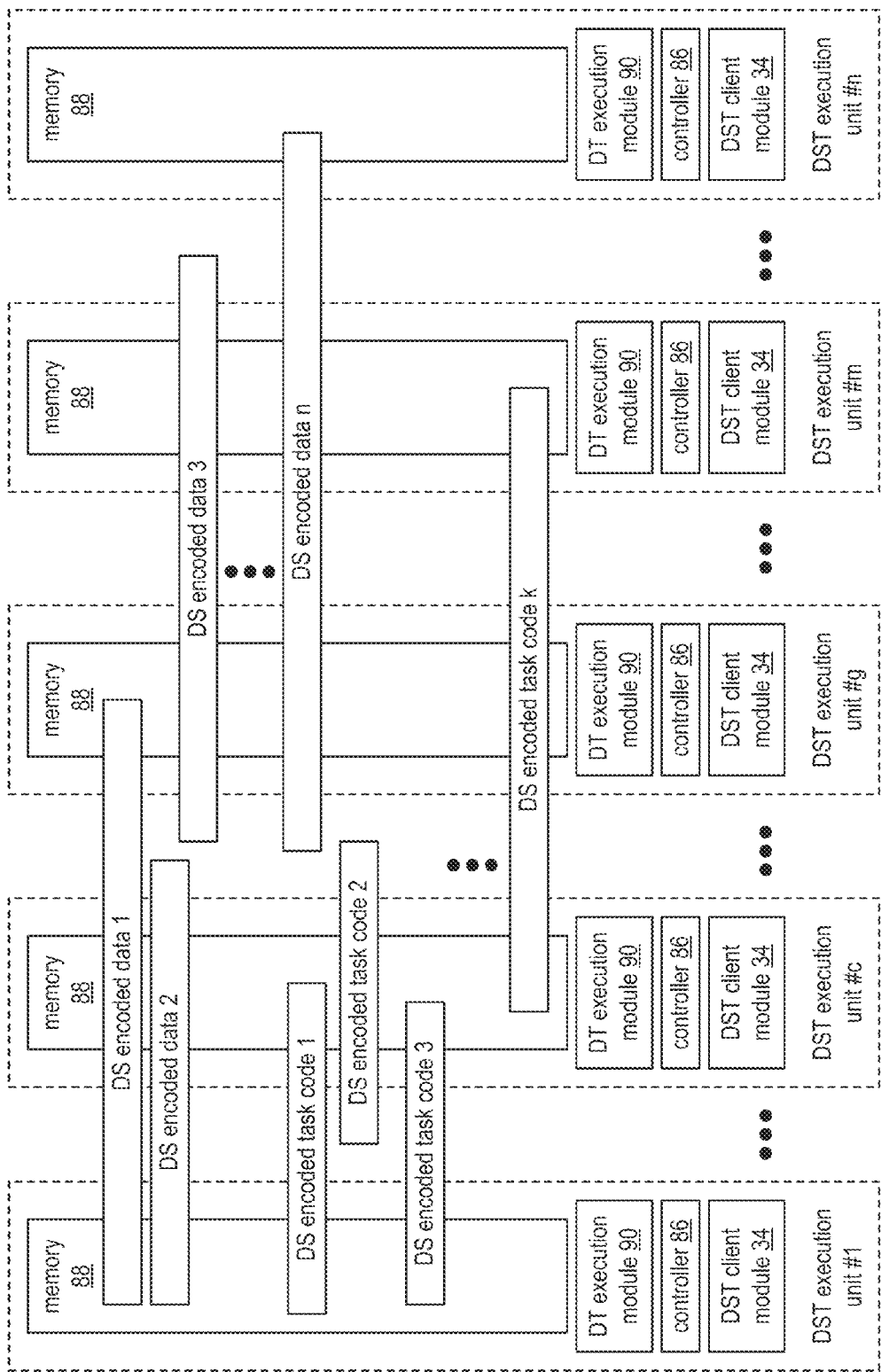
FIG. 27 is a schematic block diagram of an example of a distributed storage and task processing network (DSTN) module storing a plurality of data and a plurality of task codes in accordance with the present disclosure.

FIG. 27 is a schematic block diagram of an example of a distributed storage and task processing network (DSTN) module that includes a plurality of distributed storage and task (DST) execution units (#1 through #n, where, for example, n is an integer greater than or equal to three). Each of the DST execution units includes a DST client module 34, a controller 86, one or more DT (distributed task) execution modules 90, and memory 88.

In this example, the DSTN module stores, in the memory of the DST execution units, a plurality of DS (dispersed storage) encoded data (e.g., 1 through n, where n is an integer greater than or equal to two) and stores a plurality of DS encoded task codes (e.g., 1 through k, where k is an integer greater than or equal to two). The DS encoded data may be encoded in accordance with one or more examples described with reference to FIGS. 3-19 (e.g., organized in slice groupings) or encoded in accordance with one or more examples described with reference to FIGS. 20-26 (e.g., organized in pillar groups). The data that is encoded into the DS encoded data may be of any size and/or of any content. For example, the data may be one or more digital books, a copy of a company's emails, a large-scale Internet search, a video security file, one or more entertainment video files (e.g., television programs, movies, etc.), data files, and/or any other large amount of data (e.g., greater than a few Terabytes).

The tasks that are encoded into the DS encoded task code may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. The tasks may be encoded into the DS encoded task code in accordance with one or more examples described with reference to FIGS. 3-19 (e.g., organized in slice groupings) or encoded in accordance with one or more examples described with reference to FIGS. 20-26 (e.g., organized in pillar groups).

In an example of operation, a DST client module of a user device or of a DST processing unit issues a DST request to the DSTN module. The DST request may include a request to retrieve stored data, or a portion thereof, may include a request to store data that is included with the DST request, may include a request to perform one or more tasks on stored data, may include a request to perform one or more tasks on data included with the DST request, etc. In the cases where the DST request includes a request to store data or to retrieve data, the client module and/or the DSTN module processes the request as previously discussed with reference to one or more of FIGS. 3-19 (e.g., slice groupings) and/or 20-26 (e.g., pillar groupings). In the case where the DST request includes a request to perform one or more tasks on data included with the DST request, the DST client module and/or the DSTN module process the DST request as previously discussed with reference to one or more of FIGS. 3-19.

In the case where the DST request includes a request to perform one or more tasks on stored data, the DST client module and/or the DSTN module processes the DST request as will be described with reference to one or more of FIGS. 28-39. In general, the DST client module identifies data and one or more tasks for the DSTN module to execute upon the identified data. The DST request may be for a one-time execution of the task or for an on-going execution of the task. As an example of the latter, as a company generates daily emails, the DST request may be to daily search new emails for inappropriate content and, if found, record the content, the email sender(s), the email recipient(s), email routing information, notify human resources of the identified email, etc.

Figure 28:
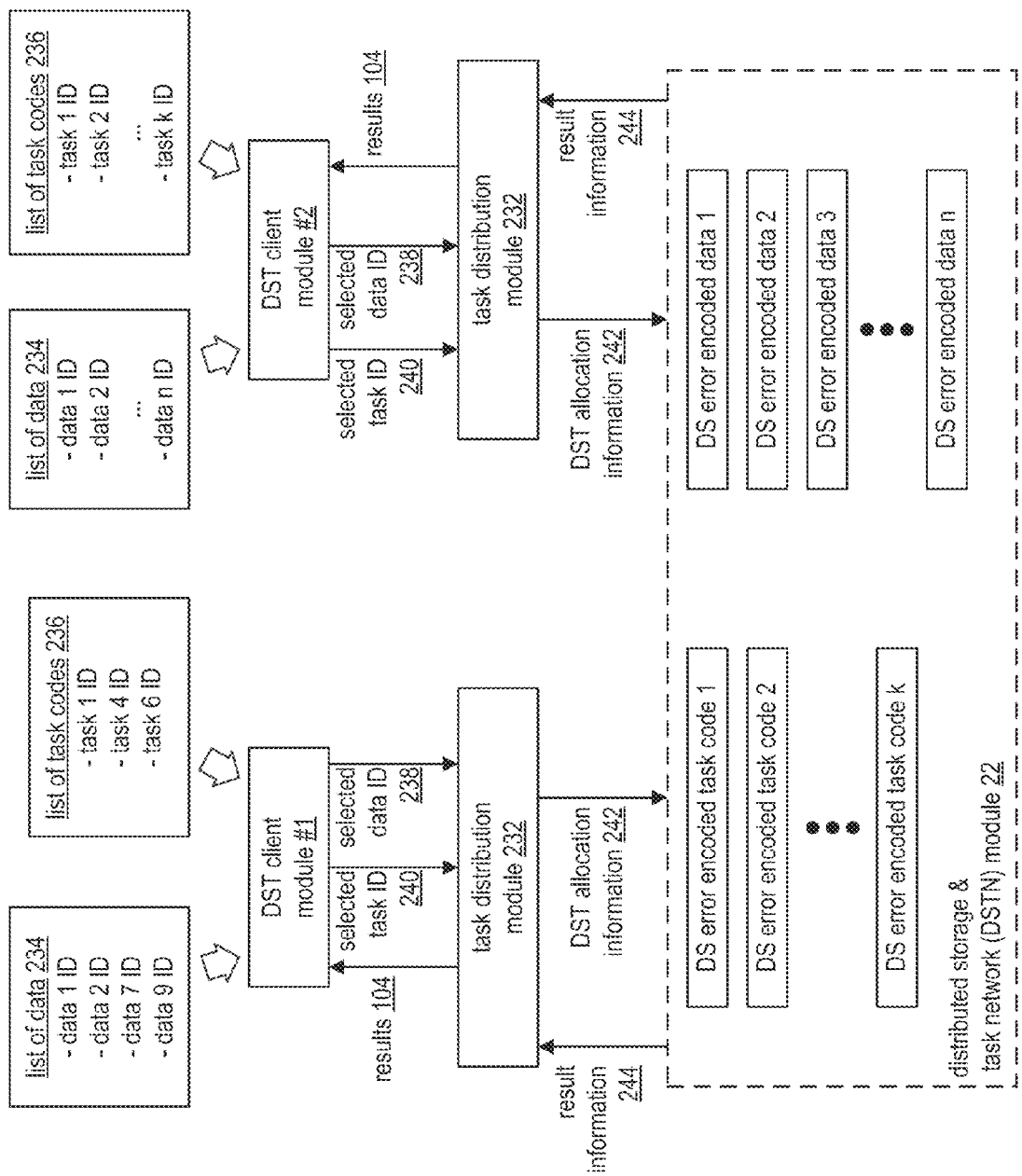
FIG. 28 is a schematic block diagram of an example of the distributed computing system performing tasks on stored data in accordance with the present disclosure.

FIG. 28 is a schematic block diagram of an example of a distributed computing system performing tasks on stored data. In this example, two distributed storage and task (DST) client modules 1-2 are shown: the first may be associated with a user device and the second may be associated with a DST processing unit or a high priority user device (e.g., high priority clearance user, system administrator, etc.). Each DST client module includes a list of stored data 234 and a list of tasks codes 236. The list of stored data 234 includes one or more entries of data identifying information, where each entry identifies data stored in the DSTN module 22. The data identifying information (e.g., data ID) includes one or more of a data file name, a data file directory listing, DSTN addressing information of the data, a data object identifier, etc. The list of tasks 236 includes one or more entries of task code identifying information, when each entry identifies task codes stored in the DSTN module 22. The task code identifying information (e.g., task ID) includes one or more of a task file name, a task file directory listing, DSTN addressing information of the task, another type of identifier to identify the task, etc.

As shown, the list of data 234 and the list of tasks 236 are each smaller in number of entries for the first DST client module than the corresponding lists of the second DST client module. This may occur because the user device associated with the first DST client module has fewer privileges in the distributed computing system than the device associated with the second DST client module. Alternatively, this may occur because the user device associated with the first DST client module serves fewer users than the device associated with the second DST client module and is restricted by the distributed computing system accordingly. As yet another alternative, this may occur through no restraints by the distributed computing system, it just occurred because the operator of the user device associated with the first DST client module has selected fewer data and/or fewer tasks than the operator of the device associated with the second DST client module.

In an example of operation, the first DST client module selects one or more data entries 238 and one or more tasks 240 from its respective lists (e.g., selected data ID and selected task ID). The first DST client module sends its selections to a task distribution module 232. The task distribution module 232 may be within a stand-alone device of the distributed computing system, may be within the user device that contains the first DST client module, or may be within the DSTN module 22.

Regardless of the task distribution module's location, it generates DST allocation information 242 from the selected task ID 240 and the selected data ID 238. The DST allocation information 242 includes data partitioning information, task execution information, and/or intermediate result information. The task distribution module 232 sends the DST allocation information 242 to the DSTN module 22. Note that one or more examples of the DST allocation information will be discussed with reference to one or more of FIGS. 29-39.

The DSTN module 22 interprets the DST allocation information 242 to identify the stored DS encoded data (e.g., DS error encoded data 2) and to identify the stored DS error encoded task code (e.g., DS error encoded task code 1). In addition, the DSTN module 22 interprets the DST allocation information 242 to determine how the data is to be partitioned and how the task is to be partitioned. The DSTN module 22 also determines whether the selected DS error encoded data 238 needs to be converted from pillar grouping to slice grouping. If so, the DSTN module 22 converts the selected DS error encoded data into slice groupings and stores the slice grouping DS error encoded data by overwriting the pillar grouping DS error encoded data or by storing it in a different location in the memory of the DSTN module 22 (i.e., does not overwrite the pillar grouping DS encoded data).

The DSTN module 22 partitions the data and the task as indicated in the DST allocation information 242 and sends the portions to selected DST execution units of the DSTN module 22. Each of the selected DST execution units performs its partial task(s) on its slice groupings to produce partial results. The DSTN module 22 collects the partial results from the selected DST execution units and provides them, as result information 244, to the task distribution module. The result information 244 may be the collected partial results, one or more final results as produced by the DSTN module 22 from processing the partial results in accordance with the DST allocation information 242, or one or more intermediate results as produced by the DSTN module 22 from processing the partial results in accordance with the DST allocation information 242.

The task distribution module 232 receives the result information 244 and provides one or more final results 104 therefrom to the first DST client module. The final result(s) 104 may be result information 244 or a result(s) of the task distribution module's processing of the result information 244.

In concurrence with processing the selected task of the first DST client module, the distributed computing system may process the selected task(s) of the second DST client module on the selected data(s) of the second DST client module. Alternatively, the distributed computing system may process the second DST client module's request subsequent to, or preceding, that of the first DST client module. Regardless of the ordering and/or parallel processing of the DST client module requests, the second DST client module provides its selected data 238 and selected task 240 to a task distribution module 232. If the task distribution module 232 is a separate device of the distributed computing system or within the DSTN module, the task distribution modules 232 coupled to the first and second DST client modules may be the same module. The task distribution module 232 processes the request of the second DST client module in a similar manner as it processed the request of the first DST client module.

Figure 29:
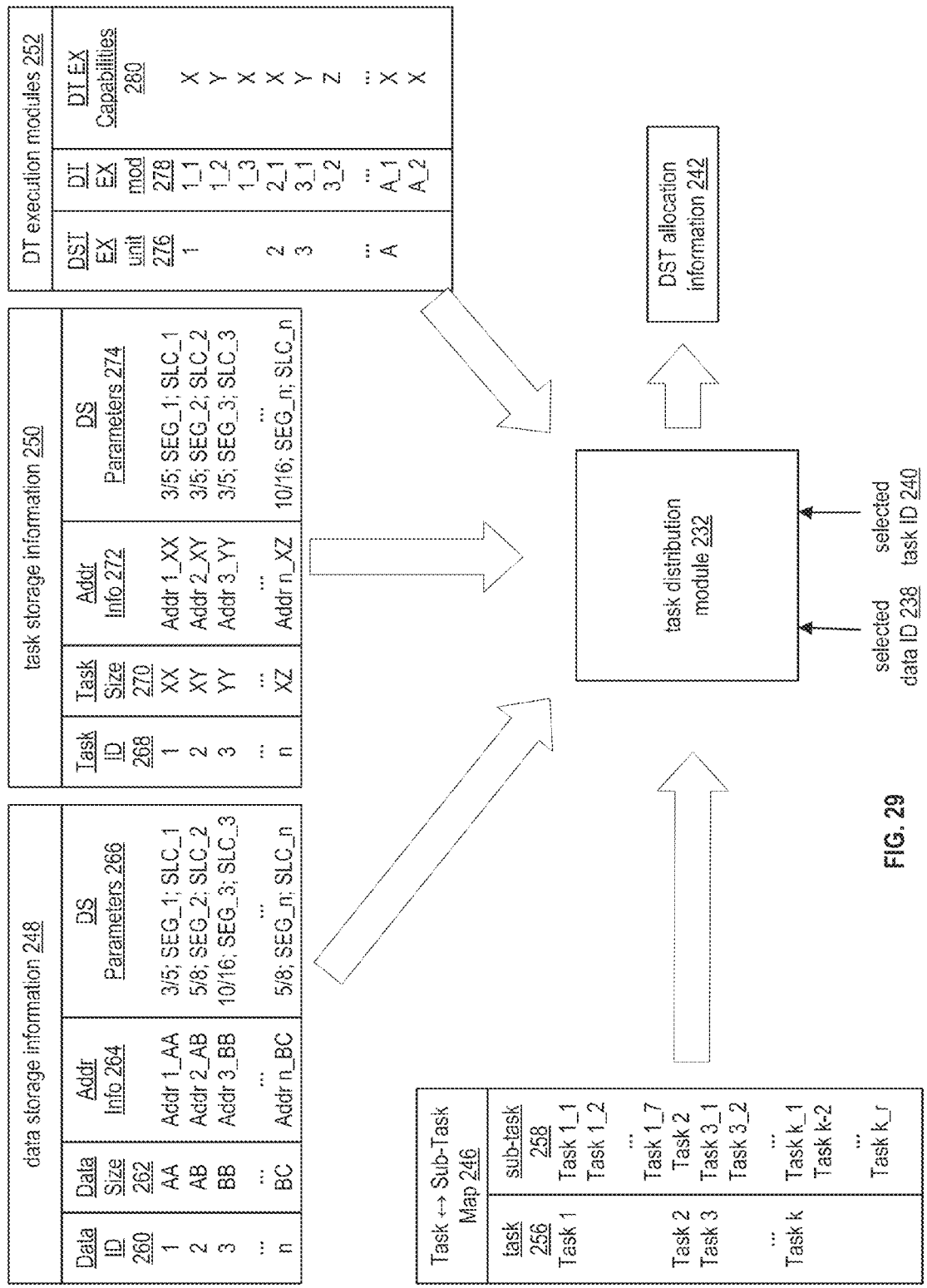
FIG. 29 is a schematic block diagram of an embodiment of a task distribution module facilitating the example of FIG. 28 in accordance with the present disclosure.

FIG. 29 is a schematic block diagram of an embodiment of a task distribution module 232 facilitating the example of FIG. 28. The task distribution module 232 includes a plurality of tables it uses to generate distributed storage and task (DST) allocation information 242 for selected data and selected tasks received from a DST client module. The tables include data storage information 248, task storage information 250, distributed task (DT) execution module information 252, and task⇔sub-task mapping information 246.

The data storage information table 248 includes a data identification (ID) field 260, a data size field 262, an addressing information field 264, distributed storage (DS) information 266, and may further include other information regarding the data, how it is stored, and/or how it can be processed. For example, DS encoded data #1 has a data ID of 1, a data size of AA (e.g., a byte size of a few Terabytes or more), addressing information of Addr_1_AA, and DS parameters of 3/5; SEG_1; and SLC_1. In this example, the addressing information may be a virtual address corresponding to the virtual address of the first storage word (e.g., one or more bytes) of the data and information on how to calculate the other addresses, may be a range of virtual addresses for the storage words of the data, physical addresses of the first storage word or the storage words of the data, may be a list of slice names of the encoded data slices of the data, etc. The DS parameters may include identity of an error encoding scheme, decode threshold/pillar width (e.g., 3/5 for the first data entry), segment security information (e.g., SEG_1), per slice security information (e.g., SLC_1), and/or any other information regarding how the data was encoded into data slices.

The task storage information table 250 includes a task identification (ID) field 268, a task size field 270, an addressing information field 272, distributed storage (DS) information 274, and may further include other information regarding the task, how it is stored, and/or how it can be used to process data. For example, DS encoded task #2 has a task ID of 2, a task size of XY, addressing information of Addr_2_XY, and DS parameters of 3/5; SEG_2; and SLC_2. In this example, the addressing information may be a virtual address corresponding to the virtual address of the first storage word (e.g., one or more bytes) of the task and information on how to calculate the other addresses, may be a range of virtual addresses for the storage words of the task, physical addresses of the first storage word or the storage words of the task, may be a list of slices names of the encoded slices of the task code, etc. The DS parameters may include identity of an error encoding scheme, decode threshold/pillar width (e.g., 3/5 for the first data entry), segment security information (e.g., SEG_2), per slice security information (e.g., SLC_2), and/or any other information regarding how the task was encoded into encoded task slices. Note that the segment and/or the per-slice security information include a type of encryption (if enabled), a type of compression (if enabled), watermarking information (if enabled), and/or an integrity check scheme (if enabled).

The task⇆sub-task mapping information table 246 includes a task field 256 and a sub-task field 258. The task field 256 identifies a task stored in the memory of a distributed storage and task network (DSTN) module and the corresponding sub-task fields 258 indicates whether the task includes sub-tasks and, if so, how many and if any of the sub-tasks are ordered. In this example, the task⇆sub-task mapping information table 246 includes an entry for each task stored in memory of the DSTN module (e.g., task 1 through task k). In particular, this example indicates that task 1 includes 7 sub-tasks; task 2 does not include sub-tasks, and task k includes r number of sub-tasks (where r is an integer greater than or equal to two).

The DT execution module table 252 includes a DST execution unit ID field 276, a DT execution module ID field 278, and a DT execution module capabilities field 280. The DST execution unit ID field 276 includes the identity of DST units in the DSTN module. The DT execution module ID field 278 includes the identity of each DT execution unit in each DST unit. For example, DST unit 1 includes three DT executions modules (e.g., 1_1, 1_2, and 1_3). The DT execution capabilities field 280 includes identity of the capabilities of the corresponding DT execution unit. For example, DT execution module 1_1 includes capabilities X, where X includes one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.), and/or any information germane to executing one or more tasks.

From these tables, the task distribution module 232 generates the DST allocation information 242 to indicate where the data is stored, how to partition the data, where the task is stored, how to partition the task, which DT execution units should perform which partial task on which data partitions, where and how intermediate results are to be stored, etc. If multiple tasks are being performed on the same data or different data, the task distribution module factors such information into its generation of the DST allocation information.

Figure 30:
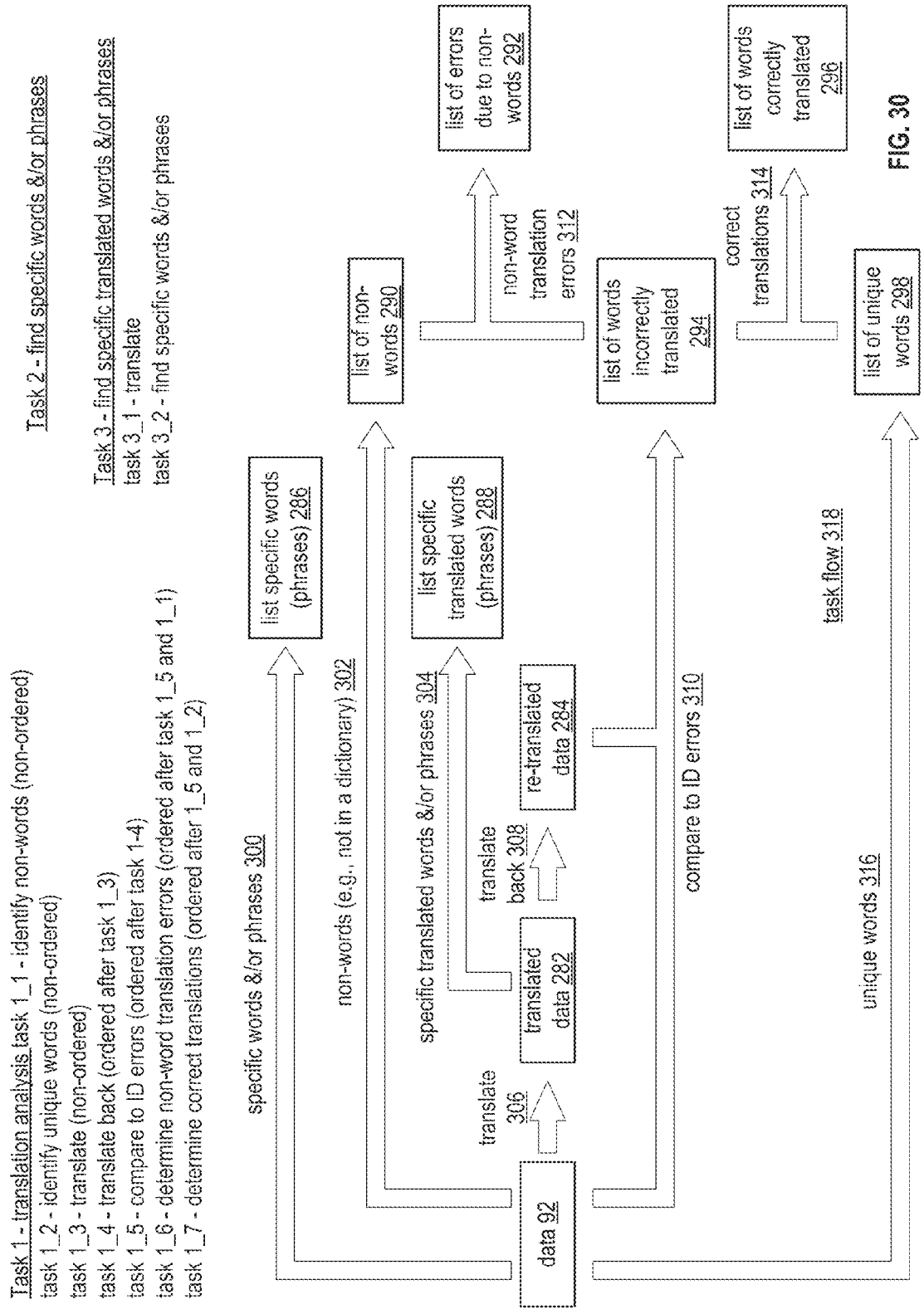
FIG. 30 is a diagram of a specific example of the distributed computing system performing tasks on stored data in accordance with the present disclosure.

FIG. 30 is a diagram of a specific example of a distributed computing system performing tasks on stored data as a task flow 318. In this example, selected data 92 is data 2 and selected tasks are tasks 1, 2, and 3. Task 1 corresponds to analyzing translation of data from one language to another (e.g., human language or computer language); task 2 corresponds to finding specific words and/or phrases in the data; and task 3 corresponds to finding specific translated words and/or phrases in translated data.

In this example, task 1 includes 7 sub-tasks: task 1_1-identify non-words (non-ordered); task 1_2-identify unique words (non-ordered); task 1_3-translate (non-ordered); task 1_4-translate back (ordered after task 1_3); task 1_5—compare to ID errors (ordered after task 1-4); task 1_6—determine non-word translation errors (ordered after task 1_5 and 1_1); and task 1_7-determine correct translations (ordered after 1_5 and 1_2). The sub-task further indicates whether they are an ordered task (i.e., are dependent on the outcome of another task) or non-order (i.e., are independent of the outcome of another task). Task 2 does not include sub-tasks and task 3 includes two sub-tasks: task 3_1 translate; and task 3_2 find specific word or phrase in translated data.

In general, the three tasks collectively are selected to analyze data for translation accuracies, translation errors, translation anomalies, occurrence of specific words or phrases in the data, and occurrence of specific words or phrases on the translated data. Graphically, the data 92 is translated 306 into translated data 282; is analyzed for specific words and/or phrases 300 to produce a list of specific words and/or phrases 286; is analyzed for non-words 302 (e.g., not in a reference dictionary) to produce a list of non-words 290; and is analyzed for unique words 316 included in the data 92 (i.e., how many different words are included in the data) to produce a list of unique words 298. Each of these tasks is independent of each other and can therefore be processed in parallel if desired.

The translated data 282 is analyzed (e.g., sub-task 3_2) for specific translated words and/or phrases 304 to produce a list of specific translated words and/or phrases 288. The translated data 282 is translated back 308 (e.g., sub-task 1_4) into the language of the original data to produce re-translated data 284. These two tasks are dependent on the translate task (e.g., task 1_3) and thus must be ordered after the translation task, which may be in a pipelined ordering or a serial ordering. The re-translated data 284 is then compared 310 with the original data 92 to find words and/or phrases that did not translate (one way and/or the other) properly to produce a list of incorrectly translated words 294. As such, the comparing task (e.g., sub-task 1_5) 310 is ordered after the translation 306 and re-translation tasks 308 (e.g., sub-tasks 1_3 and 1_4).

The list of words incorrectly translated 294 is compared 312 to the list of non-words 290 to identify words that were not properly translated because the words are non-words to produce a list of errors due to non-words 292. In addition, the list of words incorrectly translated 294 is compared 314 to the list of unique words 298 to identify unique words that were properly translated to produce a list of correctly translated words 296. The comparison may also identify unique words that were not properly translated to produce a list of unique words that were not properly translated. Note that each list of words (e.g., specific words and/or phrases, non-words, unique words, translated words and/or phrases, etc.,) may include the word and/or phrase, how many times it is used, where in the data it is used, and/or any other information requested regarding a word and/or phrase.

Figure 31:
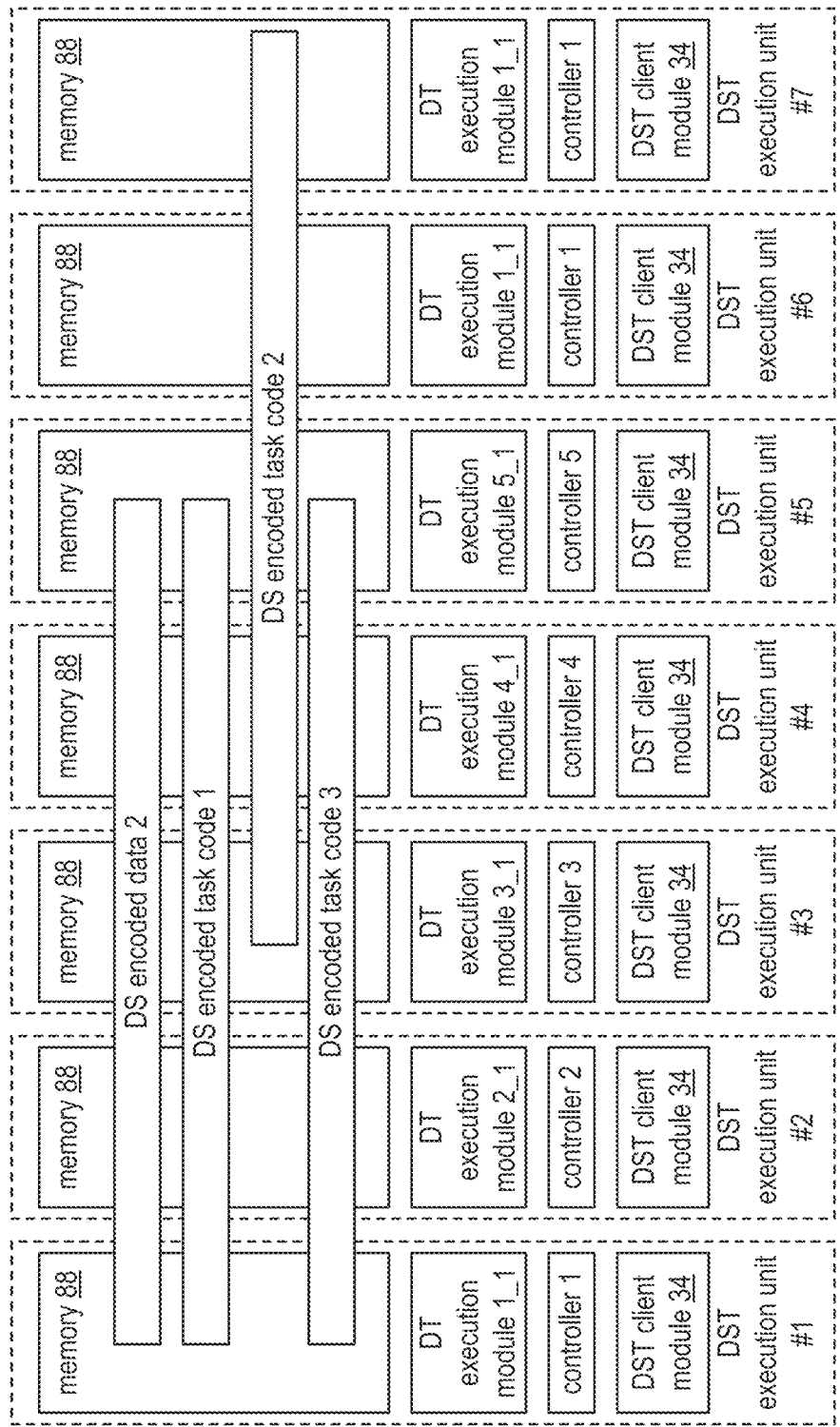
FIG. 31 is a schematic block diagram of an example of a distributed storage and task processing network (DSTN) module storing data and task codes for the example of FIG. 30 in accordance with the present disclosure.

FIG. 31 is a schematic block diagram of an example of a distributed storage and task processing network (DSTN) module storing data and task codes for the example of FIG. 30. As shown, DS encoded data 2 is stored as encoded data slices across the memory (e.g., stored in memories 88) of DST execution units 1-5; the DS encoded task code 1 (of task 1) and DS encoded task 3 are stored as encoded task slices across the memory of DST execution units 1-5; and DS encoded task code 2 (of task 2) is stored as encoded task slices across the memory of DST execution units 3-7. As indicated in the data storage information table and the task storage information table of FIG. 29, the respective data/task has DS parameters of 3/5 for their decode threshold/pillar width; hence spanning the memory of five DST execution units.

FIG. 32 is a diagram of an example of distributed storage and task (DST) allocation information 242 for the example of FIG. 30. The DST allocation information 242 includes data partitioning information 320, task execution information 322, and intermediate result information 324. The data partitioning information 320 includes the data identifier (ID), the number of partitions to split the data into, address information for each data partition, and whether the DS encoded data has to be transformed from pillar grouping to slice grouping. The task execution information 322 includes tabular information having a task identification field 326, a task ordering field 328, a data partition field ID 330, and a set of DT execution modules 332 to use for the distributed task processing per data partition. The intermediate result information 324 includes tabular information having a name ID field 334, an ID of the DST execution unit assigned to process the corresponding intermediate result 336, a scratch pad storage field 338, and an intermediate result storage field 340.

Continuing with the example of FIG. 30, where tasks 1-3 are to be distributedly performed on data 2, the data partitioning information includes the ID of data 2. In addition, the task distribution module determines whether the DS encoded data 2 is in the proper format for distributed computing (e.g., was stored as slice groupings). If not, the task distribution module indicates that the DS encoded data 2 format needs to be changed from the pillar grouping format to the slice grouping format, which will be done by the DSTN module. In addition, the task distribution module determines the number of partitions to divide the data into (e.g., 2_1 through 2_z) and addressing information for each partition.

The task distribution module generates an entry in the task execution information section for each sub-task to be performed. For example, task 1_1 (e.g., identify non-words on the data) has no task ordering (i.e., is independent of the results of other sub-tasks), is to be performed on data partitions 2_1 through 2_z by DT execution modules 1_1, 2_1, 3_1, 4_1, and 5_1. For instance, DT execution modules 1_1, 2_1, 3_1, 4_1, and 5_1 search for non-words in data partitions 2_1 through 2_z to produce task 1_1 intermediate results (R1-1, which is a list of non-words). Task 1_2 (e.g., identify unique words) has similar task execution information as task 1_1 to produce task 1_2 intermediate results (R1-2, which is the list of unique words).

Task 1_3 (e.g., translate) includes task execution information as being non-ordered (i.e., is independent), having DT execution modules 1_1, 2_1, 3_1, 4_1, and 5_1 translate data partitions 2_1 through 2_4 and having DT execution modules 1_2, 2_2, 3_2, 4_2, and 5_2 translate data partitions 2_5 through 2_z to produce task 1_3 intermediate results (R1-3, which is the translated data). In this example, the data partitions are grouped, where different sets of DT execution modules perform a distributed sub-task (or task) on each data partition group, which allows for further parallel processing.

Task 1_4 (e.g., translate back) is ordered after task 1_3 and is to be executed on task 1_3's intermediate result (e.g., R1-3_1) (e.g., the translated data). DT execution modules 1_1, 2_1, 3_1, 4_1, and 5_1 are allocated to translate back task 1_3 intermediate result partitions R1-3_1 through R1-3_4 and DT execution modules 1_2, 2_2, 6_1, 7_1, and 7_2 are allocated to translate back task 1_3 intermediate result partitions R1-3_5 through R1-3_z to produce task 1-4 intermediate results (R1-4, which is the translated back data).

Task 1_5 (e.g., compare data and translated data to identify translation errors) is ordered after task 1_4 and is to be executed on task 1_4's intermediate results (R4-1) and on the data. DT execution modules 1_1, 2_1, 3_1, 4_1, and 5_1 are allocated to compare the data partitions (2_1 through 2_z) with partitions of task 1-4 intermediate results partitions R1-4_1 through R1-4_z to produce task 1_5 intermediate results (R1-5, which is the list words translated incorrectly).

Task 1_6 (e.g., determine non-word translation errors) is ordered after tasks 1_1 and 1_5 and is to be executed on tasks 1_1's and 1_5's intermediate results (R1-1 and R1-5). DT execution modules 1_1, 2_1, 3_1, 4_1, and 5_1 are allocated to compare the partitions of task 1_1 intermediate results (R1-1_1 through R1-1_z) with partitions of task 1-5 intermediate results partitions (R1-5_1 through R1-5_z) to produce task 1_6 intermediate results (R1-6, which is the list translation errors due to non-words).

Task 1_7 (e.g., determine words correctly translated) is ordered after tasks 1_2 and 1_5 and is to be executed on tasks 1_2's and 1_5's intermediate results (R1-1 and R1-5). DT execution modules 1_2, 2_2, 3_2, 4_2, and 5_2 are allocated to compare the partitions of task 1_2 intermediate results (R1-2_1 through R1-2_z) with partitions of task 1-5 intermediate results partitions (R1-5_1 through R1-5_z) to produce task 1_7 intermediate results (R1-7, which is the list of correctly translated words).

Task 2 (e.g., find specific words and/or phrases) has no task ordering (i.e., is independent of the results of other sub-tasks), is to be performed on data partitions 2_1 through 2_z by DT execution modules 3_1, 4_1, 5_1, 6_1, and 7_1. For instance, DT execution modules 3_1, 4_1, 5_1, 6_1, and 7_1 search for specific words and/or phrases in data partitions 2_1 through 2_z to produce task 2 intermediate results (R2, which is a list of specific words and/or phrases).

Task 3_2 (e.g., find specific translated words and/or phrases) is ordered after task 1_3 (e.g., translate) is to be performed on partitions R1-3_1 through R1-3_z by DT execution modules 1_2, 2_2, 3_2, 4_2, and 5_2. For instance, DT execution modules 1_2, 2_2, 3_2, 4_2, and 5_2 search for specific translated words and/or phrases in the partitions of the translated data (R1-3_1 through R1-3_z) to produce task 3_2 intermediate results (R3-2, which is a list of specific translated words and/or phrases).

For each task, the intermediate result information indicates which DST unit is responsible for overseeing execution of the task and, if needed, processing the partial results generated by the set of allocated DT execution units. In addition, the intermediate result information indicates a scratch pad memory for the task and where the corresponding intermediate results are to be stored. For example, for intermediate result R1-1 (the intermediate result of task 1_1), DST unit 1 is responsible for overseeing execution of the task 1_1 and coordinates storage of the intermediate result as encoded intermediate result slices stored in memory of DST execution units 1-5. In general, the scratch pad is for storing non-DS encoded intermediate results and the intermediate result storage is for storing DS encoded intermediate results.

Figure 33:
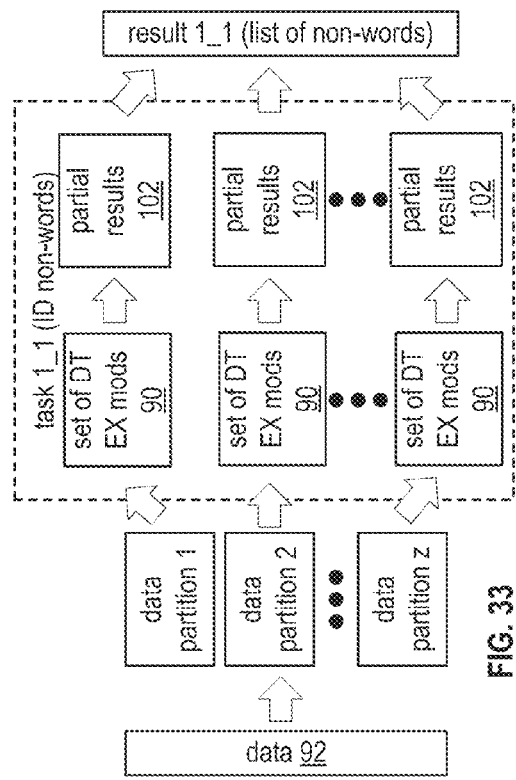

FIGS. 33-38 are schematic block diagrams of the distributed storage and task network (DSTN) module performing the example of FIG. 30. In FIG. 33, the DSTN module accesses the data 92 and partitions it into a plurality of partitions 1-z in accordance with distributed storage and task network (DST) allocation information. For each data partition, the DSTN identifies a set of its DT (distributed task) execution modules 90 to perform the task (e.g., identify non-words (i.e., not in a reference dictionary) within the data partition) in accordance with the DST allocation information. From data partition to data partition, the set of DT execution modules 90 may be the same, different, or a combination thereof (e.g., some data partitions use the same set while other data partitions use different sets).

For the first data partition, the first set of DT execution modules (e.g., 1_1, 2_1, 3_1, 4_1, and 5_1 per the DST allocation information of FIG. 32) executes task 1_1 to produce a first partial result 102 of non-words found in the first data partition. The second set of DT execution modules (e.g., 1_1, 2_1, 3_1, 4_1, and 5_1 per the DST allocation information of FIG. 32) executes task 1_1 to produce a second partial result 102 of non-words found in the second data partition. The sets of DT execution modules (as per the DST allocation information) perform task 1_1 on the data partitions until the "z" set of DT execution modules performs task 1_1 on the "zth" data partition to produce a "zth" partial result 102 of non-words found in the "zth" data partition.

As indicated in the DST allocation information of FIG. 32, DST execution unit 1 is assigned to process the first through "zth" partial results to produce the first intermediate result (R1-1), which is a list of non-words found in the data. For instance, each set of DT execution modules 90 stores its respective partial result in the scratchpad memory of DST execution unit 1 (which is identified in the DST allocation or may be determined by DST execution unit 1). A processing module of DST execution 1 is engaged to aggregate the first through "zth" partial results to produce the first intermediate result (e.g., R1_1). The processing module stores the first intermediate result as non-DS error encoded data in the scratchpad memory or in another section of memory of DST execution unit 1.

DST execution unit 1 engages its DST client module to slice grouping based DS error encode the first intermediate result (e.g., the list of non-words). To begin the encoding, the DST client module determines whether the list of non-words is of a sufficient size to partition (e.g., greater than a Terabyte). If yes, it partitions the first intermediate result (R1-1) into a plurality of partitions (e.g., R1-1_1 through R1-1_m). If the first intermediate result is not of sufficient size to partition, it is not partitioned.

For each partition of the first intermediate result, or for the first intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

Figure 34:
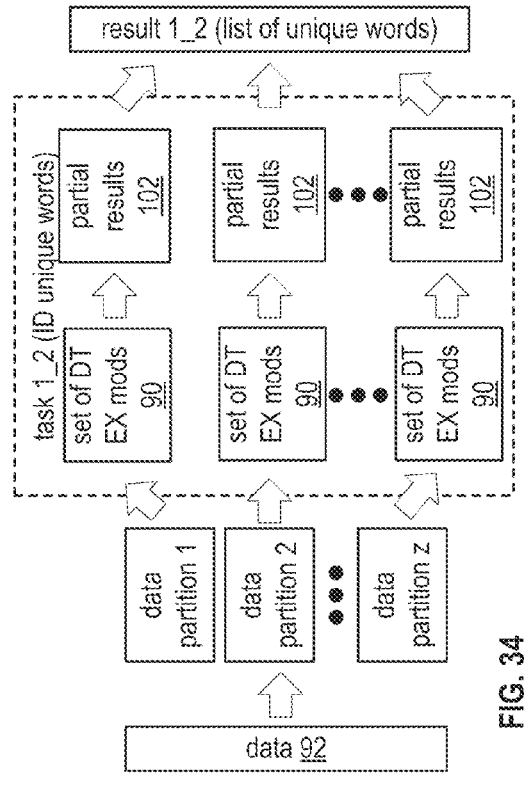

In FIG. 34, the DSTN module is performing task 1_2 (e.g., find unique words) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_2 in accordance with the DST allocation information. From data partition to data partition, the set of DT execution modules may be the same, different, or a combination thereof. For the data partitions, the allocated set of DT execution modules executes task 1_2 to produce a partial results (e.g., $1^{st}$ through "zth") of unique words found in the data partitions.

As indicated in the DST allocation information of FIG. 32, DST execution unit 1 is assigned to process the first through "zth" partial results 102 of task 1_2 to produce the second intermediate result (R1-2), which is a list of unique words found in the data 92. The processing module of DST execution 1 is engaged to aggregate the first through "zth" partial results of unique words to produce the second intermediate result. The processing module stores the second intermediate result as non-DS error encoded data in the scratchpad memory or in another section of memory of DST execution unit 1.

DST execution unit 1 engages its DST client module to slice grouping based DS error encode the second intermediate result (e.g., the list of non-words). To begin the encoding, the DST client module determines whether the list of unique words is of a sufficient size to partition (e.g., greater than a Terabyte). If yes, it partitions the second intermediate result (R1-2) into a plurality of partitions (e.g., R1-2_1 through R1-2_m). If the second intermediate result is not of sufficient size to partition, it is not partitioned.

For each partition of the second intermediate result, or for the second intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

Figure 35:
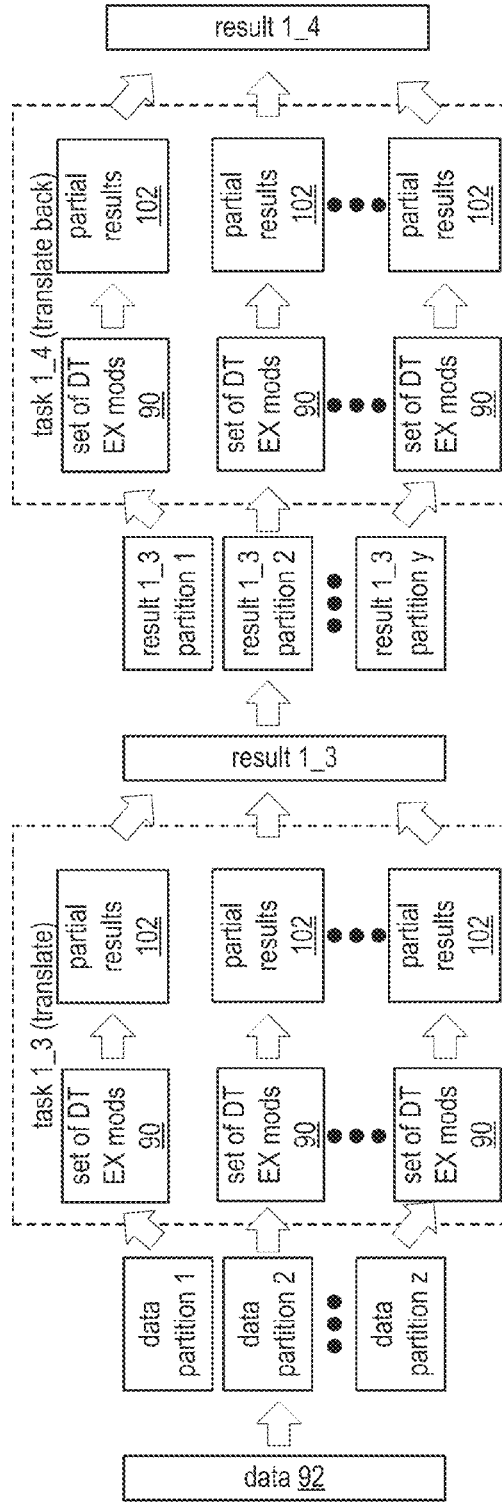

In FIG. 35, the DSTN module is performing task 1_3 (e.g., translate) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_3 in accordance with the DST allocation information (e.g., DT execution modules 1_1, 2_1, 3_1, 4_1, and 5_1 translate data partitions 2_1 through 2_4 and DT execution modules 1_2, 2_2, 3_2, 4_2, and 5_2 translate data partitions 2_5 through 2_z). For the data partitions, the allocated set of DT execution modules 90 executes task 1_3 to produce partial results 102 (e.g., $1^{st}$ through "zth") of translated data.

As indicated in the DST allocation information of FIG. 32, DST execution unit 2 is assigned to process the first through "zth" partial results of task 1_3 to produce the third intermediate result (R1-3), which is translated data. The processing module of DST execution 2 is engaged to aggregate the first through "zth" partial results of translated data to produce the third intermediate result. The processing module stores the third intermediate result as non-DS error encoded data in the scratchpad memory or in another section of memory of DST execution unit 2.

DST execution unit 2 engages its DST client module to slice grouping based DS error encode the third intermediate result (e.g., translated data). To begin the encoding, the DST client module partitions the third intermediate result (R1-3) into a plurality of partitions (e.g., R1-3_1 through R1-3_y). For each partition of the third intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is further shown in FIG. 35, the DSTN module is performing task 1_4 (e.g., retranslate) on the translated data of the third intermediate result. To begin, the DSTN module accesses the translated data (from the scratchpad memory or from the intermediate result memory and decodes it) and partitions it into a plurality of partitions in accordance with the DST allocation information. For each partition of the third intermediate result, the DSTN identifies a set of its DT execution modules 90 to perform task 1_4 in accordance with the DST allocation information (e.g., DT execution modules 1_1, 2_1, 3_1, 4_1, and 5_1 are allocated to translate back partitions R1-3_1 through R1-3_4 and DT execution modules 1_2, 2_2, 6_1, 7_1, and 7_2 are allocated to translate back partitions R1-3_5 through R1-3_z). For the partitions, the allocated set of DT execution modules executes task 1_4 to produce partial results 102 (e.g., $1^{st}$ through "zth") of re-translated data.

As indicated in the DST allocation information of FIG. 32, DST execution unit 3 is assigned to process the first through "zth" partial results of task 1_4 to produce the fourth intermediate result (R1-4), which is retranslated data. The processing module of DST execution 3 is engaged to aggregate the first through "zth" partial results of retranslated data to produce the fourth intermediate result. The processing module stores the fourth intermediate result as non-DS error encoded data in the scratchpad memory or in another section of memory of DST execution unit 3.

DST execution unit 3 engages its DST client module to slice grouping based DS error encode the fourth intermediate result (e.g., retranslated data). To begin the encoding, the DST client module partitions the fourth intermediate result (R1-4) into a plurality of partitions (e.g., R1-4_1 through R1-4_z). For each partition of the fourth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

Figure 36:
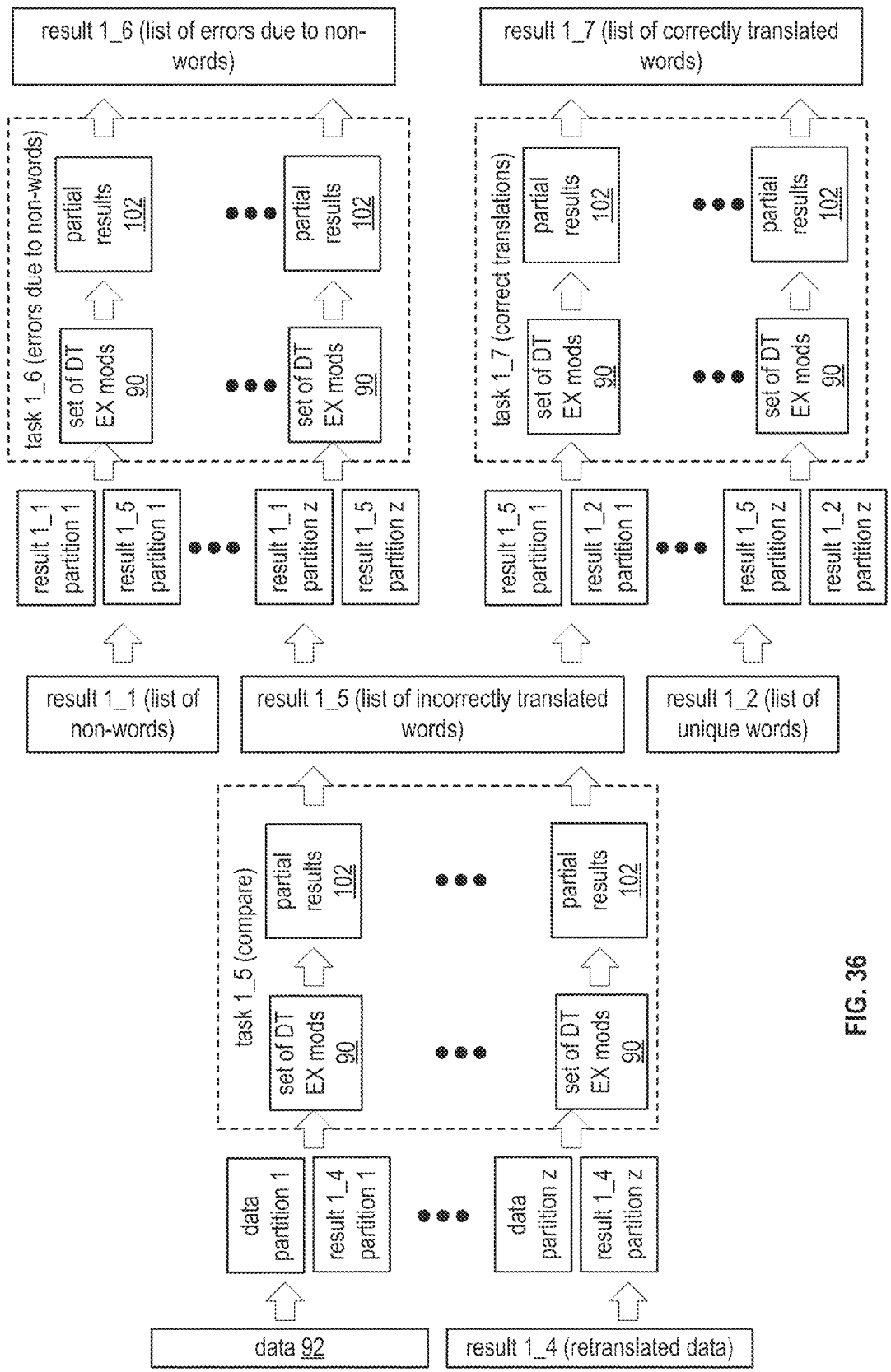

In FIG. 36, a distributed storage and task network (DSTN) module is performing task 1_5 (e.g., compare) on data 92 and retranslated data of FIG. 35. To begin, the DSTN module accesses the data 92 and partitions it into a plurality of partitions in accordance with the DST allocation information or it may use the data partitions of task 1_1 if the partitioning is the same. The DSTN module also accesses the retranslated data from the scratchpad memory, or from the intermediate result memory and decodes it, and partitions it into a plurality of partitions in accordance with the DST allocation information. The number of partitions of the retranslated data corresponds to the number of partitions of the data.

For each pair of partitions (e.g., data partition 1 and retranslated data partition 1), the DSTN identifies a set of its DT execution modules 90 to perform task 1_5 in accordance with the DST allocation information (e.g., DT execution modules 1_1, 2_1, 3_1, 4_1, and 5_1). For each pair of partitions, the allocated set of DT execution modules executes task 1_5 to produce partial results 102 (e.g., $1^{st}$ through "zth") of a list of incorrectly translated words and/or phrases.

As indicated in the DST allocation information of FIG. 32, DST execution unit 1 is assigned to process the first through "zth" partial results of task 1_5 to produce the fifth intermediate result (R1-5), which is the list of incorrectly translated words and/or phrases. In particular, the processing module of DST execution 1 is engaged to aggregate the first through "zth" partial results of the list of incorrectly translated words and/or phrases to produce the fifth intermediate result. The processing module stores the fifth intermediate result as non-DS error encoded data in the scratchpad memory or in another section of memory of DST execution unit 1.

DST execution unit 1 engages its DST client module to slice grouping based DS error encode the fifth intermediate result. To begin the encoding, the DST client module partitions the fifth intermediate result (R1-5) into a plurality of partitions (e.g., R1-5_1 through R1-5_z). For each partition of the fifth intermediate result, the DST client module uses the DS error encoding parameters of the data (e.g., DS parameters of data 2, which includes 3/5 decode threshold/ pillar width ratio) to produce slice groupings. The slice groupings are stored in the intermediate result memory (e.g., allocated memory in the memories of DST execution units 1-5 per the DST allocation information).

As is further shown in FIG. 36, the DSTN module is performing task 1_6 (e.g., translation errors due to non-words) on the list of incorrectly translated words and/or phrases (e.g., the fifth intermediate result R1-5) and the list of non-words (e.g., the first intermediate result R1-1). To begin, the DSTN module accesses the lists and partitions them into a corresponding number of partitions.

For each pair of partitions (e.g., partition R1-1_1 and partition R1-5_1), the DSTN identifies a set of its DT execution modules 90 to perform task 1_6 in accordance with the DST allocation information (e.g., DT execution modules 1_1, 2_1, 3_1, 4_1, and 5_1). For each pair of partitions, the allocated set of DT execution modules executes task 1_6 to produce partial results 102 (e.g., $1^{st}$ through "zth") of a list of incorrectly translated words and/or phrases due to non-words.

As indicated in the DST allocation information of FIG. 32, DST execution unit 2 is assigned to process the first through "zth" partial results of task 1_6 to produce the sixth intermediate result (R1-6), which is the list of incorrectly translated words and/or phrases due to non-words. In particular, the processing module of DST execution 2 is engaged to aggregate the first through "zth" partial results of the list of incorrectly translated words and/or phrases due to non-words to produce the sixth intermediate result. The processing module stores the sixth intermediate result as non-DS error encoded data in the scratchpad memory or in another section of memory of DST execution unit 2.

DST execution unit 2 engages its DST client module to slice grouping based DS error encode the sixth intermediate result. To begin the encoding, the DST client module partitions the sixth intermediate result (R1-6) into a plurality of partitions (e.g., R1-6_1 through R1-6_z). For each partition of the sixth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is still further shown in FIG. 36, the DSTN module is performing task 1_7 (e.g., correctly translated words and/or phrases) on the list of incorrectly translated words and/or phrases (e.g., the fifth intermediate result R1-5) and the list of unique words (e.g., the second intermediate result R1-2). To begin, the DSTN module accesses the lists and partitions them into a corresponding number of partitions.

For each pair of partitions (e.g., partition R1-2_1 and partition R1-5_1), the DSTN identifies a set of its DT execution modules 90 to perform task 1_7 in accordance with the DST allocation information (e.g., DT execution modules 1_2, 2_2, 3_2, 4_2, and 5_2). For each pair of partitions, the allocated set of DT execution modules executes task 1_7 to produce partial results 102 (e.g., $1^{st}$ through "zth") of a list of correctly translated words and/or phrases.

As indicated in the DST allocation information of FIG. 32, DST execution unit 3 is assigned to process the first through "zth" partial results of task 1_7 to produce the seventh intermediate result (R1-7), which is the list of correctly translated words and/or phrases. In particular, the processing module of DST execution 3 is engaged to aggregate the first through "zth" partial results of the list of correctly translated words and/or phrases to produce the seventh intermediate result. The processing module stores the seventh intermediate result as non-DS error encoded data in the scratchpad memory or in another section of memory of DST execution unit 3.

DST execution unit 3 engages its DST client module to slice grouping based DS error encode the seventh intermediate result. To begin the encoding, the DST client module partitions the seventh intermediate result (R1-7) into a plurality of partitions (e.g., R1-7_1 through R1-7_z). For each partition of the seventh intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

In FIG. 37, the distributed storage and task network (DSTN) module is performing task 2 (e.g., find specific words and/or phrases) on the data 92. To begin, the DSTN module accesses the data and partitions it into a plurality of partitions 1-z in accordance with the DST allocation information or it may use the data partitions of task 1_1 if the partitioning is the same. For each data partition, the DSTN identifies a set of its DT execution modules 90 to perform task 2 in accordance with the DST allocation information. From data partition to data partition, the set of DT execution modules may be the same, different, or a combination thereof. For the data partitions, the allocated set of DT execution modules executes task 2 to produce partial results 102 (e.g., $1^{st}$ through "zth") of specific words and/or phrases found in the data partitions.

As indicated in the DST allocation information of FIG. 32, DST execution unit 7 is assigned to process the first through "zth" partial results of task 2 to produce task 2 intermediate result (R2), which is a list of specific words and/or phrases found in the data. The processing module of DST execution 7 is engaged to aggregate the first through "zth" partial results of specific words and/or phrases to produce the task 2 intermediate result. The processing module stores the task 2 intermediate result as non-DS error encoded data in the scratchpad memory or in another section of memory of DST execution unit 7.

DST execution unit 7 engages its DST client module to slice grouping based DS error encode the task 2 intermediate result. To begin the encoding, the DST client module determines whether the list of specific words and/or phrases is of a sufficient size to partition (e.g., greater than a Terabyte). If yes, it partitions the task 2 intermediate result (R2) into a plurality of partitions (e.g., R2_1 through R2_m). If the task 2 intermediate result is not of sufficient size to partition, it is not partitioned.

For each partition of the task 2 intermediate result, or for the task 2 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, and 7).

In FIG. 38, the distributed storage and task network (DSTN) module is performing task 3 (e.g., find specific translated words and/or phrases) on the translated data (R1-3). To begin, the DSTN module accesses the translated data (from the scratchpad memory or from the intermediate result memory and decodes it) and partitions it into a plurality of partitions in accordance with the DST allocation information. For each partition, the DSTN identifies a set of its DT execution modules to perform task 3 in accordance with the DST allocation information. From partition to partition, the set of DT execution modules may be the same, different, or a combination thereof. For the partitions, the allocated set of DT execution modules 90 executes task 3 to produce partial results 102 (e.g., $1^{st}$ through "zth") of specific translated words and/or phrases found in the data partitions.

As indicated in the DST allocation information of FIG. 32, DST execution unit 5 is assigned to process the first through "zth" partial results of task 3 to produce task 3 intermediate result (R3), which is a list of specific translated words and/or phrases found in the translated data. In particular, the processing module of DST execution 5 is engaged to aggregate the first through "zth" partial results of specific translated words and/or phrases to produce the task 3 intermediate result. The processing module stores the task 3 intermediate result as non-DS error encoded data in the scratchpad memory or in another section of memory of DST execution unit 7.

DST execution unit 5 engages its DST client module to slice grouping based DS error encode the task 3 intermediate result. To begin the encoding, the DST client module determines whether the list of specific translated words and/or phrases is of a sufficient size to partition (e.g., greater than a Terabyte). If yes, it partitions the task 3 intermediate result (R3) into a plurality of partitions (e.g., R3_1 through R3_m).

If the task 3 intermediate result is not of sufficient size to partition, it is not partitioned.

For each partition of the task 3 intermediate result, or for the task 3 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, 5, and 7).

FIG. 39 is a diagram of an example of combining result information into final results 104 for the example of FIG. 30. In this example, the result information includes the list of specific words and/or phrases found in the data (task 2 intermediate result), the list of specific translated words and/or phrases found in the data (task 3 intermediate result), the list of non-words found in the data (task 1 first intermediate result R1-1), the list of unique words found in the data (task 1 second intermediate result R1-2), the list of translation errors due to non-words (task 1 sixth intermediate result R1-6), and the list of correctly translated words and/or phrases (task 1 seventh intermediate result R1-7). The task distribution module provides the result information to the requesting DST client module as the results 104.

Figure 40A:
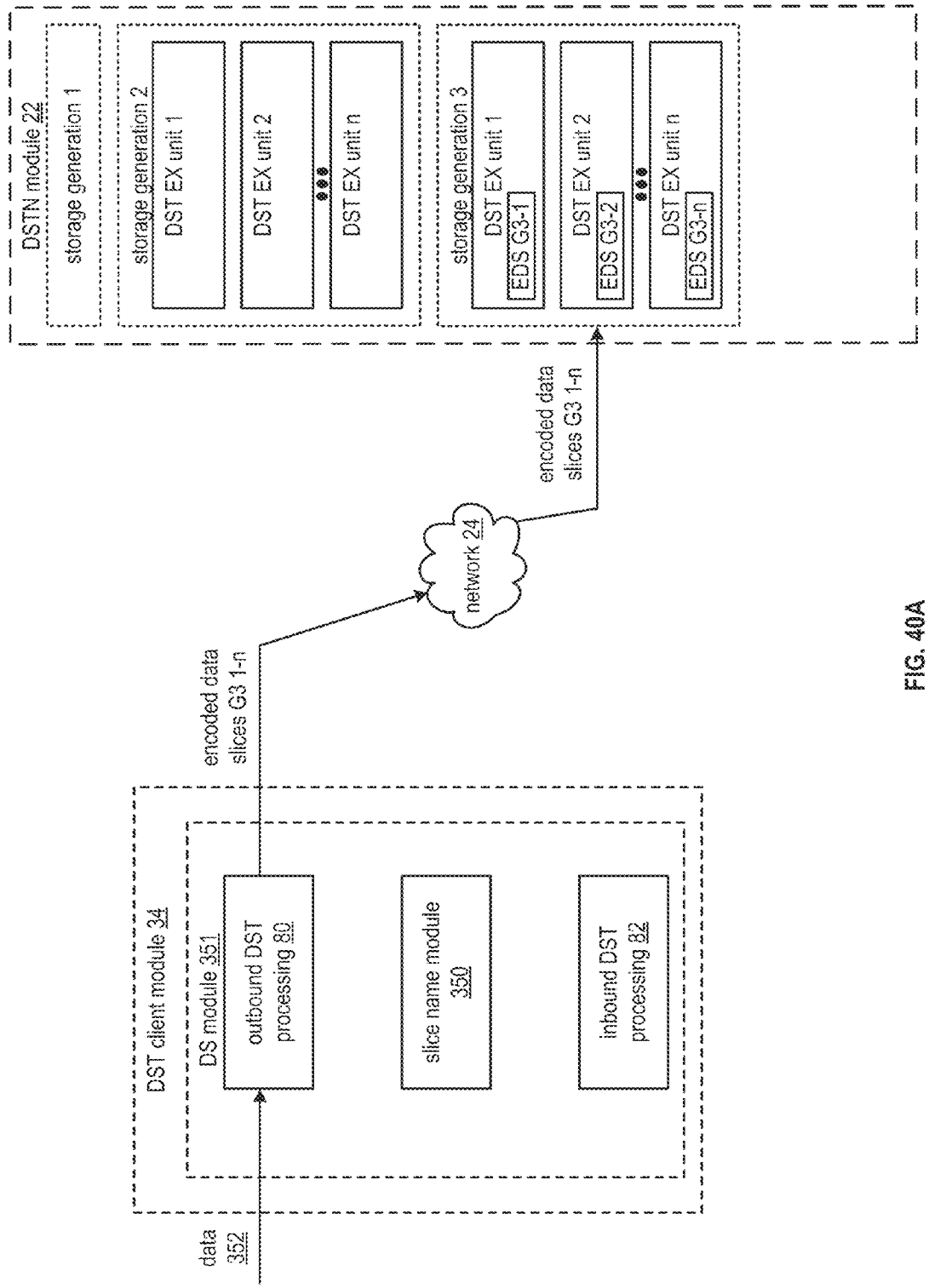
FIGS. 40A-40D are schematic block diagrams of an embodiment of a dispersed storage network (DSN) illustrating an example of storing data in DSN memory in accordance with the present disclosure.
Figure 40B:
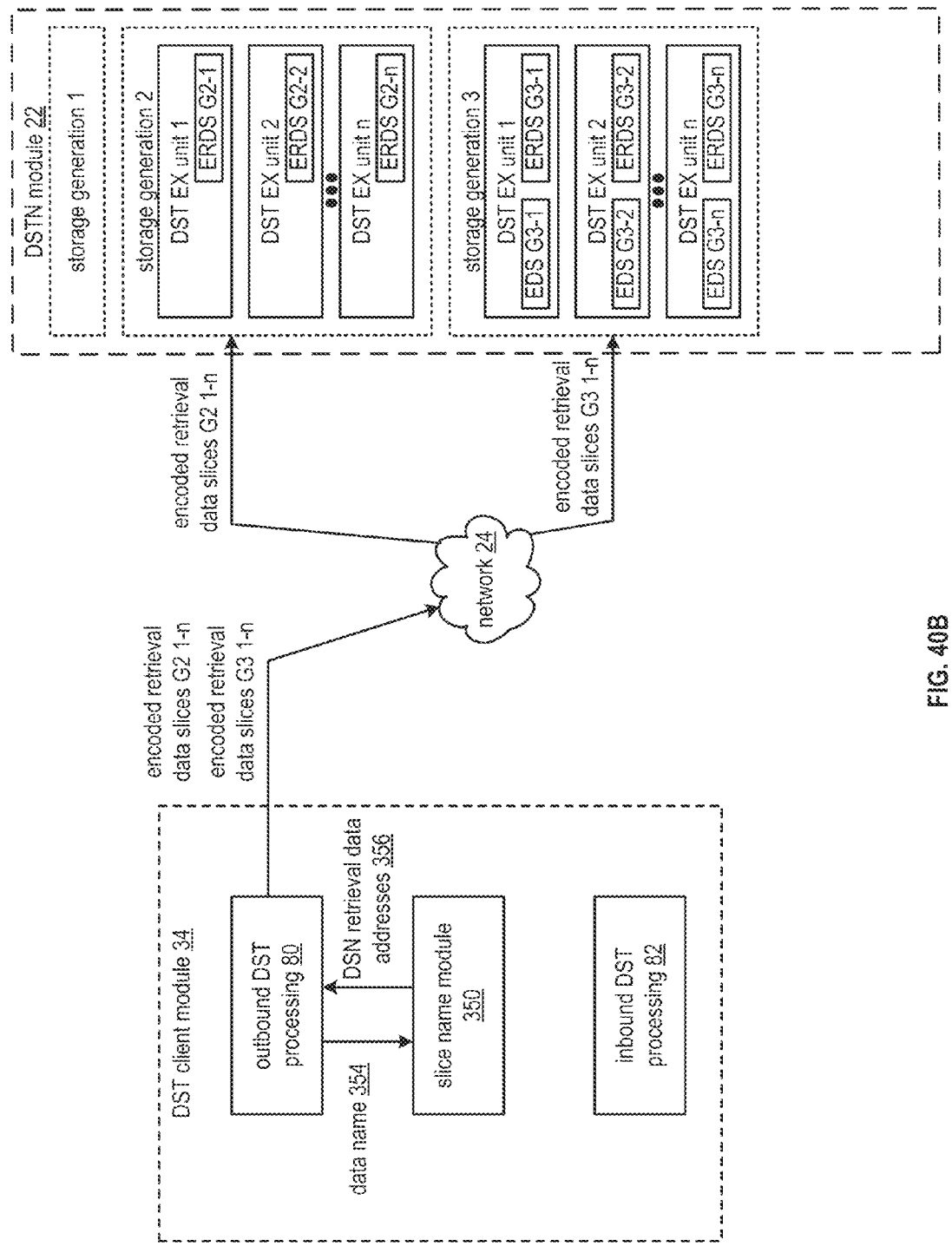
Figure 40C:
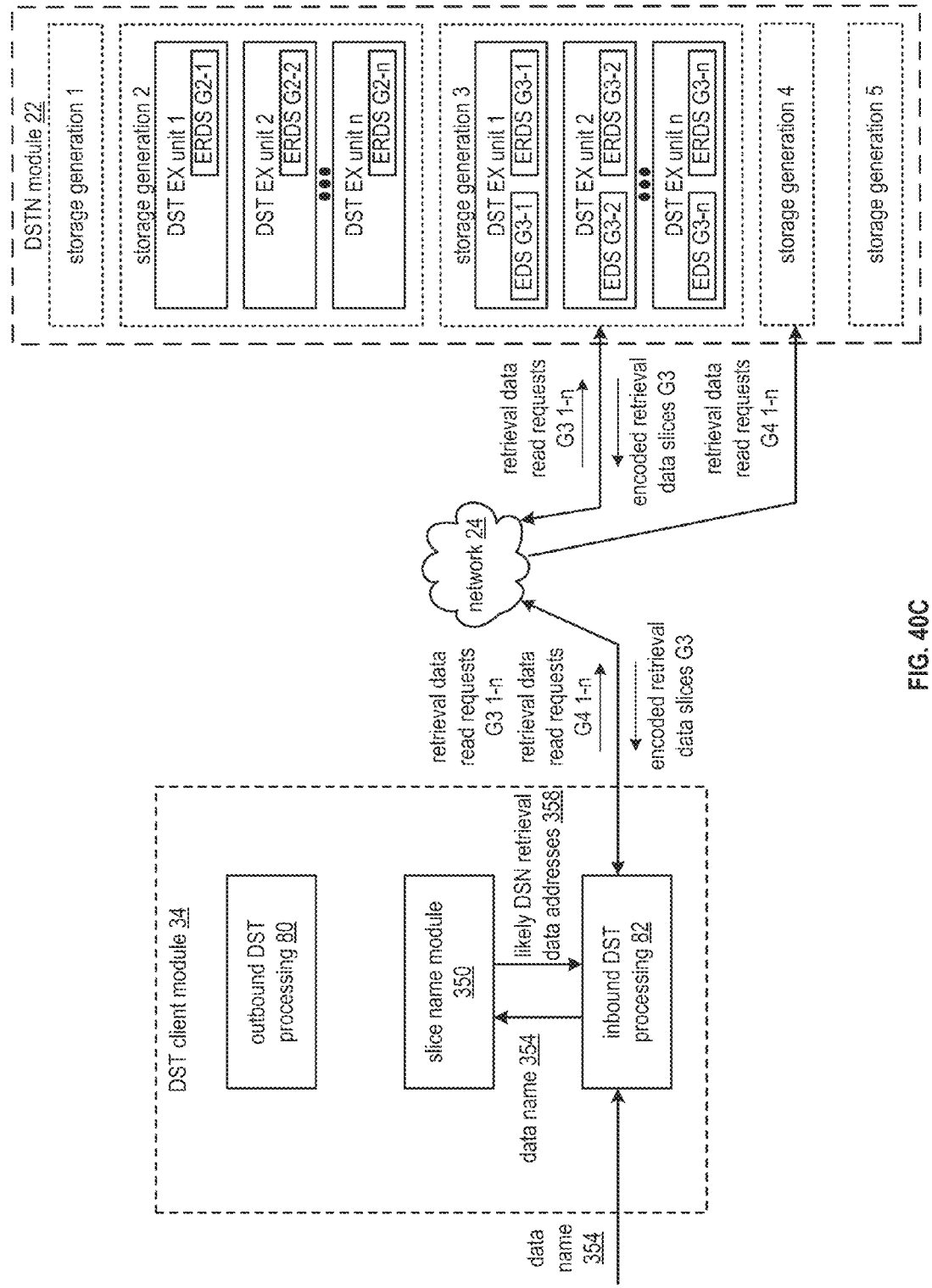
Figure 40D:
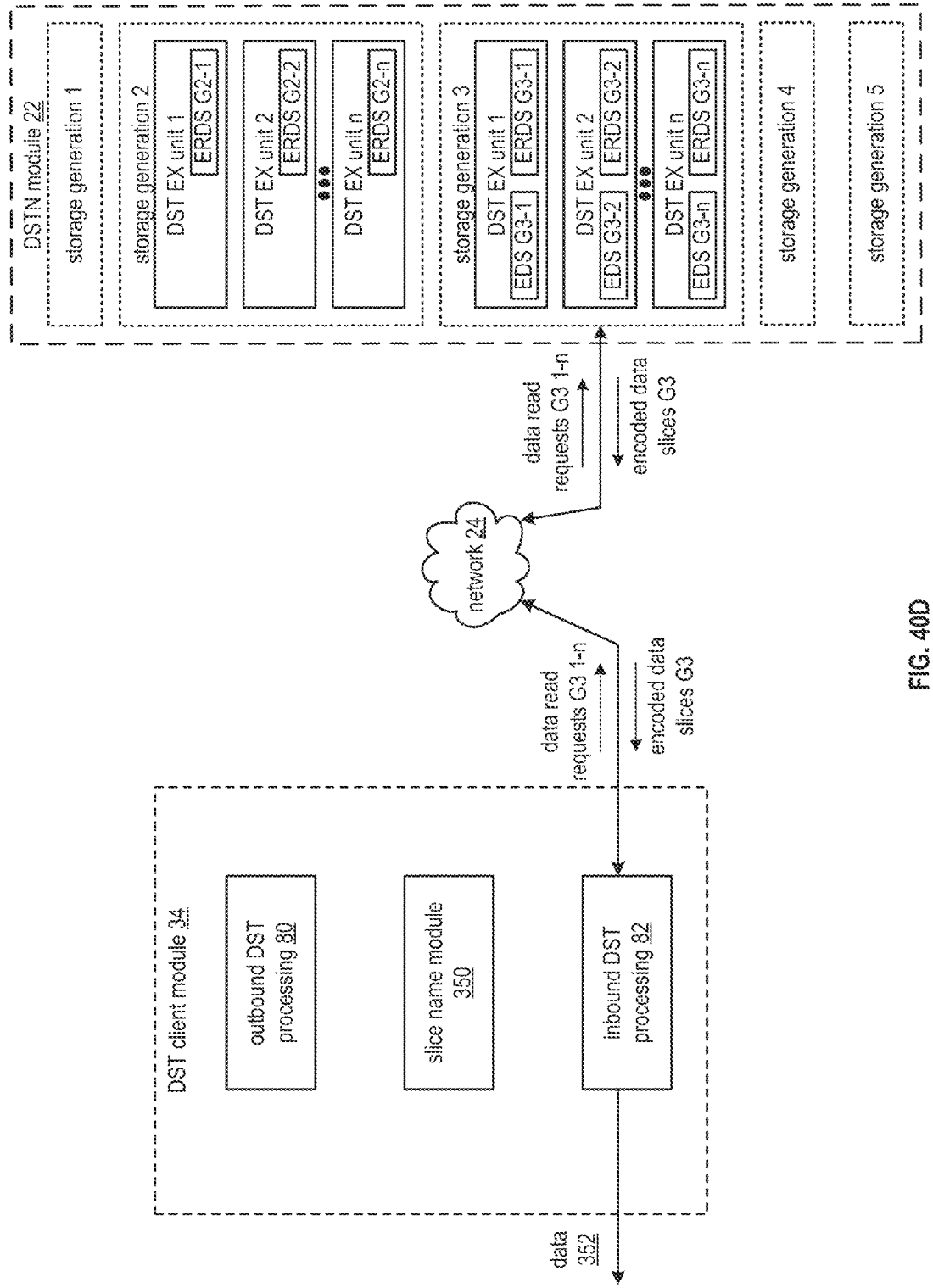

FIGS. 40A-40D are schematic block diagrams of an embodiment of a dispersed storage network (DSN) illustrating an example of storing data in DSN memory. The DSN includes the distributed storage and task (DST) client module 34 of FIG. 1, the network 24 of FIG. 1, and the distributed storage and task network (DSTN) module 22 of FIG. 1. Hereafter, the DSTN module 22 may be referred to interchangeably as the DSN memory. The DSTN module 22 includes one or more storage generations, where each storage generation is associated with a vault of the DSN. A vault includes virtual storage of the DSN and may be associated with one or more users of the DSN. Incremental storage generations may be added over time to provide incremental storage capacity as a total amount of data stored associated with the vault grows. For example, the DSTN module 22 includes storage generations 1-3 during a first timeframe (e.g., as illustrated in FIGS. 40A-B) and includes storage generations 1-5 during a second timeframe (e.g., as illustrated in FIGS. 40C-D). Each storage generation includes a set of DST execution (EX) units 1-n. Each DST execution unit may be implemented utilizing the DST execution unit 36 of FIG. 1. Hereafter, the DST execution unit may be referred to interchangeably as a storage unit of a set of storage units associated with each storage generation.

The DST client module 34 includes the outbound DST processing 80 of FIG. 3, the inbound DST processing 82 of FIG. 3, and a slice name module 350. The slice name module 350 may be implemented utilizing the processing module 84 of FIG. 3. The DST client module 34 further includes a dispersed storage (DS) module 351. The DS module 351 may be implemented utilizing a plurality of processing modules. For instance, the plurality of processing modules may include the processing module 84 of FIG. 3. As a specific example, the plurality of processing module includes a first module, a second module, a third module, a fourth module, a fifth module, and a sixth module. The first through sixth modules may be utilized to implement the outbound DST processing 80, the inbound DST processing 82, and the slice name module 350. The DSN functions to access data 352 in the DSTN module 22 without utilizing a directory. The accessing of the data 352 includes storing of the data 352 and retrieving stored data to reproduce the data 352.

FIG. 40A illustrates initial steps of an example of the storing of the data 352, where the outbound DST processing 80 receives the data 352 for storage, where the data has a data name. The data name includes file system information. The file system information includes one or more of a user identifier (ID), a vault identifier, and a file system path name for the data. Having received the data 352, the outbound DST processing 80 dispersed storage error encodes the data 352 to produce a plurality of sets of encoded data slices.

Having produced the plurality of sets of encoded data slices, the outbound DST processing 80 generates a plurality of sets of DSN data addresses based on a data object number associated with the data and data storage information. Each set of the plurality of sets of DSN data addresses includes a set of DSN addresses, where the set of DSN addresses includes a set of slice names. Each slice name includes one or more of a slice index corresponding to a particular slice of the set of encoded data slices, a vault ID corresponding to an associated vault, a generation number corresponding to one of the storage generations, the data object number, and a segment number corresponding to the set of encoded data slices. As a specific example, the outbound DST processing 80 utilizes a pseudo random number generator to produce the data object number, performs a system registry lookup to retrieve the vault ID corresponding to a requesting entity, and selects a storage generation of the storage generations to produce the generation number.

The selecting of the storage generation for storing of the data 352 includes at least one of a random selection, selecting a most recently activated storage generation, selecting a storage generation associated with a highest storage availability level, selecting a storage generation based on interpreting a data storage request, selecting a storage generation based on interpreting a system registry entry, and selecting a storage generation associated with a storage availability level that is greater than a storage availability threshold level. For instance, the outbound DST processing 80 selects a most recently activated storage generation 3 as the selected storage generation to produce generation number 3.

The data storage information includes dispersed storage error encoding parameters. The dispersed storage error encoding parameters includes one or more of data segmenting information regarding segmenting the data 352 into a plurality of data segments, a total number of encoded data slices per set of encoded data slices, a decode threshold number of encoded data slices per set of encoded data slices, a read threshold number of encoded data slices per set of encoded data slices, and a write threshold number of encoded data slices per the set of encoded data slices. The outbound DST processing 80 determines the data storage information. The determining includes at least one of performing a system registry lookup, receiving the dispersed storage error encoding parameters, and determining the dispersed storage error encoding parameters based on one or more of received storage requirements and an estimated DSN performance level.

Having generated the plurality of sets of DSN data addresses, the outbound DST processing 80 sends, via the network 24, the plurality of sets of encoded data slices to the DSTN module 22 (e.g., DSN memory) for storage in accordance with the plurality of sets of DSN data addresses. As a specific example, the outbound DST processing 80 generates a set of write slice requests that includes the plurality of sets of encoded data slices and the plurality of sets of DSN data addresses, and outputs the set of write slice requests that includes the plurality of sets of encoded data slices (EDS) 1-*n* of generation 3 to the set of DST execution units 1-*n* of the storage generation 3.

FIG. 40B illustrates final steps of the example of the storing of the data 352, where the outbound DST processing 80 generates retrieval data that is based on the data object number and the data storage information. As a specific example, the outbound DST processing 80 aggregates the data object number, the vault ID and the generation number to produce the retrieval data. Having generated the retrieval data, the outbound DST processing 80 dispersed storage error encodes the retrieval data to produce a set of encoded retrieval data slices.

With the set of encoded retrieval data slices produced, the slice name module 350 generates a set of DSN retrieval data addresses 356 based on the data name 354 and on retrieval data storage information. The set of DSN retrieval data addresses 356 includes a set of slice names for the set of encoded retrieval data slices. Each slice name for a corresponding encoded retrieval data slice includes one or more of a slice index corresponding to a particular slice of the set of encoded retrieval data slices, the vault ID, a generation number for the retrieval data corresponding to at least one of the storage generations, a retrieval data object number, and a segment number corresponding to the set of encoded retrieval data slices. As a specific example, slice name module 350 performs a deterministic function on the data name 354 to produce the retrieval data object number, and selects at least one storage generation of the storage generations to produce the generation number. The deterministic function includes one or more of a hashing function, a hash-based message authentication code function, a mask generating function, and a sponge function. For instance, the slice name module 350 performs the mask generating function on the data name 354 to directly produce the retrieval data object number.

The selecting of the at least one storage generation for storing of the retrieval data includes at least one of a random selection, applying a deterministic function to the data name 354, selecting the most recently activated storage generation, selecting the storage generation associated with the highest storage availability level, selecting the storage generation based on interpreting the data storage request, selecting the storage generation based on interpreting the system registry entry, and selecting the storage generation associated with the storage availability level that is greater than the storage availability threshold level. For instance, the slice name module 350 performs the hashing function on the data name 354 to produce an intermediate result, and takes the intermediate result modulo number of current storage generations to produce generation number 2.

The retrieval data storage information includes dispersed storage error encoding parameters for the retrieval data. The dispersed storage error encoding parameters for the retrieval data includes one or more of a total number of encoded retrieval data slices for the set of encoded retrieval data slices, a decode threshold number of encoded retrieval data slices for the set of encoded retrieval data slices, a read threshold number of encoded retrieval data slices for the set of encoded retrieval data slices, and a write threshold number of encoded retrieval data slices for the set of encoded retrieval data slices. The outbound DST processing 80 determines the retrieval data storage information. Alternatively, the slice name module 350 determines the retrieval data storage information. The determining includes at least one of performing a system registry lookup, receiving the dispersed storage error encoding parameters for the retrieval data, utilizing the dispersed storage error encoding parameters of the data 352, and determining the dispersed storage error encoding parameters for the retrieval data based on one or more of further received storage requirements and the estimated DSN performance level.

With the DSN retrieval data addresses 356 produced, the outbound DST processing 80 sends, via the network 24, the set of encoded retrieval data slices to the DSTN module 22 (e.g., DSN memory) for storage in accordance with the set of DSN retrieval data addresses 356. As a specific example, the outbound DST processing 80 generates another set of write slice requests that includes the set of encoded retrieval data slices and the set of DSN retrieval data addresses 356; and outputs the other set of write slice requests that includes the set of encoded retrieval data slices (ERDS) 1-*n* of generation 2 to the set of DST execution units 1-*n* of the storage generation 2.

Alternatively, or in addition to, one or more of the slice name module 350 and the outbound DST processing 80 may determine to store the retrieval data in at least one other storage generation. As a specific example, the slice name module 350 determines to store multiple copies of the set of encoded retrieval data slices and identifies multiple sets of storage units of the DSN memory for storing the multiple copies. The multiple sets of storage units being part of a logical storage vault within the DSN memory, where a first set of storage units of the set of storage units corresponds to a first generation of the DSN memory and a second set of storage units of the set of storage units corresponds to a second generation of the DSN memory. The determining includes one or more of detecting that a size of the retrieval data is less than a size threshold level, detecting that an available storage capacity level is greater than an available storage capacity threshold level, interpreting a system registry entry, and interpreting a request.

When determining to store multiple copies of the set of encoded retrieval data slices, the slice name module 350 generates a unique set of DSN retrieval data addresses based on the data name, on the retrieval data storage information, and on a corresponding one of the multiple sets of storage units. As a specific example, the slice name module 350 generates another set of DSN retrieval data addresses that includes generation 3 when identifying storage generation 3. With the other set of DSN retrieval data addresses, the outbound DST processing 80 sends, via the network 24, the set of encoded retrieval data slices to the corresponding one of the multiple sets of storage units for storage in accordance with the other set of DSN retrieval data addresses. As a specific example, the outbound DST processing 80 generates yet another set of write slice requests that includes the set of encoded retrieval data slices and the other set of DSN retrieval data addresses 356; and outputs the yet another set of write slice requests that includes the set of encoded retrieval data slices (ERDS) 1-*n* of generation 3 to the set of DST execution units 1-*n* of the storage generation 3.

FIG. 40C illustrates initial steps of the example of the retrieving of the stored data to reproduce the data 352, where the inbound DST processing 82 receives a read request regarding the data, where the read request includes the data name 354. Having received the data name 354, the inbound DST processing 82 estimates likely retrieval data storage information. Alternatively, the slice name module 350 estimates the likely retrieval data storage information. As a specific example, the slice name module 350 determines a logical DSN address to physical storage device mapping (e.g., identifies DSN address ranges corresponding to each current storage generation). As another specific example, the slice name module 350 determines historical use patterns of the DSN memory (e.g., which storage generations hold the most retrieval data). As yet another specific example, the slice name module 350 determines historical storage patterns of a requesting entity that is requesting the read request (e.g., identify likely storage generations associated with storage of retrieval data associated with the requesting entity).

Having estimated the likely retrieval data storage information, the slice name module 350 generates likely DSN retrieval data addresses 358 based on the data name 354 and the likely retrieval data storage information. As a specific example, the slice name module 350 generates the likely DSN retrieval data addresses 358 to include generation 3 when the likely retrieval data storage information includes identification of storage generation 3.

With the likely DSN retrieval data addresses 358 being generated, the inbound DST processing 82 sends read requests to the likely DSN retrieval data addresses 358. As a specific example, the inbound DST processing 82 sends, via the network 24, retrieval data read requests for generation 3, that includes a set of read slice requests 1-*n*, to the set of DST execution units associated with storage generation 3. The set of DST execution units 1-*n* issues read slice responses to the inbound DST processing 82, where the read slice responses includes encoded retrieval data slices of generation 3.

When favorable responses to the read requests have been received, the inbound DST processing 82 reconstructs the retrieval data. Having reconstructed the retrieval data, the inbound DST processing 82 utilizes the retrieval data to reconstruct the data. The reconstruction of the data is discussed in greater detail with reference to FIG. 40D.

When the favorable responses to the read requests have not been received (e.g., if the read requests were sent to storage generation 4 instead of 3), at least one of the inbound DST processing 82 and the slice name module 350 estimates a second likely retrieval data storage information and generates second likely DSN retrieval data addresses based on the data name and the second likely retrieval data storage information. For example, the slice name module 350 generates second likely DSN retrieval data addresses for generation 3. Having generated the second likely DSN retrieval data addresses, the inbound DST processing 82 sends second read requests to the second likely DSN retrieval data addresses. For example, the inbound DST processing 82 sends, via the network 24, retrieval data read requests for generation 3 to the set of DST execution units associated with storage generation 3. When favorable responses to the second read requests have been received, the inbound DST processing 82 reconstructs the retrieval data and utilizes the retrieval data to reconstruct the data.

Alternatively, or in addition to, at least one of the inbound DST processing 82 and the slice name module 350 determines to recover the retrieval data from at least two storage generations. The determining includes at least one of interpreting a request, interpreting another system registry entry, and detecting that a system loading level is less than a system loading threshold level. When recovering from the at least two storage generations, at least one of the inbound DST processing 82 and the slice name module 350 estimates the second likely retrieval data storage information. With the second likely retrieval data storage information, the slice name module 350 generates the second likely DSN retrieval data addresses based on the data name 354 and the second likely retrieval data storage information. With the second likely DSN retrieval data addresses, the inbound DST processing 82 sends, via the network 24, the second read requests to the second likely DSN retrieval data addresses. When favorable responses to either of the read requests or the second read requests have been received, the inbound DST processing 82 reconstructs the retrieval data and utilizes the retrieval data to reconstruct the data.

FIG. 40D illustrates final steps of the example of the retrieving of the stored data to reproduce the data 352, where the inbound DST processing 82 extracts the DSN data addresses from the reconstructed retrieval data and issues data retrieval requests to the DSTN module 22 in accordance with the extracted DSN data addresses. As a specific example, the inbound DST processing 82 generates a set of read slice requests that includes the plurality of sets of DSN data addresses based on the extracted DSN data addresses. Having generated the set of read slice requests, the inbound DST processing 82 sends the set of read slice requests to the set of DST execution units 1-*n* of storage generation 3, where the read slice requests includes read slice requests for the plurality of encoded data slices stored in storage generation 3. The set of DST execution units 1-*n* of storage generation 3 sends encoded data slices of generation 3 to the inbound DST processing 82. The inbound DST processing 82 decodes received encoded data slices to reproduce the data 352.

Figure 40E:
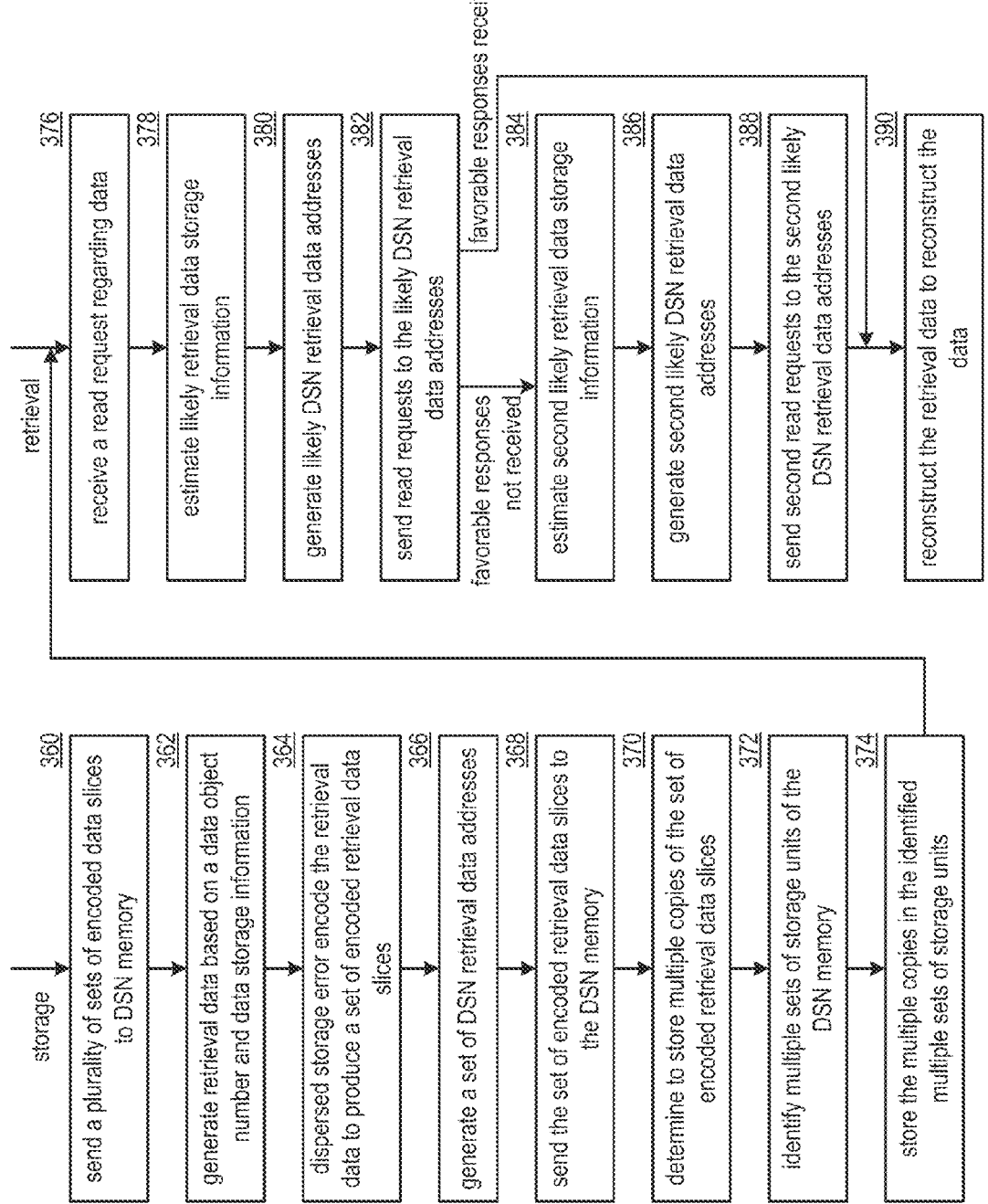
FIG. 40E is a flowchart illustrating an example of accessing data in accordance with the present disclosure.

FIG. 40E is a flowchart illustrating an example of accessing data. The method includes storage where at step 360 a processing module (e.g., of a distributed storage and task (DST) client module of a dispersed storage network (DSN)) sends a plurality of sets of encoded data slices to DSN memory for storage in accordance with a plurality of sets of DSN data addresses. The data was dispersed storage error encoded to produce the plurality of sets of encoded data slices. The data has a data name and the plurality of sets of DSN data addresses is generated based on a data object number associated with the data and data storage information. The data name includes file system information. The processing module may utilize a pseudo random number generator to produce the data object number. The processing module may determine, as the data storage information, dispersed storage error encoding parameters.

The method continues at step 362 where the processing module generates retrieval data that is based on the data object number and the data storage information. For example, the processing module generates the retrieval data to include a source name associated with the sets of DSN data addresses. The method continues at step 364 where the processing module dispersed storage error encodes the retrieval data to produce a set of encoded retrieval data slices.

The method continues at step 366 where the processing module generates a set of DSN retrieval data addresses based on the data name and on retrieval data storage information. For example, the processing module performs a deterministic function on the data name to produce a retrieval data object number. The processing module may determine, as the retrieval data storage information, dispersed storage error encoding parameters. The method continues at step 368 where the processing module sends the set of encoded retrieval data slices to the DSN memory for storage therein in accordance with the set of DSN retrieval data addresses.

The processing module may facilitate storage of multiple copies of the set of encoded retrieval data slices. The method continues at step 370 where the processing module determines to store multiple copies of the set of encoded retrieval data slices. The method continues at step 372 where the processing module identifies multiple sets of storage units of the DSN memory for storing the multiple copies. The multiple sets of storage units being part of a logical storage vault within the DSN memory, where a first set of storage units of the set of storage units corresponds to a first generation of the DSN memory and a second set of storage units of the set of storage units corresponds to a second generation of the DSN memory.

For each copy of the multiple copies, the method continues at step 374 where the processing module stores the multiple copies in the identified multiple sets of storage units. For example, the processing module generates a unique set of DSN retrieval data addresses based on the data name, on the retrieval data storage information, and on a corresponding one of the multiple sets of storage units. Next, the processing module sends the set of encoded retrieval data slices to the corresponding one of the multiple sets of storage units for storage therein in accordance with the unique set of DSN retrieval data addresses.

When retrieving the data, the method includes step 376 where the processing module receives a read request regarding the data, where the read request includes the data name. The method continues at step 378 where the processing module estimates likely retrieval data storage information (e.g., estimates most probable generations). The estimating the likely retrieval data storage information includes one or more of determining a logical DSN address to physical storage device mapping, determining historical use patterns of the DSN memory, and determining historical storage patterns of a requesting entity that is requesting the read request.

The method continues at step 380 where the processing module generates likely DSN retrieval data addresses based on the data name and the likely retrieval data storage information. The method continues at step 382 where the processing module sends read requests to the likely DSN retrieval data addresses. The processing module may receive responses to the read requests. When favorable write responses to the read requests have been received, the method branches to step 390. When the favorable responses to the read requests have not been received, the method continues to step 384.

The method continues at step 384 where the processing module estimates second likely retrieval data storage information when the favorable responses to the read requests have not been received. The method continues at step 386 where the processing module generates second likely DSN retrieval data addresses based on the data name and the second likely retrieval data storage information. The method continues at step 388 where the processing module sends second read requests to the second likely DSN retrieval data addresses. When the favorable responses to the read requests or second read requests have been received, the method continues at step 390 where the processing module reconstructs the retrieval data and utilizes the retrieval data to reconstruct the data.

Alternatively, or in addition to, the processing module may attempt to recover the retrieval data from multiple potential storage locations. As a specific example, the processing module estimates the second likely retrieval data storage information and generates the second likely DSN retrieval data addresses based on the data name and the second likely retrieval data storage information. The processing module sends the second read requests to the second likely DSN retrieval data addresses. When the favorable responses to either of the read requests or the second read requests have been received, the processing module reconstructs the retrieval data and utilizes the retrieval data to reconstruct the data.

Figure 41:
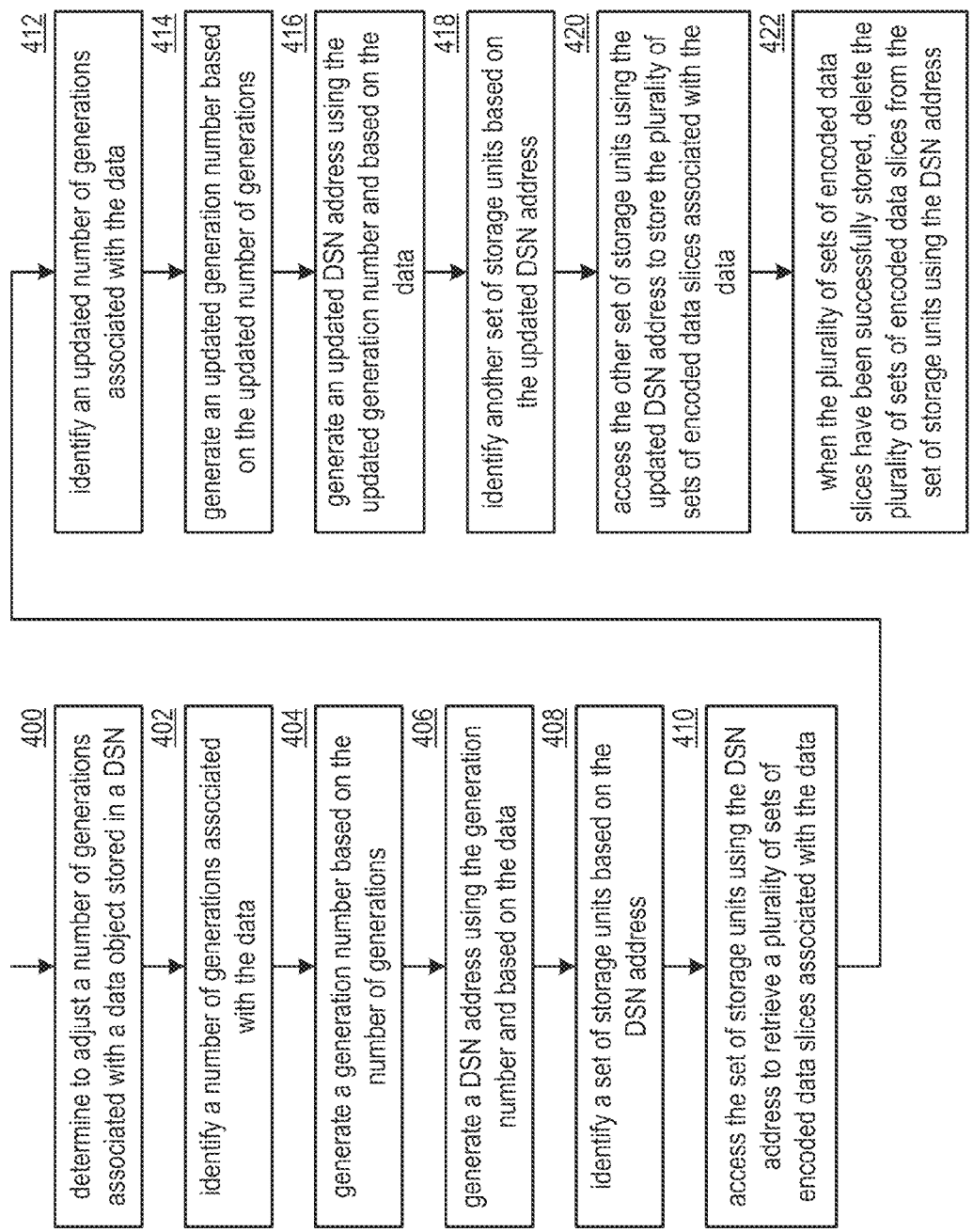
FIG. 41 is a flowchart illustrating an example of updating a dispersed storage network (DSN) address in accordance with the present disclosure.

FIG. 41 is a flowchart illustrating an example of updating a dispersed storage network (DSN) address. The method includes step 400 where a processing module (e.g., of a distributed storage and task (DST) processing unit) determines to adjust a number of generations associated with a data object stored in a dispersed storage network (DSN). The determining may include at least one of determining to add a generation when an amount of data associated with the data is growing and determining to delete a generation when the amount of data associated with the data a shrinking.

The method continues at step 402 where the processing module identifies a number of generations associated with the data. The identifying includes looking up a current number of generations associated with the data for a write request and estimating a number of generations that existed when the data was written when the access is the read request. The method continues at step 404 where the processing module generates a generation number based on the number of generations. The generating includes performing a deterministic function on the data identifier and the number of generations to produce the generation number. For example, the processing module obtains at least a portion (e.g., a vault identifier (ID) field entry, an object number field entry) of a dispersed storage network (DSN) address associated with the data, performs a deterministic function on the portion of the DSN address to produce a source name reference, and taking the source name reference modulo number of generations to produce the generation number.

The method continues at step 406 where the processing module generates a DSN address using the generation number and based on the data. For example, the processing module utilizes the generation number in a generation field of the DSN address, obtains a data ID, performs a registry lookup to identify the vault ID for a vault ID field of the DSN address based on an accessing entity ID, and obtains an object number for an object number field of the DSN address associated with the data ID (e.g., look up in a directory or a dispersed hierarchical index; generate as a random number when writing the data). The method continues at step 408 where the processing module identifies a set of storage units based on the DSN address. The identifying includes at least one of performing a DSN address-to-physical address table lookup using the DSN address, initiating a query, and performing a generation-to-storage set table lookup using the generation number.

The method continues at step 410 where the processing module accesses the set of storage units using the DSN address to retrieve a plurality of sets of encoded data slices associated with the data. For example, the processing module generates and sends a plurality of sets of read slice requests to the set of storage units and receive a plurality of at least a decode threshold number of read slice responses for each of the sets of read slice requests. The method continues at step 412 where the processing module identifies an updated number of generations associated with the data. The identifying includes adding or subtracting a generation based on one or more of a volume of stored data trend, a request, receiving an error message, and detecting a new set of storage units. For example, the processing module determines to add a new generation when detecting the new set of storage units. As another example, the processing module determines to delete a generation when detecting that a current volume of stored data is less than a low store data threshold level.

The method continues at step 414 where the processing module generates an updated generation number based on the updated number of generations. For example, the processing module performs a deterministic function on a data identifier and the updated number of generations to produce the updated generation number. The method continues at step 416 where the processing module generates an updated DSN address using the updated generation number and based on the data. The generating includes at least one of obtaining a data identifier, performing a lookup based on a vault identifier, obtaining an object number, and performing a lookup. The lookup may include one or more of accessing a registry, accessing a directory, and accessing a dispersed hierarchical index. The method continues at step 418 where the processing module identifies another set of storage units based on the updated DSN address. The identifying includes at least one of performing a lookup, initiating a query, and identifying the other set of storage units based on the updated generation number of the updated DSN address.

The method continues at step 420 where the processing module accesses the other set of storage units using the updated DSN address to store the plurality of sets of encoded data slices associated with the data. The accessing includes issuing one or more sets of write slice requests to the other set of storage units where the requests includes slice names based on the updated DSN address. When the plurality of sets of encoded data slices have been successfully stored, the method continues at step 422 where the processing module deletes the plurality of sets of encoded data slices from the set of storage units using the DSN address. The deleting includes issuing one or more sets of delete slice requests to the set of storage units that includes slice names based on the DSN address.

Figure 42:
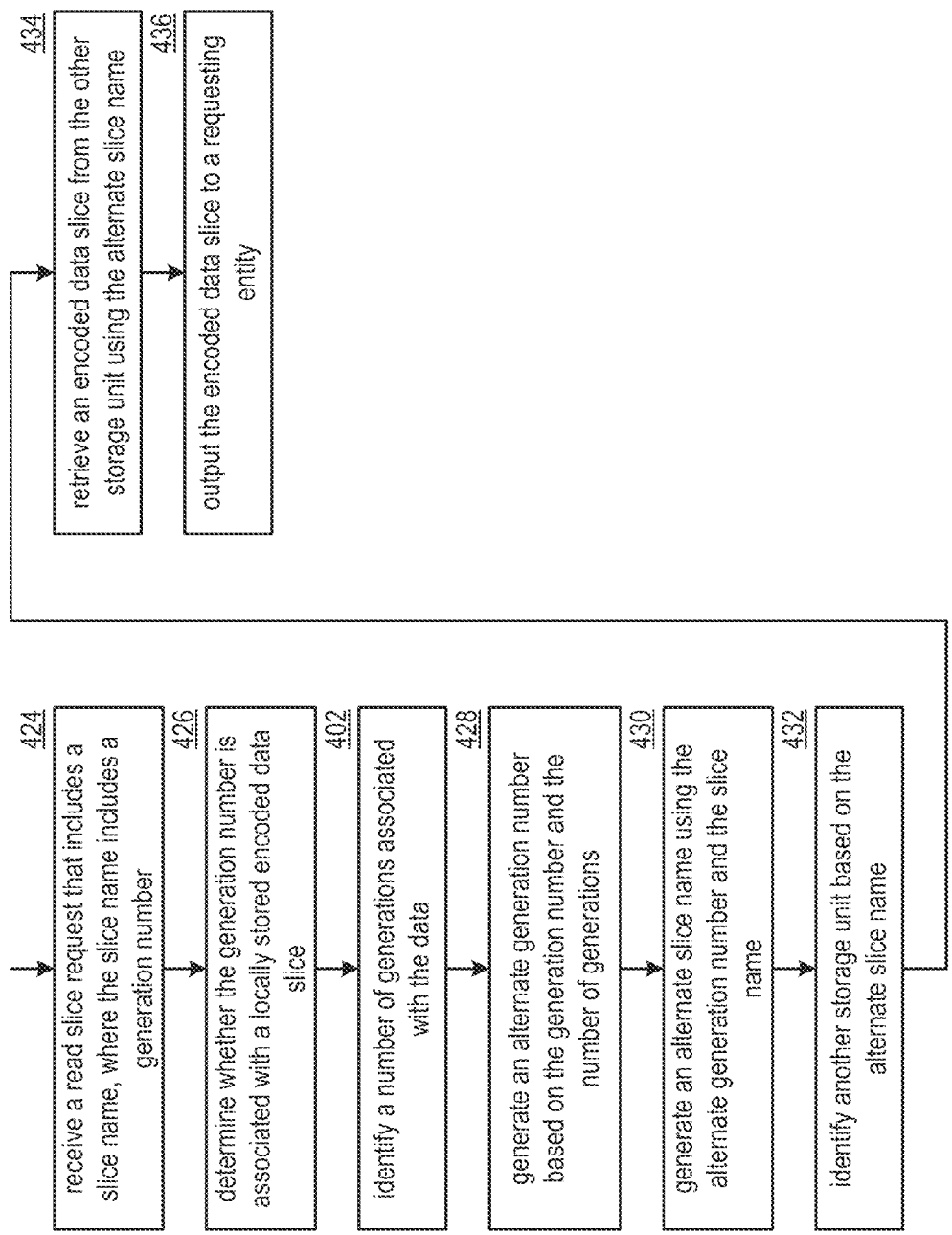
FIG. 42 is a flowchart illustrating an example of accessing an encoded data slice in accordance with the present disclosure.

FIG. 42 is a flowchart illustrating an example of accessing an encoded data slice, which includes similar steps to FIG. 41. The method includes step 424 where a processing module (e.g., of a distributed storage and task (DST) execution unit) receives a read slice request that includes a slice name, where the slice name includes a generation number. The method continues at step 426 where the processing module determines whether the generation number is associated with a locally stored encoded data slice. The determining may be based on accessing a local slice list. The method continues with step 402 of FIG. 41 where the processing module identifies a number of generations associated with the data.

The method continues at step 428 where the processing module generates an alternate generation number based on the generation number and the number of generations. The processing module may increment or decrement the generation number based on a comparison of another generation number that is associated with locally stored encoded data slices and perform a deterministic function on the data identifier and the number of generations. The method continues at step 430 where the processing module generates an alternate slice name using the alternate generation number and the slice name. The generating includes replacing the generation number with the alternate generation number in the slice name to produce the alternate slice name.

The method continues at step 432 where the processing module identifies another storage unit based on the alternate slice name. The identifying includes accessing a list of storage units associated with a set of generation number is associated with the slice name. The method continues at step 434 where the processing module retrieves an encoded data slice from the other storage units using the alternate slice name. The retrieving includes issuing a read slice requests to the other storage unit, where the request includes the alternate slice name. The processing module receives the encoded data slice from the other storage unit. The method continues at step 436 where the processing module outputs the encoded data slice to a requesting entity. Alternatively, or in addition to, the processing module stores the encoded data slice in a local memory and updates slice location information.

FIGS. 43A, 43C-F are schematic block diagrams of an embodiment of a dispersed storage network (DSN) illustrating an example of time-based storage of data. The DSN includes the distributed storage and task (DST) client module 34 of FIG. 1, the network 24 of FIG. 1, and the distributed storage and a DST execution (EX) unit set 438. The DST execution unit set 438 includes a set of DST execution units 1-5. Each DST execution unit may be implemented utilizing the DST execution unit 36 of FIG. 1. Hereafter, the DST execution unit set 438 may be referred to interchangeably as one or more of DSN memory, a set of storage units, and a storage unit set; and the DST execution unit may be referred to interchangeably as a storage unit.

The DST client module 34 includes the outbound DST processing 80 of FIG. 3. The DST client module 34 may further include a dispersed storage (DS) module 441. The DS module 441 may be implemented utilizing a plurality of processing modules. For instance, the plurality of processing modules may include the processing module 84 of FIG. 3. As a specific example, the plurality of processing module includes a first module, a second module, a third module, and a fourth module. The first through fourth modules may be utilized to implement the outbound DST processing 80. The DSN functions to time-based store a large data object 442 in the DST execution unit set 438. The large data object 442 may include at least one of a video file, a records file, a collection of images file a documentation file, or any other data object that has a data object size greater than a size threshold level, where the size threshold level is associated with a storage process that has a time to completion of storage that compares unfavorably to a potential change in availability of the DST execution unit set 438. For example, the availability of the DST execution unit set 438 may change during a time frame that the large data object is being stored to the DST execution unit set 438.

FIG. 43A illustrates initial steps of an example of the storing of the large data object 442, where the outbound DST processing 80 receives the large data object 442. Having received the large data object 442, the outbound DST processing 80 encodes the large data object 442 in accordance with a dispersed storage error coding function to produce a plurality of sets of encoded data slices. As a specific example, the outbound DST processing 80 generates encoded data slice sets 1-M as the plurality of sets of encoded data slices and temporarily stores the encoded data slice sets 1-M in a send queue 440.

Having cached the encoded data slice sets 1-M, the outbound DST processing 80 obtains estimated future availability information for storage units of the DSN. As a specific example, the outbound DST processing 80 obtains availability information 444 from the DST execution unit set 438. The availability information 444 includes one or more of an expected pattern of availability, expected start time of and availability level transition, expected duration of a next availability period, a maintenance schedule, a historical availability record, and an indication of a pending software update. As a specific example, the set of DST execution units 1-5 send, via the network 24, availability information 1-5 as the availability information 444 to the outbound DST processing 80. Having received the availability information 444, the outbound DST processing 80 interprets the availability information 444 to produce the estimated future availability information for the storage units. The generation and utilization of the estimated future availability information is discussed in greater detail with reference to FIG. 43B.

FIG. 43B is a timing diagram illustrating an example of generating a time-availability pattern. The timing diagram includes a mapping of the estimated future availability information 446 versus time 448 and to a time-availability pattern 450. As a specific example, the mapping of the estimated future availability information 446 versus time 444 indicates that DST execution unit 1 is expected to be available from a current time of t0 until a time of t2, unavailable from t2 to t8 due to a scheduled software update, and available again from t8 to t10. The example mapping also indicates that DST execution unit 2 is expected to be available from t0 to t5, unavailable from t5 to t8 due to scheduled maintenance, and available from t8 to t10. The example mapping also indicates that DST execution unit 3 is expected to be available from t0 to t6 and unavailable from t6 to t10 due to a scheduled power shutdown. The example mapping also indicates that DST execution units 4 and 5 are expected to be available from t0 to t10.

Having obtained the estimated future availability information 446, the outbound DST processing 80 of FIG. 43A organizes the plurality of sets of encoded data slices into a plurality of group-sets of encoded data slices, where a group-set of encoded data slices includes multiple sets of encoded data slices. As a specific example, the outbound DST processing 80 organizes encoded slice sets 1 through M1 (e.g., of encoded slice sets 1-M) into a first group-set of encoded data slices to be associated with a first write transaction, encoded slice sets M1+1 through M2 into a second group-set of encoded data slices to be associated with a second write transaction, encoded slice sets M2+1 through M3 into a third group-set of encoded data slices to be associated with a third write transaction, and encoded slice sets M3+1 through M into a fourth group-set of encoded data slices to be associated with a fourth write transaction.

For each of the plurality of group-set of encoded data slices, the outbound DST processing 80 estimates an approximate storage completion time to produce a plurality of approximate storage completion times. The estimating of the approximate storage completion time may be based on one or more of a network performance level of the network 24, a loading level for the DST execution unit set 438, a previous write transaction, a number of encoded data slices of the group-set of encoded data slices, and a size of each of the encoded data slices. As a specific example, the outbound DST processing 80 estimates that the first group-set of encoded data slices has an approximate storage completion time of a time duration associated with a time from t0 to t2.

Having estimated the approximate storage completion times, the outbound DST processing 80 obtains a write threshold number. The write threshold number includes a minimum number of available storage units of the set of storage units to facilitate favorable write transactions of each of the group-sets of encoded data slices. The write threshold number is greater than or equal to a decode threshold number and is less than or equal to an information dispersal algorithm (IDA) width, where the decode threshold number and IDA width are associated with the dispersed storage error coding function. The IDA width includes a number of encoded data slices of each set of encoded data slices and the decode threshold number includes a minimum number of encoded data slices required to recover data associated with a set of encoded data slices.

Having obtained the write threshold number, the outbound DST processing 80 establishes the time-availability pattern 450 for writing the plurality of group-sets of encoded data slices to the storage units based on the estimated future availability information, the plurality of approximate storage completion times, and the write threshold number. The time-availability pattern 450 includes a plurality of time intervals and an availability indication for each of the storage units in each time interval of the plurality of time intervals. The storing of a group-set of the plurality of group-sets of encoded data slices spans at least one time interval of the plurality of time intervals.

As a specific example of the time-availability pattern 450, the outbound DST processing 80 establishes the time-availability pattern 450 to include writing the first group-set of encoded data slices during time interval t0-t2 when all five storage units are expected to be available, writing the second group-set of encoded data slices during time interval t2-t5 when four of the five storage units are available and the write threshold number is three, writing the third group-set of encoded data slices during time interval t5-t6 when three of the five storage units are available and the write threshold number is three, performing no writing during time interval t6-t8 when less than the write threshold number of storage units are expected to be available, and writing the fourth-set of encoded data slices during time interval t8-t10 when four of the five storage units are expected to be available and the write threshold number is three.

The time-availability pattern 450 may further include an indication to send or withhold particular encoded data slices of a given set of encoded data slices based on the estimated future availability information 446. As a specific example, the outbound DST processing 80 determines to withhold sending encoded data slices to DST execution unit 1 during the timeframe t2-t5 associated with the second write transaction when DST execution unit 1 is expected to be unavailable. For instance, the outbound DST processing 80 holds encoded data slices associated with DST execution unit 1 in the send queue 440 during time interval t2-t8 and sends the held encoded data slices (e.g., unwritten encoded data slices from the second and third write transactions) to the DST execution unit 1 over the time interval t8-t10.

FIG. 43C illustrates further steps of an example of the storing of the large data object 442, where the outbound DST processing 80 sends the plurality of group-sets of encoded data slices to at least some of the storage units for storage in accordance with the time-availability pattern 450. The sending includes, for each of the plurality of group-set of encoded data slices, the outbound DST processing 80 assigning a transaction number (e.g., transaction numbers 1-4 for the four group-sets of encoded data slices) and generating a write request for each available storage unit per the time-availability pattern 450 to produce a set of write requests, where each write request of the set of write requests includes the transaction number. As a specific example, the outbound DST processing 80 initiates a write transaction 1 at time t0. For instance, the outbound DST processing 80 sends, via the network 24, a set of write slice requests 1-1 through 1-5 to DST execution units 1-5, where the set of write slice request includes the first group-set of encoded data slices and the transaction number 1.

When, sending a given group-set of the plurality of group-sets of encoded data slices, one of the storage units was listed as unavailable, the outbound DST processing 80 queues sending an encoded data slice of each set of the given group-set of encoded data slices and when the one of the storage units is available and when another given group-set of the plurality of group-sets of encoded data slices is being sent to the storage units, the outbound DST processing 80 sends the encoded data slice of each set of the given group-set of encoded data slices to the one of the storage units.

FIG. 43D illustrates further steps of an example of the storing of the large data object 442, where the outbound DST processing 80 compares, as time passes, actual availability information of the storage units with corresponding time portions of the estimated future availability information 446. As a specific example, the outbound DST processing 80 re-obtains the availability information 444 from the DST execution unit set 438 prior to time t2. When the actual availability information does not substantially match the estimated future availability information 446 for the corresponding time portions, the outbound DST processing 80 adjusts the time-availability pattern 450 based on a difference between the actual availability information and estimated future availability information for the corresponding time portions. For instance, the outbound DST processing 80 suspends sending of a next group-set of encoded data slices when the actual availability information for a next time frame indicates that less than the write threshold number of storage units are estimated to be available.

Alternatively, or in addition to, when, during the sending a given group-set of the plurality of group-sets of encoded data slices, less than the write threshold number of storage units are available, the outbound DST processing 80 ceases the sending of the given group-set of the plurality of group-sets of encoded data slices and queues the given group-set of the plurality of group-sets of encoded data slices for sending to the at least some of the storage units when at least the write threshold number of storage units are available.

FIG. 43E illustrates further steps of an example of the storing of the large data object 442, where the outbound DST processing 80 initiates a write transaction 2 at time t2. For instance, the outbound DST processing 80 sends, via the network 24, a set of write slice requests 2-1 through 2-5 to DST execution units 1-5, where the set of write slice request includes the second group-set of encoded data slices and the transaction number 2.

FIG. 43F illustrates further steps of an example of the storing of the large data object 442, where the outbound DST processing 80 compares further actual availability information of the storage units with corresponding time portions of the estimated future availability information 446. As a specific example, the outbound DST processing 80 re-obtains the availability information 444 from the DST execution unit set 438 prior to time t5 and interprets the re-obtained availability information 444 to produce the further actual availability information. When the further actual availability information does not substantially match the estimated future availability information 446 for the corresponding time portions, the outbound DST processing 80 adjusts the time-availability pattern 450 based on a difference between the further actual availability information and estimated future availability information for the corresponding time portions.

FIG. 43G is a flowchart illustrating an example of time-based storage of data. In particular a method is presented for use in conjunction with one or more functions and features described in conjunction with FIGS. 1-39 and also FIGS. 43A-F. The method includes step 460 where a processing module (e.g., of a distributed storage and task (DST) client module of a dispersed storage network (DSN)) obtains estimated future availability information for storage units of the DSN. For example, the processing module receives the estimated future availability information from the storage units.

The method continues at step 462 where the processing module organizes a plurality of sets of encoded data slices into a plurality of group-sets of encoded data slices. A group-set of encoded data slices includes multiple sets of encoded data slices. The data is encoded in accordance with a dispersed storage error coding function to produce the plurality of sets of encoded data slices. Dispersal parameters are associated with the dispersed storage error coding function. The dispersal parameters includes one or more of an information dispersal algorithm width (e.g., a number of encoded data slices of each set of encoded data slices), a write threshold number (e.g., a subset number of the IDA width required to successfully write a representation of the set of encoded data slices to the storage units), and a decode threshold number (e.g., a minimum number of encoded data slices of the set of encoded data slices required to recover data represented by the set of encoded data slices).

For each of the plurality of group-sets of encoded data slices, the method continues at step 464 where the processing module estimates an approximate storage completion time to produce a plurality of approximate storage completion times. The method continues at step 466 where the processing module obtains the write threshold number (e.g., retrieves from system registry information, receives, determines based on storage requirements and a system performance level).

The method continues at step 468 where the processing module establishes a time-availability pattern for writing the plurality of group-sets of encoded data slices to the storage units based on the estimated future availability information, the plurality of approximate storage completion times, and the write threshold number. The establishing may include comparing, as time passes, actual availability information of the storage units with corresponding time portions of the estimated future availability information and when the actual availability information does not substantially match the estimated future availability information for the corresponding time portions, adjusting the time-availability pattern based on a difference between the actual availability information and estimated future availability information for the corresponding time portions.

The method continues at step 470 where the processing module sends the plurality of group-sets of encoded data slices to at least some of the storage units for storage in accordance with the time-availability pattern. The sending includes, for each of the plurality of group-sets of encoded data slices, assigning a transaction number and generating a write request for each available storage unit per the time-availability pattern to produce a set of write requests, where each write request of the set of write requests includes the transaction number. Alternatively, or in addition to, when, for the sending of a given group-set of the plurality of group-sets of encoded data slices, one of the storage units was listed as unavailable, the processing module queues sending an encoded data slice of each set of the given group-set of encoded data slices. When the one of the storage units is available and when another given group-set of the plurality of group-sets of encoded data slices is being sent to the storage units, the processing module sends the encoded data slice of each set of the given group-set of encoded data slices to the one of the storage units.

Alternatively, or in addition to, when, during the sending a given group-set of the plurality of group-sets of encoded data slices, less than the write threshold number of storage units are available, the processing module ceases the sending of the given group-set of the plurality of group-sets of encoded data slices and queues the given group-set of the plurality of group-sets of encoded data slices for sending to the at least some of the storage units when at least the write threshold number of storage units are available.

FIG. 44A is a schematic block diagram of another embodiment of a distributed storage and task (DST) execution unit 36 of FIG. 11. The DST execution unit 36 includes an interface 169, the memory 88, the controller 86, a plurality of distributed task (DT) execution modules 90, and a plurality of DST client modules 34. In an example of operation, the controller 86 obtains status of the plurality of DT execution modules 90 and the plurality of DST client modules 34. The obtaining includes one or more of issuing a task control message 480 to the plurality of DT execution modules 90, issuing a DST control message 482 to the plurality of DST client modules 34, receiving a task control message 480 from one or more of the DT execution modules 90 that includes the status, and receiving a DST control message 482 from one or more of the DST client modules 34 that includes the status. The status includes one or more of processing utilization level information, memory utilization level information, garbage collection logs, error information, and pending activity information.

In an example of operation, the controller 86 receives a request via the interface 169, where the request includes at least one of a slice processing request and a partial task 98. The controller 86 identifies a resource type based on the request (e.g., a DT execution module type for the partial task 98 and a DST client module type for the slice processing request). The controller 86 determines whether the resource type is available based on the status. When the resource type is available, the controller 86 selects a particular resource for assignment of the request. For example, the controller 86 identifies a third DST client module 34 that is most available for the request when the request is the slice processing request. As another example, the controller 86 selects a fourth DT execution module 90 when the fourth DT execution module 90 is associated with processing resources capable of executing the partial task 98 when the request is the partial task 98. The controller 86 assigns the request to the selected resource. The assigning includes at least one of outputting an assignment task control message to an assigned DT execution module 90 and outputting an assignment DST control message to the assigned DST client module. When the resource type is not available, the controller 86 may issue an error response via the interface 169 to a requesting entity and/or to a managing unit.

The assigned DT execution module 90 executes the assigned partial task 98 to produce partial results 102. Alternatively, or in addition to, the assigned DT execution module 90 facilitates the memory 88 to retrieve slices 96 and to output results 104. The assigned DST client module 34 executes the slice processing request to facilitate producing at least one of sub-slice groupings 170 and sub-partial partial tasks 172. Alternatively, or in addition to, the DST client module 34 may facilitate the memory 88 to provide slices 100 and/or two receives slices 96 for further slice processing.

FIG. 44B is a flowchart illustrating an example of assigning resources. The method includes step 484 where a processing module (e.g., of a controller module) obtains resource status information for a plurality of task execution modules and a plurality of dispersed storage modules. The obtaining includes at least one of receiving, issuing a query, performing a lookup, accessing a historical record, and interpreting an activity log. The method continues at step 486 where the processing module receives a request. The method continues at step 488 where the processing module identifies a resource type based on the request. For example, the processing module identifies the resource type based on a type of the request. For instance, the processing module identifies a distributed task execution module receiving a partial task requests. In another instance, the processing module identifies a distributed storage and task client module type when receiving a slice processing request. The processing module may identify another resource type for another request type.

The method continues at step 490 where the processing module determines whether the resource type is available. For example, for each resource, the processing module interprets pending request to produce a predicted loading level and compares the predicted loading level to an upper loading level threshold. The processing module indicates availability when the comparison is favorable (e.g., more capacities available than required). The method branches to step 494 when the resource type is available. The method continues to step 492 when the resource type is not available. The method continues at step 492 where the processing module issues an error response when the resource type is not available. The issuing of the error response includes generating an error message and sending the error message to at least one of a requesting entity and a managing unit.

The method continues at step 494 where the processing module selects at least one resource of the plurality of task execution modules and the plurality of dispersed storage modules when the resource type is available. For example, the processing module identifies a resource associated with a most favorable comparison of predicted loading to available loading (e.g., most available capacity). The method continues at step 496 where the processing module assigns the request to the selected at least one resource. For example, the processing module sends the request to the selected resource.

FIG. 45A is a schematic block diagram of another embodiment of a dispersed storage network (DSN) system that includes the distributed storage and task network (DSTN) module 22 of FIG. 1, a set of distributed storage and task (DST) processing units 1-N, where each DST processing unit includes the DST processing unit 16 of FIG. 1, and a load-balancing module 498. The DSTN module 22 includes the DST execution unit set 438 of FIG. 43A. The DST execution unit set 438 includes a set of DST execution units 36 of FIG. 1.

The system functions to store data 500 as a plurality of sets of encoded data slices 504 in the DST execution unit set 438. The load-balancing module 498 selects one of the DST processing units, based on resource status information 502 from the DST processing units, to encode the data 500 using a dispersed storage error coding function to produce the plurality of sets of encoded data slices 504 for storage in the DST execution unit set 438. The resource status information 502 includes one or more of an indicator of a time frame of availability, an indicator of a time frame of unavailability, a time frame for a scheduled software update, a time frame for a scheduled new hardware addition, an error message, a maintenance schedule, a communications error rate, and a storage error rate.

In an example of operation, a DST processing unit determines to at least temporarily suspend operations. The determining may be based on one or more of adding new software, activating new hardware, recovering from a storage error, recovering from a communications error, receiving a suspend request, and interpreting the maintenance schedule. The DST processing unit continues to perform a slice access activity with regards to pending data access requests associated with the DST processing unit. The load-balancing module 498 receives a new data access request. The load-balancing module 498 determines availability of each of the DST processing units based on one or more of receiving resource status information 502, initiating a query, receiving an error message, and detecting an unfavorable performance (e.g., detecting slow response latency). The load-balancing module 498 selects the DST processing unit when the availability (e.g., previously known availability) of the DST processing unit compares favorably to availability of other DST processing units. The load-balancing module 498 forwards the data access requests to the DST processing unit.

While suspending operations, the DST processing units indicates the unfavorable performance to the load-balancing module. The indicating unfavorable performance includes at least one of ignoring the request, sending a late unfavorable response, issuing unfavorable resource status information, and ignoring resource status requests from the load-balancing module. The load-balancing module 498 interprets the indication to determine that the data access request is to be reassigned. The load-balancing module 498 un-selects the DST processing unit from the data access assignment. For example, the load-balancing module sends a cancellation message to the DST processing unit and selects another DST processing unit and sends the data access request to the other DST processing unit.

FIG. 45B is a diagram illustrating an example of load-balancing. The method includes step 506 where a distributed storage and task (DST) processing unit determines to temporarily suspend operations. The method continues at step 508 where the DST processing unit continues to execute pending operations. For example, the DST processing unit continues to process previously accepted data access requests. The method continues at step 510 where a load-balancing module receives a data access request. The method continues at step 512 where the load-balancing module assesses availability of a set of DST processing units that includes the DST processing unit. The assessing includes producing availability information based on one or more of interpreting performance indicators, receiving resource status information, initiating a query, receiving an error message, and detecting favorable performance.

The method continues at step 514 where the load-balancing module selects the DST processing unit for execution of the data access request. For example, the load-balancing module selects the DST processing unit when availability of the DST processing unit compares more favorably to availability of other DST processing units. The method continues at step 516 where the load-balancing module forwards the data access request to the DST processing unit.

The method continues at step 518 where the DST processing unit indicates unfavorable performance. For example, the DST processing unit ignores the data access requests. As another example, the DST processing unit waits a delay time period before sending a data access response causing the load-balancing module to interpret the data access response as a late data access response associated with unfavorable performance. As yet another example, the DST processing unit delays responses associated with previous accepted data access requests. The method continues at step 520 where the load-balancing module detects the indicated unfavorable performance. For example, the load-balancing module detects the indicated unfavorable performance when the data access response was not received within a desired response timeframe.

The method continues at step 522 where the load-balancing module un-selects the DST processing unit for execution of the data access request. The un-selecting includes one or more of sending a cancellation message to the DST processing unit, selecting another DST processing unit for the data access request, and assigning the other DST processing unit the data access request.

The method continues at step 524 where the DST processing unit determines to resume operations. The determining may be based on one or more of detecting that new software is operational, detecting that new hardware is operational, detecting that an error condition has cleared, and detecting that a level of pending data access requests has fallen below a low data access request threshold level. The method continues at step 526 where the DST processing unit indicates favorable performance. For example, the DST processing unit generates data access responses in accordance with desired data access response timing. As another example, the DST processing unit responds to all data access requests. As yet another example, the DST processing unit sends favorable resource status information to the load-balancing module.

FIG. 46A is a schematic block diagram of another embodiment of a distributed storage and task (DST) execution unit 36 that includes the distributed storage and task (DST) client module 34 and one or more memory devices 88 of FIG. 3. The memory 88 includes a plurality of portions of memory associated with different utilizations. The portions may be physical memory or virtual memory space. The plurality of portions includes one or more portions utilized for slices memory 606, utilized for rebuilt slices memory 608, reserved for rebuilt slices memory 610, and un-utilized memory 612. The un-utilized memory 612 is associated with available storage capacity, where the available storage capacity may be calculated as a memory size minus memory used for each of the utilized for slices memory 606, memory used for the utilized for rebuilt slices memory 608, and memory used for the reserved for rebuilt slices memory 610.

The DST execution unit 36 functions to store encoded data slices 600 in the utilized for slices memory 606 and store rebuilt encoded data slices 602 in the utilized for rebuilt slices memory 608. The DST client module 34 may obtain the rebuilt encoded data slices by at least one of: receiving the rebuilt encoded data slices and generating the rebuilt encoded data slices by retrieving representations of encoded data slices from a decode threshold number of other DST execution units 36. When encoded data slices are to be stored, the DST client module 34 determines whether sufficient available storage capacity of the un-utilized memory is available for utilization for slices memory. For instance, the DST client module compares a size of an encoded data slice for storage to the size of the un-utilized memory. The DST client module indicates that storage space is available when the size of the encoded data slice is less than the size of the un-utilized memory. The DST client module 34 may determine the size of the reserved for rebuilt slices memory based on identifying encoded data slices to be rebuilt. The identifying includes at least one of detecting a slice error and receiving an indication of the slice error.

In an example of operation, the DST client module 34 identifies a plurality of encoded data slices requiring rebuilding. The DST client module 34 determines an amount of reserve memory 610 required for storage of rebuilt slices for the identified plurality of encoded data slices requiring rebuilding. The determining may include exchanging memory utilization information 604 with at least one other DST execution unit, where the exchanging includes receiving an amount of memory required for an encoded data slice associated with, for example, a slice error. The DST client module 34 updates the memory utilization information to include the amount of reserve memory required. The memory utilization information includes one or more of size of the utilized for slices memory, size of the utilized for rebuilt slices memory, size of the reserved for rebuilt slices memory, and size of the un-utilized memory. The DST client module 34 outputs the memory utilization information 604 to one or more of a DST processing unit, a managing unit, and a user device.

The DST client module 34 obtains rebuilt encoded data slices (e.g., receives, generates) and stores the rebuilt encoded data slices in the utilized for rebuilt encoded data slices memory. Accordingly, the DST client module updates the reserved for rebuilt slices memory by a similar memory size amount as storage of the rebuild encoded data slices (e.g., lowers size of reserved for rebuilt slices memory and raises size for utilized for rebuilt slices memory). The DST client module updates the memory utilization information and may output the updated memory utilization information.

FIG. 46B-C are diagrams illustrating examples of memory utilization for a series of times frames, where each timeframe indicates an amount of memory utilized for slices, rebuilt slices, reserved for rebuilt slices, unutilized, and a total amount of memory capacity. The total amount of memory capacity remains constant over the time intervals. In particular, FIG. 46 B illustrates examples of the memory utilization 614 for a first set of time intervals T1-5. At T1, stored slices use 300 TB of memory space of a total capacity of 500 TB of memory space leaving 200 TB of unutilized memory space. At T2, 50 TB of slices for rebuilding are detected such that reserved for rebuilding is incremented by 50 TB and unutilized memory space is lowered by 50 TB from 200 TB to 150 TB. At T3, a first 20 TB of rebuilt slices are obtained and stored such that the reserved memory space for rebuilt slices is lowered by 20 TB from 50 TB to 30 TB. At T4, a remaining 30 TB of rebuilt slices are obtained and stored such that the reserve memory space rebuilt slices is lowered by another 30 TB from 30 TB two 0 TB and the rebuilt slices is raised to buy 30 TB from 20 TB to 50 TB. At T5, the rebuilt slices are moved to the memory space for slices thus raising the rebuilt slices by 50 TB from 300 TB to 350 TB. Utilized memory includes the combination 615 of utilized for slices memory 606, memory used for the utilized for rebuilt slices memory 608, and memory used for the reserved for rebuilt slices memory 610.

FIG. 46C continues the examples of memory utilization 616 for second set of time intervals T6-T10. The example begins at time interval T6 which is equivalent to memory utilization of T5. At T7, 100 TB of new slices are stored thus raising the memory utilization of slices from 350 TB to 450 TB and lowering the unutilized memory space from 150 TB to 50 TB. At T8, 50 TB of slices for rebuilding is detected such that memory space of reserved for rebuilding is incremented by 50 TB from zero to 50 TB and memory space of unutilized is lowered by 50 TB from 50 TB two 0 TB. Requests for storage of new slices are rejected since the memory space of the unutilized memory is zero. At T9, 50 TB of rebuilt slices are received and stored in the memory space of the rebuilt slices thus raising the rebuilt slices from 0 TB to 50 TB and lowering the memory space for rebuilt slices from 50 TB to 0 TB. At T10, the slices of the memory space rebuilt slices is considered part of the memory space of slices thus raising the memory space of the slices from 450 TB to 500 TB and lowering the memory space of the rebuilt slices from 50 TB to 0 TB. As such, the memory storage space is full and subsequent request for storage of slices or rebuilt slices shall be rejected.

FIG. 46D is a flowchart illustrating an example of updating memory utilization information. The method begins at step 618 where a processing module (e.g., of a distributed storage and task (DST) client module) identifies a plurality of encoded data slices requiring rebuilding. As further delineated in FIG. 46E (flowchart illustrating example ways to identify slices needing a rebuild), the identifying includes at least one of: receiving an error message 632 (e.g., no slices detected for rebuild, no access to rebuild information, not enough space to rebuild, etc.); receiving a rebuilding request 634 (e.g., to rebuild specific data slices or range of data slices); detecting missing or corrupted encoded data slices by comparing a list of locally stored encoded data slices (or range of slices) to a list of remotely stored encoded data slices (or range of slices) associated with the locally stored encoded data slices to identify missing slices or detecting unfavorable slice integrity (e.g., corrupted slices); monitoring downloads 638 to the DS memory meeting minimum read/write (R/W) width thresholds but less than a full pillar width (successful download, but not all slices above threshold successfully downloaded); determining 640 when DSN read/write (R/W) requests occur for the plurality of encoded data slices and comparing to known times of inaccessibility for the DS memory storing the plurality of encoded data slices (e.g., DS memory was down for maintenance when original slice R/W request occurred); and querying vaults related to the plurality of encoded data slices 641 to determine one or more missing or corrupted encoded data slices (e.g., other vaults sharing the same data slices may have a list or copies which include the missing or corrupted data slices).

The rebuilding of the plurality of encoded data slices is, in one embodiment, queued for at least one of individual, group, or batch processing and the processing will be performed at a significant time delay from the queuing. As the rebuild processing may occur in the future, the embodiments of FIGS. 46A-G, ensure that memory space is set aside for rebuilds such that interceding requests for memory slice storage will not over utilize memory needed for the rebuild before it has a chance to occur.

The method continues at the step 620 where the processing module determines an amount of memory space to reserve for the plurality of encoded data slices requiring rebuilding. The determining includes identifying slice sizes based on at least one of initiating a slice size query with regards to the remotely stored encoded data slices, receiving a query response, and performing a local lookup based on a slice name.

The method continues at step 622 where the processing module updates memory utilization information to include the amount of memory space to reserve. For example, the processing module increments an amount of memory reserved for rebuilt slices by the amount of memory space to reserve and decrements unutilized memory space by the amount of memory space to reserve. The method continues at step 624 where the processing module sends the memory utilization information to at least one of a storing entity and a managing unit. The sending may further include determining whether a sum of an amount of memory utilized for slices, an amount of memory utilize for rebuilt slices, and an amount of memory reserved for rebuilt slices is greater than a capacity of memory. When the sum is greater, the processing module may further send an indication that the memory is full.

The method continues at step 626 where the processing module obtains rebuilt encoded data slices (e.g., received, generate). The method continues at step 628 where the processing module stores the rebuilt encoded data slices in a local DS memory. The method continues at step 630 where the processing module updates the amount of memory space to reserve for remaining encoded data slices requiring rebuilding. The updating includes determining an amount of memory space utilized to store the obtained rebuilt encoded data slices, incrementing the amount of memory space utilized for rebuilt slices by the amount of memory space utilized to store the obtained rebuilt encoded data slices, and decrementing the amount of memory space reserved for rebuilt slices by the amount of memory space utilized to store the obtained rebuilt encoded data slices. The updating may further include updating the memory space utilized for slices to include the amount of memory space utilized to store the obtained rebuilt encoded data slices and decrementing the amount of memory space utilized to store the rebuild encoded data slices. The method loops back to the step where the processing module updates the memory utilization information.

FIG. 46F is a flowchart illustrating another example of updating memory utilization information. The method begins at step 642 where a processing module (e.g., DST integrity processing unit 20) attempts to retrieve a plurality of encoded data slices from a DS memory to perform an integrity check. Slices are retrieved based on any of: list(s) of slice addresses, list(s) of names, range(s) of slice addresses and range(s) of slice names. In step 644, it is determined if the encoded data slices were retrieved during the attempted retrieval. In step 646, for encoded data slices that were not received and/or not listed, they are flagged as missing slices. For retrieved encoded data slices, they are checked for errors due to data corruption, outdated version, etc. In step 648, if a slice includes an error, it is flagged as a 'bad' slice. Bad and/or missing slices are subsequently rebuilt using other retrieved encoded data slices that are deemed to be good slices to produce rebuilt slices.

The rebuilding of the plurality of encoded data slices is, in one embodiment, queued for at least one of individual, group, or batch processing and the processing will be performed at a significant time delay from the queuing. As the rebuild processing may occur in the future, the embodiments of FIGS. 47A-G, ensure that memory space is set aside for rebuilds such that interceding requests for memory slice storage will not over utilize memory needed for the rebuild before it has a chance to occur.

The method continues at the step 650 where the processing module determines an amount of memory space to reserve for the plurality of encoded data slices requiring rebuilding. The determining includes identifying slice sizes based on at least one of initiating a slice size query with regards to the remotely stored encoded data slices, receiving a query response, and performing a local lookup based on a slice name.

The method continues at step 652 where the processing module updates memory utilization information to include the amount of memory space to reserve. For example, the processing module increments an amount of memory reserved for rebuilt slices by the amount of memory space to reserve and decrements unutilized memory space by the amount of memory space to reserve. The method continues at step 653 where the processing module sends the memory utilization information to at least one of a storing entity (e.g., storage/vault peers), user units and a managing unit. The sending may further include determining whether a sum of an amount of memory utilized for slices, an amount of memory utilize for rebuilt slices, and an amount of memory reserved for rebuilt slices is greater than a capacity of memory. When the sum is greater, the processing module may further send an indication that the memory is full.

The method continues at step 654 where the processing module obtains rebuilt encoded data slices (e.g., received, generated) and stores, in step 656, the rebuilt encoded data slices in a local DS memory. The method continues at step 657 where the processing module updates the amount of memory space to reserve for remaining encoded data slices requiring rebuilding. The updating includes determining an amount of memory space utilized to store the obtained rebuilt encoded data slices, incrementing the amount of memory space utilized for rebuilt slices by the amount of memory space utilized to store the obtained rebuilt encoded data slices, and decrementing the amount of memory space reserved for rebuilt slices by the amount of memory space utilized to store the obtained rebuilt encoded data slices. The updating may further include updating the memory space utilized for slices to include the amount of memory space utilized to store the obtained rebuilt encoded data slices and decrementing the amount of memory space utilized to store the rebuild encoded data slices.

FIG. 46G is a schematic block diagram illustrating an example DST client module 34 structure for memory utilization. DST client module 34 may include a plurality of processing modules (or sub-modules) to perform one or more steps of the embodiments of FIGS. 46A-F. While this example is shown as seven separate modules, the modules may be combined/separated into any number of modules (local or remote) to complete the various steps and functions of the various embodiments of FIGS. 46A-F.

As shown, identify module 34-1 identifies a plurality of encoded data slices that require rebuilding, wherein rebuilding of the plurality of encoded data slices is queued for at least one of individual, group, or batch processing and the processing will be performed at a significant time delay from the queuing. Determine module 34-2 determines an amount of memory required for storage of the rebuild encoded data slices for the plurality of encoded data slices. Update module 34-3 updates utilization information of the memory by allocating a portion of available memory to the amount of memory required. Indicate module 34-4 indicates the memory utilization (e.g., by sending the updated utilization information 604 of the memory to at least one of a storing entity (e.g., other storage/vault peers) and a managing unit). Obtain module 34-5 obtains rebuilt data slices (e.g., from other good copies or related vaults or generates them from other encoded data slices). Store module 34-6 stores the rebuilt encoded data slices in the reserve memory; and modify module 34-7 modifies the utilization information to reflect the stored rebuilt encoded data slices. Additional modules may be included within DST client module 34 to perform additional tasks (for example, but not limited to, passing encoded data slices to/from slice memory during non-rebuild write/read (W/R) operations). Alternatively, obtain module 34-5 and store module 34-6 may perform the receive and store slices 600 tasks, respectively.

FIG. 47A is a schematic block diagram of another embodiment of a dispersed storage network (DSN) system that includes the disbursing storage and task (DST) processing unit 16 and the distributed storage and task network (DSTN) module 22 of FIG. 1. The DSTN module 22 includes at least two DST execution unit sets 1-2. Each DST execution unit set includes a set of DST execution units 36 of FIG. 1. The system functions to store at least two data objects in a common DST execution unit set.

In an example of operation, the DST processing unit 16 receives a data object 1 write request 700. The DST processing unit 16 encodes data object 1 using a dispersed storage error coding function to produce first sets (data object 1) of encoded data slices 700-1, 2, . . . n (where n equals the width (number of pillars) of the encoded data slice set). The DST processing unit 16 generates first sets of slice names for the first sets of encoded data slices. The DST processing unit 16 issues one or more sets of data object 1 write slice requests to a DST execution unit set 1 that includes the first sets of encoded data slices and the corresponding first sets of slice names, where the first sets of slice names fall within a range of slice names associated with the DST execution unit set 1.

With data object 1 stored in the first set of DST execution units 36, the DST processing unit 16 receives a data object 2 co-locate write request 702 with regards to storing a second data object in the same set of DST execution units 36 as the first data object (e.g., in the DST execution unit set 1). The data object 2 co-locate write request includes a data identifier (ID) of the data object to be co-located with (e.g., a data ID of the data object 1), a data ID of the second data object (e.g., the data object 2 to be co-located), and may include the data (e.g., data object 2) to be co-located when it is not already stored within the DSTN module 22.

When the data object to be co-located (e.g., the second data object) is included in the data object 2 co-locate write request, the DST processing unit 16 identifies the set of DST execution units 36 associated with the data ID of data object 1 to be co-located with (e.g., the DST execution unit set 1). The determining includes accessing one or more of a directory and a dispersed hierarchical index to identify a DSN address associated with the data ID of data object 1 to be co-located with and performing a DSN address-to-physical location table lookup to identify the set of DST execution units 36 associated with the data ID of data object 1 to be co-located with. Next, the DST processing unit encodes the second data object (data object 2) to produce second sets of encoded data slices for storage in the DST execution unit set 1. The DST processing unit 16 generates second sets of slice names for the second sets of encoded data slices, where the second sets of slice names are based on the first sets of slice names such that the second sets of slice names fall within a range of slice names associated with a range of slice names associated with the set of DST execution units 36 associated with the data ID of data object 1 to be co-located with. DST processing unit 16 issues data object 2 write slice requests to the set of DST execution units 36 associated with the data ID of the data object to be co-located with (e.g., to DST execution unit set 1), where the data object 2 write slice requests includes the second sets of encoded data slices.

When the data object to be co-located is not included in the data object 2 co-locate write request, the DST processing unit 16 determines whether the data object to be co-located is already co-located. The determining includes the DST processing unit 16 identifying the DST execution unit set associated with storage of the second data object and comparing the identity to the identity of the DST execution unit set associated with storage of the first data object. When data object 2 to be co-located is not already co-located (e.g., with data object 1), the DST processing unit 16 recovers data object 2 from the DST execution unit set associated with storage of the second data object (e.g., from DST execution unit set 2). The recovering includes issuing data object 2 read slice requests 704 to the DST execution unit set associated with storage of the second data object and receiving the second sets of encoded data slices (e.g., received from DST execution unit set 2). Next, the DST processing unit 16 issues the data object 2 write slice requests to the set of DST execution units 36 associated with the data ID of the data object 1 to be co-located with (e.g., to DST execution unit set 1), where the data object 2 write slice requests includes the received second sets of encoded data slices and the corresponding second sets of slice names.

FIG. 47B is a diagram illustrating an example of generating an updated slice name for a previously stored encoded data slice of a second data object to be co-located with one or more encoded data slices of a first data object. The slice name 706 has a structure that includes a slice index field 708, a vault identifier (ID) field 710, a generation field 712, an object number field 714, and a segment number field 716. A substantial number of the fields of the slice name structure of a slice name of the previously stored encoded data slice of the second data object are updated to be substantially aligned with corresponding fields of the slice name structure of a slice name of the one or more encoded data slices of the first data object. For example, a vault ID field entry of the previous data object 2 slice 1 is updated to be substantially the same as a vault ID field entry of data object 1 slice 1. As another example, an object number field entry of the previous data object 2 slice 1 is updated based on an object number field entry of the previous data object 2 slice 1 such that the slice name of the updated data object 2 slice 1 falls within a range of slice names associated with storage of the first data object.

FIG. 47C is a flowchart illustrating an example of co-locating storage of data objects. The method begins at step 718 where a processing module (e.g., a distributed storage and task (DST) processing unit) receives a data object 2 co-locate write request to co-locate a data object 2 with a data object 1 to be co-located with. The write request includes one or more of data identifiers (IDs) for the data object 2 to be co-located and the data object 1 to be co-located with. The method continues at step 720 where the processing module obtains a plurality of sets of encoded data slices for the data object 2 to co-locate. The obtaining includes one of receiving, generating, and retrieving. When receiving, the processing module extracts the plurality of sets of encoded data slices from the write request 700. When generating, the processing module encodes the data object 2 to be co-located using a dispersed storage error coding function to produce the plurality of sets of encoded data slices. When retrieving, the processing module identifies previous sets of slice names utilized to store the plurality of sets of encoded data slices based on a data ID of the data object 2 to become co-located, issues one or more sets of read slice requests to a previously utilized set of storage units where the one or more sets of read slice requests includes the previous sets of slice names, and receiving the plurality of sets of encoded data slices 704.

The method continues at the step 722 where the processing module generates a plurality of sets of slice names for the plurality of sets of encoded data slices based on addressing information of the data object 1 to be co-located with. For example, the processing module generates the plurality of sets of slice names to include a vault ID associated with the data object to be co-located with and an object number field entry that causes the generated plurality of sets of slice names to fall within a slice name range that is associated with a set of storage units where the data object to be co-located with is stored.

The method continues at the step 724 where the processing module stores the plurality of sets of encoded data slices in the set of storage units using the generated plurality of sets of slice names. The storing includes generating one or more sets of write slice requests that includes the plurality of sets of encoded data slices and the generated plurality of sets of slice names and outputting the one or more sets of read slice requests to the set of storage units. When storage of the plurality of sets of encoded data slices in the set of storage units is confirmed, and when the plurality of sets of encoded data slices were retrieved using the previous sets of slice names, the method continues at the step 726 where the processing module deletes the plurality of sets of encoded data slices utilizing the previous sets of slice names. For example, the processing module issues a set of delete slice requests that includes the previous sets of slice names to the previous utilized set of storage units.

FIG. 47D is a flowchart illustrating one example of obtaining the plurality of sets of encoded data slices to be co-located. The obtaining, step 720, includes multiple processing paths for receiving, generating, and retrieving the plurality of sets of encoded data slices to be co-located (data object 2) based on the location of data object 2 at the time of the request. When receiving, the processing module extracts in step 727 the ID of data object 1, ID of data object 2 and, if included with the request, the plurality of data object 2 sets of encoded slices from the write request 700. When data object 2 to be co-located (e.g., the second data object) is included in the data object 2 co-locate write request, the DST processing unit 16 identifies, beginning with step 730, the set of DST execution units 36 associated with data ID 1 of the data object to be co-located with (e.g., the DST execution unit set 1). The determining includes accessing one or more of a directory in step 731 and a dispersed hierarchical index in step 732 to identify a DSN address associated with data object 1 ID to be co-located with and performing a DSN address-to-physical location table lookup in step 734 to identify the physical location (PL) address set of DST execution units 36 associated with the data ID of the data object to be co-located with. If data object 2 is not already encoded, it is encoded in step 729 using a dispersed storage error coding function.

When the data object to be co-located is not included in the data object 2 co-locate write request, the DST processing unit 16 determines whether the data object to be co-located is already co-located. The determining includes comparing data object 2 PL to data object 1 PL. If they are co-located (data object 2 PL is stored within a range of addresses for data object 1 PL) no further action is required. When data object 2 to be co-located is not already co-located, the DST processing unit 16 recovers (reads), in step 736, the second data object from the DST execution unit set associated with storage of the second data object (e.g., from DST execution unit set 2).

FIG. 47E is a schematic block diagram of another embodiment of a dispersed storage network (DSN) system in accordance with the present disclosure. DST processing unit 16 may include a plurality of processing modules (or sub-modules) to perform one or more steps of the embodiments of FIGS. 47A-D. While this example is shown as four separate modules, the modules may be combined or separated into any number of modules (local or remote) to complete the various steps and functions of the various embodiments of FIGS. 47A-D.

As shown, receive module 16-1 operates to receive a data object co-locate write request. Obtain module 16-2 operates to obtain a plurality of sets of encoded data slices for a data object to co-locate. Generate module 16-3 operates to generate a plurality of sets of slice names for the data object to co-locate based on another plurality of sets of slice names associated with a data object to be co-located with. Store module 16-4 operates to store the plurality of sets of encoded data slices in DS memory using the generated plurality of sets of slice names for the data object co-locate.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present disclosure has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed disclosure. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed disclosure. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present disclosure may have also been described, at least in part, in terms of one or more embodiments. An embodiment of the present disclosure is used herein to illustrate the present disclosure, an aspect thereof, a feature thereof, a concept thereof, and/or an example thereof. A physical embodiment of an apparatus, an article of manufacture, a machine, and/or of a process that embodies the present disclosure may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/ or indirect coupling between other elements as recognized by one of average skill in the art.

The term "module" is used in the description of the various embodiments of the present disclosure. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules. While particular combinations of various functions and features of the present disclosure have been expressly described herein, other combinations of these features and functions are likewise possible. The present disclosure is not limited by the particular examples disclosed herein and expressly incorporates these other combinations.

What is claimed is:

1. A method for execution by one or more processing modules of one or more computing devices of a dispersed storage network (DSN), the method comprises:
   obtaining estimated future availability information for storage units of the DSN;
   organizing a plurality of sets of encoded data slices into a plurality of group-sets of encoded data slices, wherein a group-set of encoded data slices of the plurality of group-sets of encoded data slices includes multiple sets of encoded data slices of the plurality of sets of encoded data slices, wherein data is encoded in accordance with a dispersed storage error coding function to produce the plurality of sets of encoded data slices;
   for each of the plurality of group-sets of encoded data slices, estimating an approximate storage completion time to produce a plurality of approximate storage completion times;
   obtaining a write threshold number;
   establishing a time-availability pattern for writing the plurality of group-sets of encoded data slices to the storage units based on the estimated future availability information, the plurality of approximate storage completion times, and the write threshold number; and
   sending the plurality of group-sets of encoded data slices to at least some of the storage units for storage therein in accordance with the time-availability pattern.

2. The method of claim 1 further comprises:
   comparing, as time passes, actual availability information of the storage units with corresponding time portions of the estimated future availability information; and
   when the actual availability information does not substantially match the estimated future availability information for the corresponding time portions, adjusting the time-availability pattern based on a difference between the actual availability information and estimated future availability information for the corresponding time portions.

3. The method of claim 1 further comprises:
for each of the plurality of group-sets of encoded data slices, assigning a transaction number; and
wherein the sending the plurality of group-sets of encoded data slices to at least some of the storage units for storage therein in accordance with the time-availability pattern includes:
generating a write request for each available storage unit per the time-availability pattern to produce a set of write requests, wherein each write request of the set of write requests includes the transaction number.

4. The method of claim 1, wherein the time-availability pattern comprises:
a plurality of time intervals, wherein storing a group-set of the plurality of group-sets of encoded data slices spans at least one time interval of the plurality of time intervals; and
an availability indication for each of the storage units in each time interval of the plurality of time intervals.

5. The method of claim 1 further comprises:
when, for the sending of a given group-set of the plurality of group-sets of encoded data slices, one of the storage units was listed as unavailable, queuing sending an encoded data slice of each set of the given group-set of encoded data slices; and
when the one of the storage units is available and when another given group-set of the plurality of group-sets of encoded data slices is being sent to the storage units, sending the encoded data slice of each set of the given group-set of encoded data slices to the one of the storage units.

6. The method of claim 1 further comprises:
when, during the sending a given group-set of the plurality of group-sets of encoded data slices, less than a write threshold number of storage units are available:
ceasing the sending of the given group-set of the plurality of group-sets of encoded data slices; and
queuing the given group-set of the plurality of group-sets of encoded data slices for sending to the at least some of the storage units when at least the write threshold number of storage units are available.

7. A dispersed storage (DS) module of a dispersed storage network (DSN), the DS module comprises:
a first module, when operable within a computing device, causes the computing device to:
obtain estimated future availability information for storage units of the DSN;
a second module, when operable within the computing device, causes the computing device to:
organize a plurality of sets of encoded data slices into a plurality of group-sets of encoded data slices, wherein a group-set of encoded data slices of the plurality of group-sets of encoded data slices includes multiple sets of encoded data slices of the plurality of sets of encoded data slices, wherein data is encoded in accordance with a dispersed storage error coding function to produce the plurality of sets of encoded data slices;
a third module, when operable within the computing device, causes the computing device to:
for each of the plurality of group-sets of encoded data slices, estimate an approximate storage completion time to produce a plurality of approximate storage completion times;
obtain a write threshold number; and
establish a time-availability pattern for writing the plurality of group-sets of encoded data slices to the storage units based on the estimated future availability information, the plurality of approximate storage completion times, and the write threshold number; and
a fourth module, when operable within the computing device, causes the computing device to:
send the plurality of group-sets of encoded data slices to at least some of the storage units for storage therein in accordance with the time-availability pattern.

8. The DS module of claim 7 further comprises:
the third module, when operable within the computing device, further causes the computing device to:
compare, as time passes, actual availability information of the storage units with corresponding time portions of the estimated future availability information; and
when the actual availability information does not substantially match the estimated future availability information for the corresponding time portions, adjust the time-availability pattern based on a difference between the actual availability information and estimated future availability information for the corresponding time portions.

9. The DS module of claim 7 further comprises:
the fourth module, when operable within the computing device, further causes the computing device to:
for each of the plurality of group-sets of encoded data slices, assign a transaction number; and
wherein the fourth module functions to cause the computing device to send the plurality of group-sets of encoded data slices to at least some of the storage units for storage therein in accordance with the time-availability pattern by:
generating a write request for each available storage unit per the time-availability pattern to produce a set of write requests, wherein each write request of the set of write requests includes the transaction number.

10. The DS module of claim 7, wherein the time-availability pattern comprises:
a plurality of time intervals, wherein storing a group-set of the plurality of group-sets of encoded data slices spans at least one time interval of the plurality of time intervals; and
an availability indication for each of the storage units in each time interval of the plurality of time intervals.

11. The DS module of claim 7 further comprises:
the fourth module, when operable within the computing device, further causes the computing device to:
when, for the sending of a given group-set of the plurality of group-sets of encoded data slices, one of the storage units was listed as unavailable, queue sending an encoded data slice of each set of the given group-set of encoded data slices; and
when the one of the storage units is available and when another given group-set of the plurality of group-sets of encoded data slices is being sent to the storage units, send the encoded data slice of each set of the given group-set of encoded data slices to the one of the storage units.

12. DS module of claim 7 further comprises:
the fourth module, when operable within the computing device, further causes the computing device to:

when, during the sending a given group-set of the plurality of group-sets of encoded data slices, less than a write threshold number of storage units are available:
cease the sending of the given group-set of the plurality of group-sets of encoded data slices; and
queue the given group-set of the plurality of group-sets of encoded data slices for sending to the at least some of the storage units when at least the write threshold number of storage units are available.

* * * * *